United States Patent
Hirano et al.

(10) Patent No.: US 9,780,308 B2
(45) Date of Patent: Oct. 3, 2017

(54) COMPOSITION AND LIGHT EMITTING DEVICE USING THE SAME

(75) Inventors: Keiko Hirano, Sumida-ku (JP); Tomoya Nakatani, Tsukuba (JP); Shigeru Sasaki, Tsukuba (JP)

(73) Assignee: SUMITOMO CHEMICAL COMPANY, LIMITED, Chou-ku, Tokyo (JP)

( * ) Notice: Subject to any disclaimer, the term of this patent is extended or adjusted under 35 U.S.C. 154(b) by 795 days.

(21) Appl. No.: 13/516,398

(22) PCT Filed: Dec. 20, 2010

(86) PCT No.: PCT/JP2010/073656
§ 371 (c)(1),
(2), (4) Date: Jun. 15, 2012

(87) PCT Pub. No.: WO2011/078391
PCT Pub. Date: Jun. 30, 2011

(65) Prior Publication Data
US 2012/0306358 A1 Dec. 6, 2012

(30) Foreign Application Priority Data
Dec. 25, 2009 (JP) .................................. 2009-294386

(51) Int. Cl.
*H01L 51/50* (2006.01)
*H01L 51/00* (2006.01)
(Continued)

(52) U.S. Cl.
CPC .......... *H01L 51/0043* (2013.01); *C08G 61/12* (2013.01); *C08L 65/00* (2013.01); *C09K 11/06* (2013.01); *H01L 51/0039* (2013.01); *C08G 2261/148* (2013.01); *C08G 2261/1412* (2013.01); *C08G 2261/1414* (2013.01); *C08G 2261/1434* (2013.01); *C08G 2261/3142* (2013.01); *C08G 2261/3162* (2013.01); *C08G 2261/5222* (2013.01); *C08G 2261/76* (2013.01); *C08G 2261/95* (2013.01); *C08L 2205/02* (2013.01); *C09K 2211/145* (2013.01); *C09K 2211/1416* (2013.01); *C09K 2211/1425* (2013.01); *C09K 2211/1433* (2013.01); *C09K 2211/1466* (2013.01); *C09K 2211/1475* (2013.01); *H01L 51/5012* (2013.01)

(58) Field of Classification Search
None
See application file for complete search history.

(56) References Cited

U.S. PATENT DOCUMENTS 5,708,130 A 1/1998 Woo et al.
5,962,631 A 10/1999 Woo et al.
(Continued)

FOREIGN PATENT DOCUMENTS

JP 11-510535 A 9/1999
JP 2004-300314 A 10/2004
(Continued)

OTHER PUBLICATIONS

Machine-generated English translation of JP 2004-300314 A to Fuji Photo Film Co., Ltd.
Machine-generated English translation of JP 2009-196982 to Mitsubishi Chemicals Corp.
International Search Report of PCT/JP2010/073656 dated Mar. 15, 2011.
Supplemental European Search Report issued Apr. 7, 2015 in European Patent Application No. 10839619.3.
(Continued)

*Primary Examiner* — Gregory Clark
(74) *Attorney, Agent, or Firm* — Sughrue Mion, PLLC

(57) ABSTRACT

A composition comprising (1) a first crosslinkable polymer compound having an aromatic conjugated repeating unit and a crosslinkable group and having at least one of a light emitting property and charge transportability, and (2) a second crosslinkable polymer compound having an aromatic conjugated repeating unit and a crosslinkable group at least one of which is different from the aromatic conjugated repeating unit in the first crosslinkable polymer compound and the crosslinkable group in the first crosslinkable polymer compound, and having at least one of a light emitting property and charge transportability, wherein at least one of the first crosslinkable polymer compound and the second crosslinkable polymer compound has a crosslinkable group represented by the following formula (Z-3) or (Z-4):

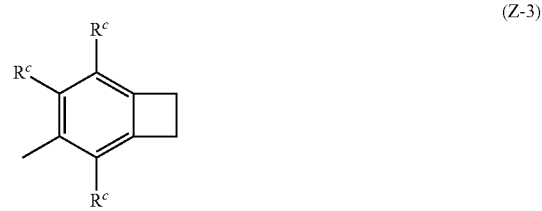

(Z-3)

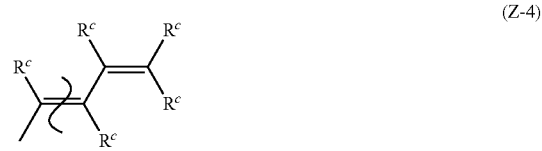

(Z-4)

in the formulae, $R^c$ represents a hydrogen atom, or a substituent such as an unsubstituted or substituted alkyl group or the like, the plurality of $R^c$ moieties may be the same or different.

14 Claims, No Drawings

(51) Int. Cl.
*C08G 61/12* (2006.01)
*C08L 65/00* (2006.01)
*C09K 11/06* (2006.01)

(56) References Cited

U.S. PATENT DOCUMENTS

| | | |
|---|---|---|
| 2002/0136925 A1* | 9/2002 | Uchida .................. 428/690 |
| 2005/0186106 A1 | 8/2005 | Li et al. |
| 2007/0063191 A1 | 3/2007 | Inbasekaran et al. |
| 2007/0096082 A1* | 5/2007 | Gaynor ................ C07C 211/60 257/40 |
| 2007/0102695 A1* | 5/2007 | Inbasekaran ........... C07C 25/22 257/40 |
| 2009/0315453 A1 | 12/2009 | Kobayashi et al. |
| 2010/0084000 A1* | 4/2010 | Ueda .................... 136/244 |
| 2011/0127516 A1 | 6/2011 | Nakatani et al. |
| 2011/0127517 A1 | 6/2011 | Nakatani |

FOREIGN PATENT DOCUMENTS

| | | | |
|---|---|---|---|
| JP | 2007-528916 A | 10/2007 | |
| JP | 2008-106241 A | 5/2008 | |
| JP | 2009-196982 A | 9/2009 | |
| JP | 2009-267392 A | 11/2009 | |
| KR | 10-2006-0127853 A | 12/2006 | |
| WO | 2005/049689 A2 | 6/2005 | |
| WO | WO 2005049689 * | 6/2005 | ............ C08G 61/00 |
| WO | 2008/044003 A1 | 4/2008 | |
| WO | 2010/013723 A1 | 2/2010 | |
| WO | 2010/013724 A1 | 2/2010 | |

OTHER PUBLICATIONS

Communication dated Nov. 30, 2016 from the Korean Intellectual Property Office in counterpart Application No. 10-2012-7019234.

* cited by examiner

COMPOSITION AND LIGHT EMITTING DEVICE USING THE SAME

CROSS REFERENCE TO RELATED APPLICATIONS

This application is a National Stage of International Application No. PCT/JP2010/073656 filed Dec. 20, 2010, claiming priority based on Japanese Patent Application No. 2009-294386 filed Dec. 25, 2009, the contents of all of which are incorporated herein by reference in their entirety.

TECHNICAL FIELD

The present invention relates to a composition and a light emitting device using the composition.

BACKGROUND ART

Materials used in light emitting devices such as an organic electroluminescent device and the like are variously investigated recently. Of them, a compound containing a crosslinkable group having a benzocyclobutene structure is known as a material useful for a light emitting device of lamination type (JP-A No. 2008-106241).

DISCLOSURE OF THE INVENTION

The above-described material, however, has insufficient curability in a low temperature region.

The present invention has an object of providing a material showing excellent curability in a low temperature region.

The present invention includes the following inventions.

<1> A composition comprising (1) a first crosslinkable polymer compound having an aromatic conjugated repeating unit and a crosslinkable group and having at least one of a light emitting property and charge transportability, and (2) a second crosslinkable polymer compound having an aromatic conjugated repeating unit and a crosslinkable group at least one of which is different from the aromatic conjugated repeating unit in the first crosslinkable polymer compound and the crosslinkable group in the first crosslinkable polymer compound, and having at least one of a light emitting property and charge transportability, wherein at least one of the first crosslinkable polymer compound and the second crosslinkable polymer compound has a crosslinkable group represented by the following formula (Z-3) or (Z-4):

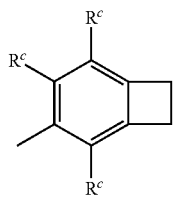

(Z-3)

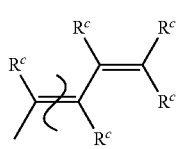

(Z-4)

in the formulae (Z-3) and (Z-4), $R^c$ represents a hydrogen atom, an unsubstituted or substituted alkyl group, an unsubstituted or substituted alkoxy group, an unsubstituted or substituted alkylthio group, an unsubstituted or substituted aryl group, an unsubstituted or substituted aryloxy group, an unsubstituted or substituted arylthio group, an unsubstituted or substituted amino group, an unsubstituted or substituted silyl group, a halogen atom, an acyl group, an acyloxy group, an imine residue, a carbamoyl group, an acid imide group, a monovalent heterocyclic group, an unsubstituted or substituted carboxyl group, a cyano group or a nitro group; the plurality of $R^c$ moieties may be the same or different.

<2> The composition according to <1>, wherein the crosslinkable group in each of the first crosslinkable polymer compound and the second crosslinkable polymer compound is a group represented by any of the following formulae (Z-1) to (Z-10):

(Z-1)

(Z-2)

(Z-3)

(Z-4)

(Z-5)

(Z-6)

(Z-7)

(Z-8)

-continued

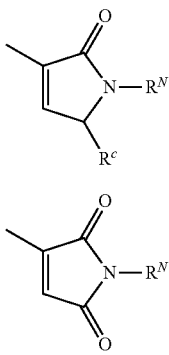

(Z-9)

(Z-10)

in the formulae (Z-1) to (Z-10), $R^c$ has the same meaning as described above; $R^N$ represents an unsubstituted or substituted alkyl group, an unsubstituted or substituted aryl group, an unsubstituted or substituted arylalkyl group, an unsubstituted or substituted acyl group or an unsubstituted or substituted monovalent heterocyclic group; the plurality of $R^c$ moieties may be the same or different.

<3> The composition according to <1> or <2>, wherein the first crosslinkable polymer compound is a polymer compound having a crosslinkable group represented by any of the formulae (Z-1) to (Z-4), and the second crosslinkable polymer compound is a polymer compound having a crosslinkable group represented by any of the formulae (Z-4) to (Z-10) and an aromatic conjugated repeating unit different from the aromatic conjugated repeating unit in the first crosslinkable polymer compound.

<4> The composition according to <1> or <2>, wherein the second crosslinkable polymer compound is a polymer compound having an aromatic conjugated repeating unit and a crosslinkable group different from the crosslinkable group in the first crosslinkable polymer compound.

<5> The composition according to <1> or <2>, wherein the second crosslinkable polymer compound is a polymer compound having an aromatic conjugated repeating unit different from the aromatic conjugated repeating unit in the first crosslinkable polymer compound and a crosslinkable group different from the crosslinkable group in the first crosslinkable polymer compound.

<6> The composition according to <4> or <5>, wherein the crosslinkable group in the first crosslinkable polymer compound is a group represented by any of the formulae (Z-1) to (Z-4) and the crosslinkable group in the second crosslinkable polymer compound is a group represented by any of the formulae (Z-4) to (Z-10).

<7> The composition according to any one of <1> to <6>, wherein at least one of the first crosslinkable polymer compound and the second crosslinkable polymer compound has hole transportability.

<8> The composition according to any one of <1> to <6>, wherein at least one of the first crosslinkable polymer compound and the second crosslinkable polymer compound has a light emitting property and charge transportability.

<9> The composition according to any one of <1> to <8>, wherein at least one of the first crosslinkable polymer compound and the second crosslinkable polymer compound has an unsubstituted or substituted arylene group, an unsubstituted or substituted divalent heterocyclic group or an unsubstituted or substituted divalent aromatic amine residue, as a repeating unit.

<10> The composition according to <9>, wherein at least one of the first crosslinkable polymer compound and the second crosslinkable polymer compound has an unsubstituted or substituted arylene group having 1 to 4 groups represented by the following formula [2] (Y), an unsubstituted or substituted divalent heterocyclic group having 1 to 4 groups represented by the following formula [2] (Y) or an unsubstituted or substituted divalent aromatic amine residue having 1 to 4 groups represented by the following formula [2] (Y), as a repeating unit A:

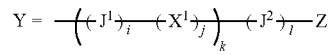

[2]

in the formula [2], $J^1$ and $J^2$ each independently represent an alkylene group or a phenylene group and $X^1$ represents an oxygen atom, a nitrogen atom or a sulfur atom; i, j and l each independently represent 0 or 1 and k represents an integer of 1 to 3; when there are a plurality of $J^1$ moieties, a plurality of $X^1$ moieties, or a plurality of characters of i and a plurality of characters of j, each of them may be the same or different; Z represents a crosslinkable group.

<11> The composition according to <10>, wherein the repeating unit A is a repeating unit represented by the following formula [3]:

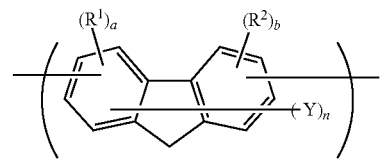

[3]

in the formula [3], $R^1$ and $R^2$ each independently represent an unsubstituted or substituted alkyl group, an unsubstituted or substituted alkoxy group, an unsubstituted or substituted aryl group, an unsubstituted or substituted aryloxy group, an unsubstituted or substituted arylalkyl group or an unsubstituted or substituted arylalkoxy group; a and b are each independently an integer of 0 to 3 and n is 1 or 2; Y is a group represented by the formula [2]; when there are a plurality of $R^1$ moieties, a plurality of $R^2$ moieties or a plurality of Y moieties, each of them may be the same or different.

<12> The composition according to <10>, wherein the repeating unit A is a repeating unit represented by the following formula [4]:

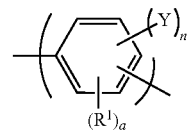

[4]

in the formula [4], $R^1$ represents an unsubstituted or substituted alkyl group, an unsubstituted or substituted alkoxy group, an unsubstituted or substituted aryl group, an unsubstituted or substituted aryloxy group, an unsubstituted or substituted arylalkyl group or an unsubstituted or substituted arylalkoxy group; a is an integer of 0 to 3 and n is 1 or 2, a and n satisfying $1 \leq a+n \leq 4$; Y has the same meaning as described above; when there are a plurality of $R^1$ moieties or a plurality of characters of n, each of them may be the same or different.

<13> The composition according to <10>, wherein the repeating unit A is a repeating unit represented by the following formula [5]:

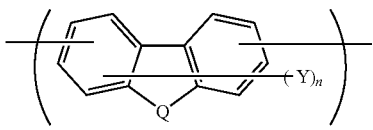

[5]

in the formula [5], Q represents an oxygen atom, a sulfur atom, —N($R^3$)—, —O—C($R^1$)($R^2$)— or —Si($R^1$)($R^2$)—; $R^1$, $R^2$, Y and n have the same meaning as described above; $R^3$ represents an unsubstituted or substituted alkyl group, an unsubstituted or substituted aryl group or an unsubstituted or substituted arylalkyl group; when there are a plurality of Y moieties, these may be the same or different.

<14> The composition according to <10>, wherein the repeating unit A is a repeating unit represented by the following formula [6]:

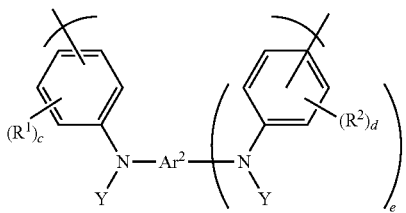

[6]

in the formula [6], $R^1$, $R^2$ and Y have the same meaning as described above; c and d each independently represent an integer of 0 to 4 and e represents 0 or 1; $Ar^2$ represents an arylene group or a divalent heterocyclic group; when there are a plurality of $R^1$ moieties, a plurality of $R^2$ moieties or a plurality of Y moieties, each of them may be the same or different.

<15> The composition according to any one of <1> to <14>, wherein the polystyrene-equivalent molecular weight of the first crosslinkable polymer compound and the polystyrene-equivalent molecular weight of the second crosslinkable polymer compound are both $1 \times 10^3$ to $1 \times 10^8$.

<16> The composition according to any one of <1> to <15>, wherein the weight ratio of the first crosslinkable polymer compound to the second crosslinkable polymer compound is 99:1 to 1:99.

<17> The composition according to any one of <1> to <16>, wherein the total amount of the crosslinkable groups contained in one gram of the composition is $2.0 \times 10^{-5}$ to $1.0 \times 10^{-2}$ mol.

<18> The composition according to any one of <1> to <17>, wherein the total content of the first crosslinkable polymer compound and the second crosslinkable polymer compound is 80 wt % or more.

<19> The composition according to any one of <1> to <18>, wherein the composition further comprises a solvent.

<20> A film composed of the composition according to any one of <1> to <19>.

<21> A light emitting device having electrodes consisting of an anode and a cathode and an organic layer that is disposed between the electrodes and is composed of the composition according to any one of <1> to <19>.

<22> A surface light source having the light emitting device according to <21>.

<23> A display having the light emitting device according to <20>.

<24> An organic transistor composed of the composition according to any one of <1> to <19>.

<25> An organic photoelectric conversion device composed of the composition according to any one of <1> to <19>.

MODE FOR CARRYING OUT THE INVENTION

The present invention will be illustrated in detail below.
<Composition>

The composition of the present invention is a composition comprising (1) a first crosslinkable polymer compound having an aromatic conjugated repeating unit and a crosslinkable group and having at least one of a light emitting property and charge transportability, and (2) a second crosslinkable polymer compound having an aromatic conjugated repeating unit and a crosslinkable group at least one of which is different from the aromatic conjugated repeating unit in the first crosslinkable polymer compound and the crosslinkable group in the first crosslinkable polymer compound, and having at least one of a light emitting property and charge transportability, wherein at least one of the first crosslinkable polymer compound and the second crosslinkable polymer compound has a crosslinkable group represented by the above-described formula (Z-3) or (Z-4).

Hereinafter, the first crosslinkable polymer compound and the second crosslinkable polymer compound are collectively called simply "crosslinkable polymer compound".

In the present invention, when the crosslinkable polymer compound is fabricated into a film having a thickness of 30 to 60 nm and if the PL quantum yield is 10% or more at an excitation wavelength of 325 nm, this compound is said to have a light emitting property. The method of fabricating a film for measurement of the PL quantum yield is a method of film formation from a solution or melted state in the case of the crosslinkable polymer compound. For measurement of the PL quantum yield, for example, PL Quantum Yield Measurement System (C9920-02) manufactured by Hamamatsu Photonics, Japan can be used.

In the present invention, when the crosslinkable polymer compound is fabricated into a film (0.1 to 20 μm) and if the hole mobility of the film measured by the Time of Flight method at an excitation wavelength of 337 nm by nitrogen laser is $10^{-7}$ cm$^2$/V/s (cm$^2$/(V·s)) or more, this compound is said to have hole transportability, if the electron mobility of the film is $10^{-7}$ cm$^2$/V/s or more, this compound is said to have electron transportability, and if the compound has at least one of hole transportability and electron transportability, this compound is said to have charge transportability. For measurement of charge transportability, for example, a photoexcitation carrier mobility measurement apparatus (TOF401) manufactured by Sumitomo Heavy Industries, Ltd. can be used.

In the present invention, the phrase "crosslinkable groups are different" means that if the crosslinkable polymer compounds contained in the composition of the present invention are composed of one kind of first crosslinkable polymer compound and one kind of second crosslinkable polymer compound, that is, two kinds of compounds in total, then, there is a crosslinkable group contained in only one of them and that if the crosslinkable polymer compounds contained in the composition of the present invention are composed of three or more kinds of crosslinkable polymer compounds in total, then, all combinations composed of any two kinds of crosslinkable polymer compounds satisfy the above-described condition.

In the present invention, the phrase "crosslinkable groups are different" means that if the crosslinkable polymer compounds contained in the composition of the present invention are composed of one kind of first crosslinkable polymer compound and one kind of second crosslinkable polymer compound, that is, two kinds of compounds in total, then, there is a repeating unit contained in only one of them and that if the crosslinkable polymer compounds contained in the composition of the present invention are composed of three or more kinds of crosslinkable polymer compounds in total, then, all combinations composed of any two kinds of crosslinkable polymer compounds satisfy the above-described condition.

In the composition of the present invention, the repeating units which can be contained in the crosslinkable polymer compound are classified into non-crosslinkable repeating units having no crosslinkable group and crosslinkable repeating units having a crosslinkable group, depending on the presence or absence of a crosslinkable group (that is, a group causing a crosslinking reaction by a stimulus such as heat, light and the like). The repeating unit having an aromatic conjugate property is referred to as "an aromatic conjugated repeating unit".

The aromatic conjugated repeating unit includes an unsubstituted or substituted arylene group, an unsubstituted or substituted divalent aromatic heterocyclic group or an unsubstituted or substituted divalent aromatic amine residue.

—Crosslinkable Polymer Compound—

Non-Crosslinkable Repeating Unit

The above-described non-crosslinkable repeating unit is preferably a repeating unit selected from an unsubstituted or substituted arylene group, an unsubstituted or substituted divalent heterocyclic group or an unsubstituted or substituted divalent aromatic amine residue. The above-described non-crosslinkable repeating unit is preferably an aromatic conjugated repeating unit.

The above-described arylene group is an atomic group obtained by removing two hydrogen atoms from an aromatic hydrocarbon, and includes groups having a condensed ring, and groups having two or more independent benzene rings or condensed rings linked directly or via a vinylene group or the like. The above-described arylene group may have a substituent. The substituent which can be carried on the above-described arylene group includes an unsubstituted or substituted alkyl group, an unsubstituted or substituted alkoxy group, an unsubstituted or substituted alkylthio group, an unsubstituted or substituted aryl group, an unsubstituted or substituted aryloxy group, an unsubstituted or substituted arylthio group, an unsubstituted or substituted amino group, an unsubstituted or substituted silyl group, a halogen atom, an acyl group, an unsubstituted or substituted acyloxy group, an imine residue, a carbamoyl group, an acid imide group, an unsubstituted or substituted monovalent heterocyclic group, an unsubstituted or substituted carboxyl group, a cyano group and a nitro group, and preferable from the standpoint of the property of a light emitting device are an unsubstituted or substituted alkyl group, an unsubstituted or substituted alkoxy group, an unsubstituted or substituted aryl group, an unsubstituted or substituted aryloxy group, a halogen atom and a cyano group.

The alkyl group which can be carried as a substituent on the above-described arylene group may be any of linear, branched or cyclic and may have a substituent. The above-described alkyl group has a carbon atom number of usually 1 to 20, and examples thereof include a methyl group, an ethyl group, a propyl group, an isopropyl group, a butyl group, an isobutyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl group, a lauryl group, a trifluoromethyl group, a pentafluoroethyl group, a perfluorobutyl group, a perfluorohexyl group and a perfluorooctyl group.

The alkoxy group which can be carried as a substituent on the above-described arylene group may be any of linear, branched or cyclic and may have a substituent. The above-described alkoxy group has a carbon atom number of usually 1 to 20, and examples thereof include a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyloxy group, a perfluorooctyloxy group, a methoxymethyloxy group and a 2-methoxyethyloxy group.

The alkylthio group which can be carried as a substituent on the above-described arylene group may be any of linear, branched or cyclic and may have a substituent. The above-described alkylthio group has a carbon atom number of usually 1 to 20, and examples thereof include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group and a trifluoromethylthio group.

The aryl group which can be carried as a substituent on the above-described arylene group is an atomic group obtained by removing one hydrogen atom from an aromatic hydrocarbon, and includes groups having a condensed ring, and groups having two or more independent benzene rings or condensed rings linked directly. The above-described aryl group may have a substituent. The above-described aryl group has a carbon atom number of usually 6 to 60, preferably 7 to 48, and examples thereof include a phenyl group, $C_1$ to $C_{12}$ alkoxyphenyl groups ("$C_1$ to $C_{12}$ alkoxy" means that the carbon atom number of an alkoxy portion is 1 to 12. The same shall apply hereinafter.), $C_1$ to $C_{12}$ alkylphenyl groups ("$C_1$ to $C_{12}$ alkyl" means that the carbon atom number of an alkyl portion is 1 to 12. The same shall apply hereinafter.), a 1-naphthyl group, a 2-naphthyl group, a 1-anthracenyl group, a 2-anthracenyl group, a 9-anthracenyl group and a pentafluorophenyl group, and preferable are $C_1$ to $C_{12}$ alkoxyphenyl groups and $C_1$ to $C_{12}$ alkylphenyl groups.

The $C_1$ to $C_{12}$ alkoxyphenyl group includes a methoxyphenyl group, an ethoxyphenyl group, a propyloxyphenyl group, an isopropyloxyphenyl group, a butoxyphenyl group, an isobutoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group and a lauryloxyphenyl group and the like.

The $C_1$ to $C_{12}$ alkylphenyl group includes a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group and the like.

The aryloxy group which can be carried as a substituent on the above-described arylene group may have a substituent, and the carbon atom number thereof is usually 6 to 60, preferably 7 to 48. The above-described aryloxy group includes a phenoxy group, $C_1$ to $C_{12}$ alkoxyphenoxy groups, $C_1$ to $C_{12}$ alkylphenoxy groups, a 1-naphthyloxy group, a 2-naphthyloxy group, a pentafluorophenyloxy group and the like, and preferable are $C_1$ to $C_{12}$ alkoxyphenoxy groups and $C_1$ to $C_{12}$ alkylphenoxy groups.

The $C_1$ to $C_{12}$ alkoxyphenoxy group includes a methoxyphenoxy group, an ethoxyphenoxy group, a propyloxyphenoxy group, an isopropyloxyphenoxy group, a butoxyphenoxy group, an isobutoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, a lauryloxyphenoxy group and the like.

The $C_1$ to $C_{12}$ alkylphenoxy group include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, a dodecylphenoxy group and the like.

The arylthio group which can be carried as a substituent on the above-described arylene group may have a substituent, and the carbon atom number thereof is usually 3 to 60. Examples of the above-described arylthio group include a phenylthio group, $C_1$ to $C_{12}$ alkoxyphenylthio groups, $C_1$ to $C_{12}$ alkylphenylthio groups, a 1-naphthylthio group, a 2-naphthylthio group and a pentafluorophenylthio group.

The arylalkyl group which can be carried as a substituent on the above-described arylene group may have a substituent, and the carbon atom number thereof is usually 7 to 60. Examples of the above-described arylalkyl group include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups and 2-naphthyl-$C_1$ to $C_{12}$ alkyl groups.

The arylalkoxy group which can be carried as a substituent on the above-described arylene group may have a substituent, and the carbon atom number thereof is usually 7 to 60. Examples of the above-described arylalkoxy group include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups and 2-naphthyl-$C_1$ to $C_{12}$ alkoxy groups.

The arylalkylthio group which can be carried as a substituent on the above-described arylene group may have a substituent, and the carbon atom number thereof is usually 7 to 60. Examples of the above-described arylalkylthio group include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups and 2-napthyl-$C_1$ to $C_{12}$ alkylthio groups.

The amino group which can be carried as a substituent on the above-described arylene group may be an unsubstituted amino group, or an amino group obtained by substitution of one or two hydrogen atoms of an amino group with one or two groups selected from the group consisting of an alkyl group, an aryl group, an arylalkyl group and a monovalent heterocyclic group (hereinafter, referred to as "substituted amino group").

The substituted amino group may further have a substituent, and the carbon atom number thereof is usually 1 to 60, preferably 2 to 48.

Examples of the above-described substituted amino group include a methylamino group, a dimethylamino group, an ethylamino group, a diethylamino group, a propylamino group, a dipropylamino group, an isopropylamino group, a diisopropylamino group, a butylamino group, a sec-butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a dicyclohexylamino group, a pyrrolidyl group, a piperidyl group, a ditrifluoromethylamino group, a phenylamino group, a diphenylamino group, $C_1$ to $C_{12}$ alkoxyphenylamino groups, di($C_1$ to $C_{12}$ alkoxyphenyl) amino groups, di($C_1$ to $C_{12}$ alkylphenyl)amino groups, a 1-naphthylamino group, a 2-naphthylamino group, a pentafluorophenylamino group, a pyridylamino group, a pyridazinylamino group, a pyrimidylamino group, a pyrazylamino group, a triazylamino group, phenyl-$C_1$ to $C_{12}$ alkylamino groups, $C_1$ to $C_{12}$ alkoxyphenyl-$C_1$ to $C_{12}$ alkylamino groups, $C_1$ to $C_{12}$ alkylphenyl-$C_1$ to $C_{12}$ alkylamino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl)amino groups, 1-naphthyl-$C_1$ to $C_{12}$ alkylamino groups and 2-naphthyl-$C_1$ to $C_{12}$ alkylamino groups.

The silyl group which can be carried as a substituent on the above-described arylene group may be an unsubstituted silyl group, or a silyl group obtained by substitution of one, two or three hydrogen atoms of a silyl group with one, two or three groups selected from the group consisting of an alkyl group, an aryl group, an arylalkyl group and a monovalent heterocyclic group (hereinafter, referred to as "substituted silyl group").

The above-described substituted silyl group may further have a substituent, and the carbon atom number thereof is usually 1 to 60, preferably 3 to 48.

Examples of the above-described substituted silyl group include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a lauryldimethylsilyl group, phenyl-$C_1$ to $C_{12}$ alkylsilyl groups, $C_1$ to $C_{12}$ alkoxyphenyl-$C_1$ to $C_{12}$ alkylsilyl groups, $C_1$ to $C_{12}$ alkylphenyl-$C_1$ to $C_{12}$ alkylsilyl groups, 1-naphthyl-$C_1$ to $C_{12}$ alkylsilyl groups, 2-naphthyl-$C_1$ to $C_{12}$ alkylsilyl groups, phenyl-$C_1$ to $C_{12}$ alkyldimethylsilyl groups, a triphenylsilyl group, a tri-p-xylylsilyl group, a tribenzylsilyl group, a diphenylmethylsilyl group, a tert-butyldiphenylsilyl group and a dimethylphenylsilyl group.

Examples of the halogen atom which can be carried as a substituent on the above-described arylene group include a fluorine atom, a chlorine atom, a bromine atom and an iodine atom.

The acyl group which can be carried as a substituent on the above-described arylene group may have a substituent, and the carbon atom number thereof is usually 1 to 20, preferably 2 to 18. Examples of the above-described acyl group include an acetyl group, a propionyl group, a butyryl group, an isobutyryl group, a pivaloyl group, a benzoyl group, a trifluoroacetyl group and a pentafluorobenzoyl group.

The acyloxy group which can be carried as a substituent on the above-described arylene group may have a substituent, and the carbon atom number thereof is usually 1 to 20, preferably 2 to 18. Examples of the above-described acyloxy group include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The imine residue which can be carried as a substituent on the above-described arylene group is an atomic group obtained by removing one hydrogen atom from an imine compound (meaning a compound having —N=C— in the molecule. Examples thereof include aldimines, ketimines, and compounds obtained by substituting a hydrogen atom linked to a nitrogen atom contained in these compounds with an alkyl group or the like.), may have a substituent, and the carbon atom number thereof is usually 2 to 20, preferably 2 to 18.

Examples of the above-described imine residue include groups represented by the following formulae.

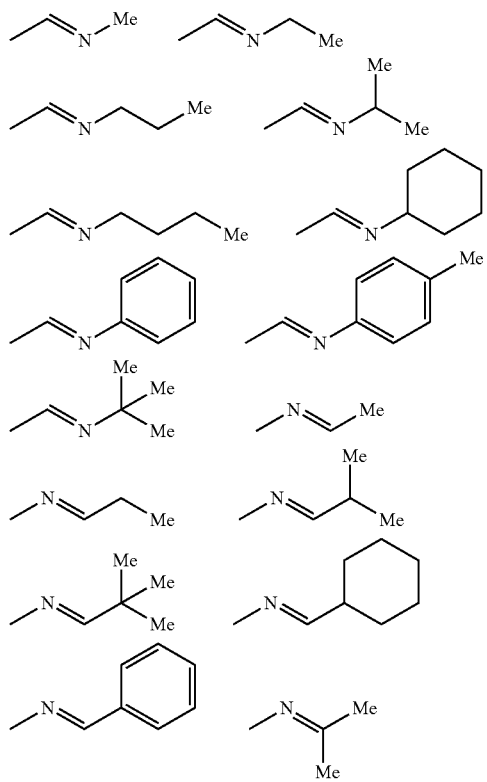

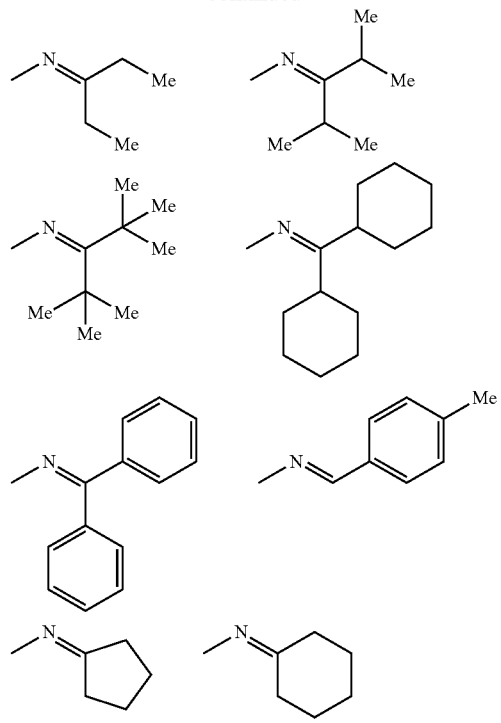

(wherein Me represents a methyl group. The same shall apply hereinafter.)

The carbamoyl group which can be carried as a substituent on the above-described arylene group may have a substituent, and the carbon atom number thereof is usually 1 to 20, preferably 2 to 20, more preferably 2 to 18. Examples of the above-described carbamoyl group include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group and a dipentafluorobenzamide group.

The acid imide group which can be carried as a substituent on the above-described arylene group is an atomic group obtained by removing from an acid imide a hydrogen atom linked to its nitrogen atom, may have a substituent, and the carbon atom number thereof is usually 4 to 20. Examples of the above-described acid imide group include following groups.

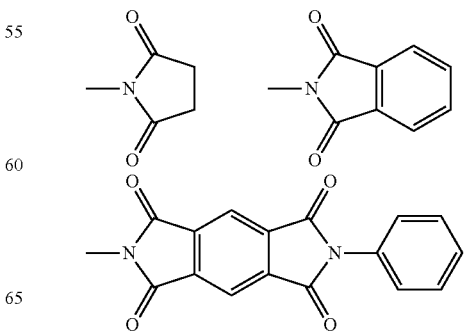

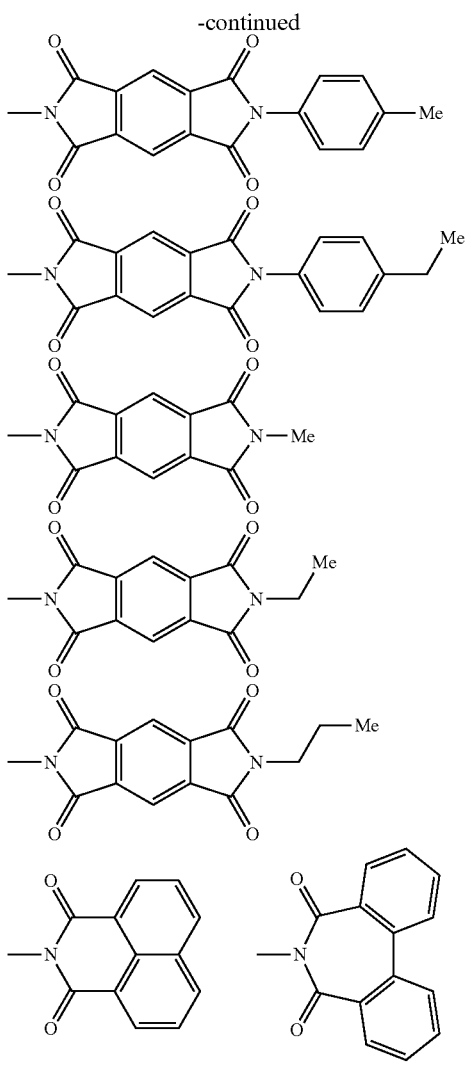

The monovalent heterocyclic group which can be carried as a substituent on the above-described arylene group means an atomic group remaining after removal of one hydrogen atom from a heterocyclic compound, and the carbon atom number thereof is usually 4 to 60, preferably 4 to 20. Of the monovalent heterocyclic groups, monovalent aromatic heterocyclic groups are preferable. The carbon atom number of the monovalent heterocyclic group does not include the carbon atom number of the substituent. Here, the heterocyclic compound includes organic compounds having a cyclic structure in which elements constituting the ring include not only a carbon atom but also a hetero atom such as an oxygen atom, a sulfur atom, a nitrogen atom, a phosphorus atom, a boron atom and the like contained in the ring. Examples of the above-described monovalent heterocyclic group include a thienyl group, $C_1$ to $C_{12}$ alkylthienyl groups, a pyrrolyl group, a furyl group, a pyridyl group, $C_1$ to $C_{12}$ alkylpyridyl groups, a piperidyl group, a quinolyl group and an isoquinolyl group, and preferable are a thienyl group, $C_1$ to $C_{12}$ alkylthienyl groups, a pyridyl group and $C_1$ to $C_{12}$ alkylpyridyl groups.

The carboxyl group which can be carried as a substituent on the above-described arylene group may be an unsubstituted carboxyl group, or a carboxyl group of which hydrogen atom is substituted by an alkyl group, an aryl group, an arylalkyl group or a monovalent heterocyclic group (hereinafter, referred to as "substituted carboxyl group").

The above-described substituted carboxyl group may further have a substituent, and the carbon atom number thereof is usually 2 to 60, preferably 2 to 48.

Examples of the above-described substituted carboxyl group include a methoxycarbonyl group, an ethoxycarbonyl group, a propoxycarbonyl group, an isopropoxycarbonyl group, a butoxycarbonyl group, an isobutoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group and a pyridyloxycarbonyl group. The alkyl group, the aryl group, the arylalkyl group and the monovalent heterocyclic group may have a substituent.

The carbon atom number of a portion excluding the substituent in the above-described arylene group is usually 6 to 60, preferably 6 to 20, and the total carbon atom number including the substituent is usually 6 to 100.

Examples of the above-described arylene group include phenylene groups (the following formulae 1 to 3), naphthalenediyl groups (the following formulae 4 to 13), anthracene-diyl groups (the following formulae 14 to 19), biphenyl-diyl groups (the following formulae 20 to 25), terphenyl-diyl groups (the following formulae 26 to 28), condensed ring groups (the following formulae 29 to 35), fluorene-diyl groups (the following formulae 36 to 38) and benzofluorene-diyl groups (the following formulae 39 to 46), and from the standpoint of the durability of a light emitting device, preferable are phenylene groups, naphthalenediyl groups, anthracene-diyl groups, biphenyl-diyl groups, fluorene-diyl groups and benzofluorene-diyl groups, more preferable are phenylene groups, naphthalenediyl groups, anthracene-diyl groups, fluorene-diyl groups and benzofluorene-diyl groups, further preferable are phenylene groups and fluorene-diyl groups. The following groups may have the same substituent as explained and exemplified as the substituent which can be carried on the above-described arylene group.

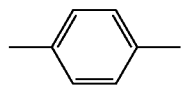

1

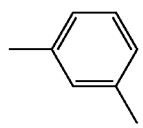

2

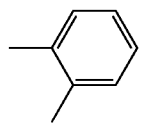

3

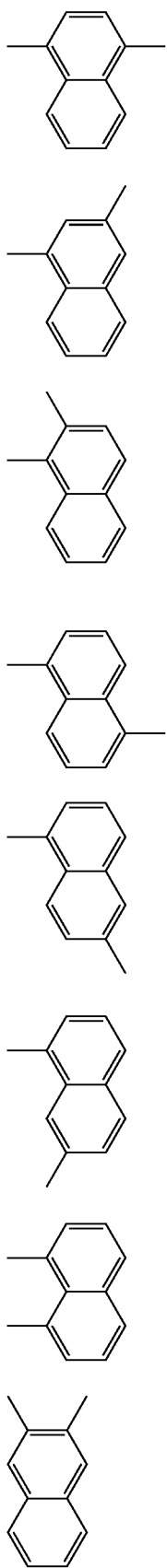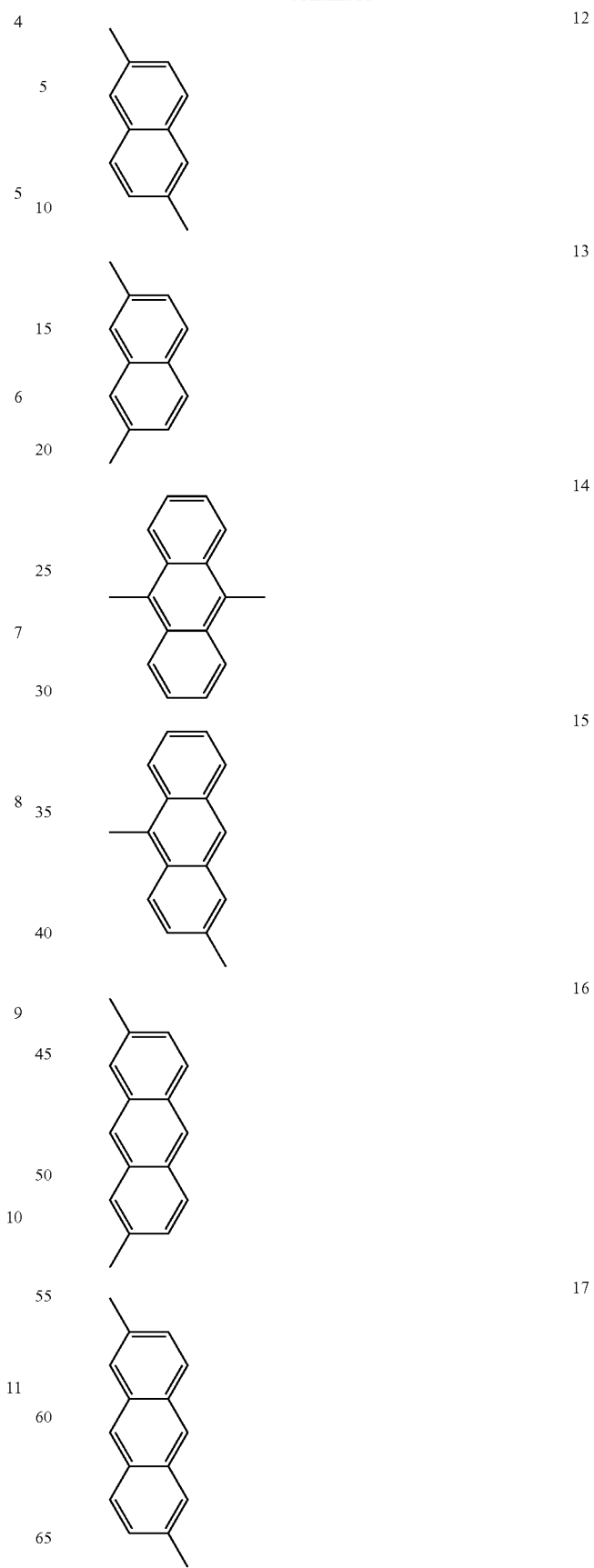

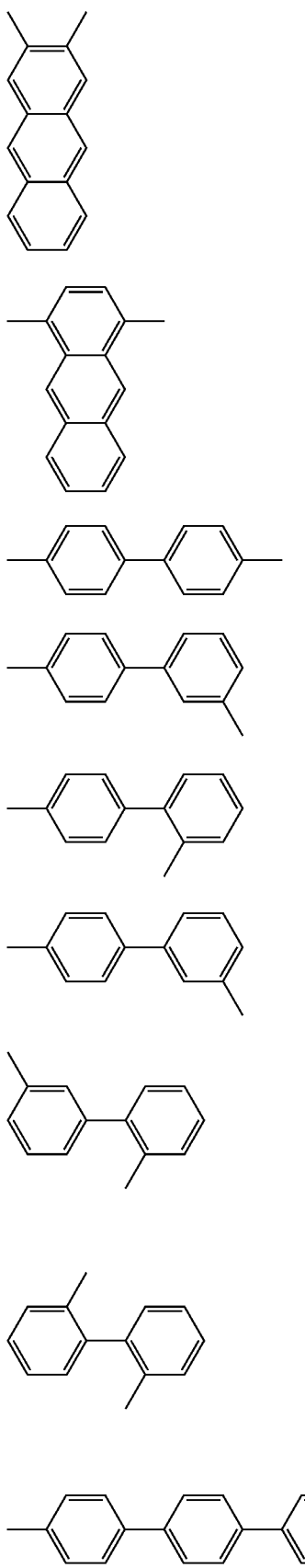
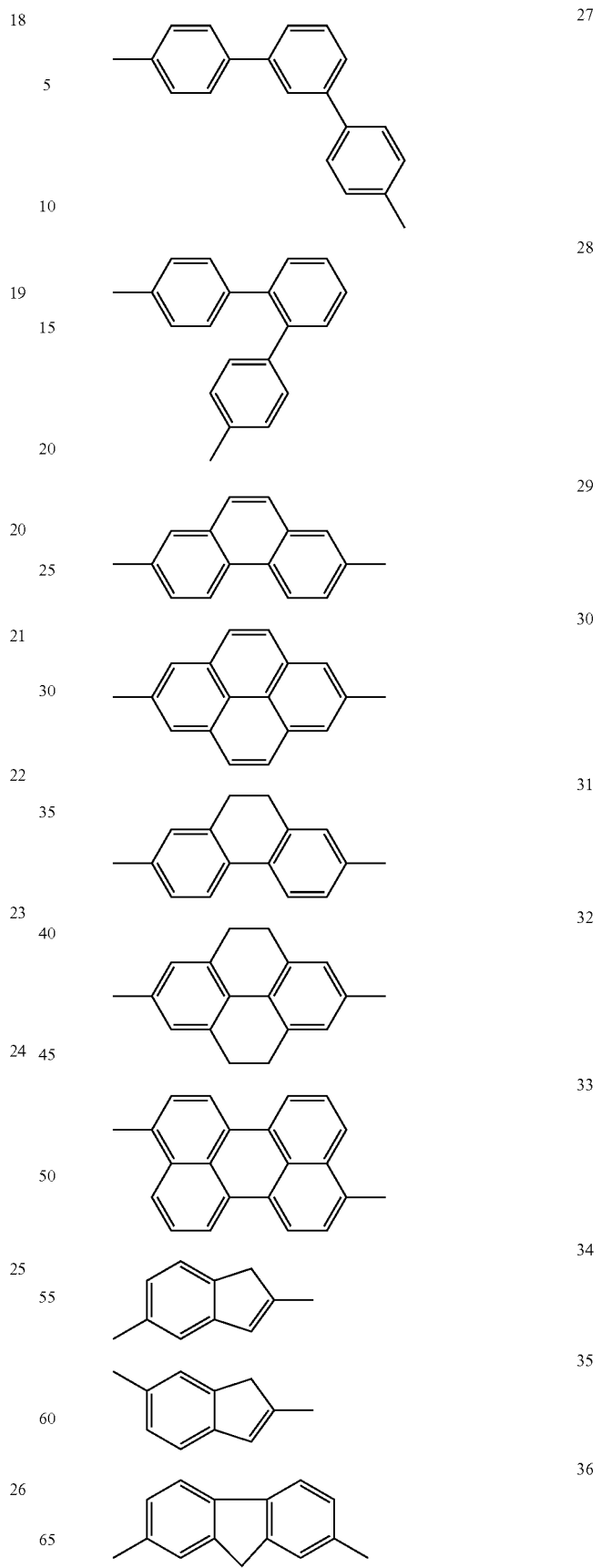

-continued

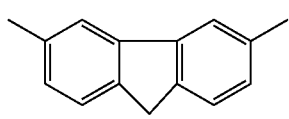
37

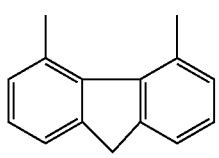
38

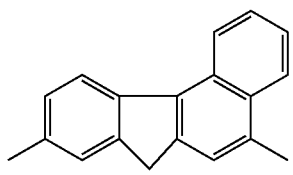
39

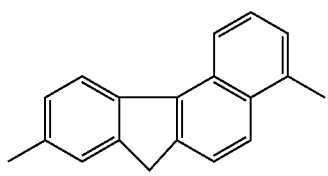
40

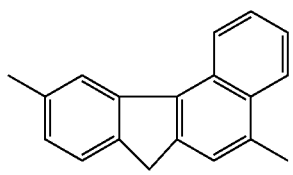
41

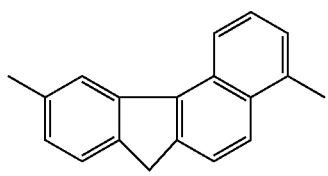
42

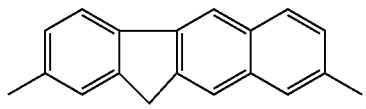
43

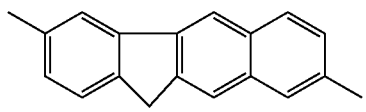
44

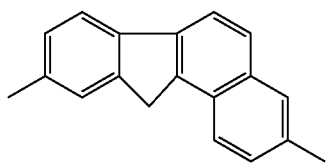
45

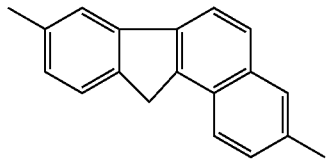
46

As the above-described arylene group, groups represented by the following formula (A) are preferable, from the standpoint of electron transportability:

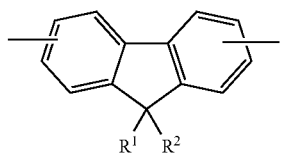
(A)

[in the formula (A), $R^1$ and $R^2$ each independently represent an unsubstituted or substituted alkyl group, an unsubstituted or substituted aryl group or an unsubstituted or substituted monovalent heterocyclic group. The group represented by the formula (A) may be nucleus-substituted.].

"The group represented by the formula (A) is nucleus-substituted" means that a hydrogen atom of a benzene ring in the group represented by the formula (A) is substituted by a substituent (including atoms other than a hydrogen atom).

When the group represented by the above-described formula (A) is nucleus-substituted, the substituent which can be carried on the group includes an unsubstituted or substituted alkyl group, an unsubstituted or substituted alkoxy group, an unsubstituted or substituted aryl group and an unsubstituted or substituted aryloxy group. These groups are the same as the groups explained and exemplified as the substituent which can be carried on the above-described arylene group.

In the above-described formula (A), $R^1$ and $R^2$ each independently represent preferably an unsubstituted or substituted alkyl group or an unsubstituted or substituted aryl group, from the standpoint of easiness of synthesis.

As the group represented by the above-described formula (A), groups represented by the following formula (A)-1 are preferable since higher electron transportability is obtained:

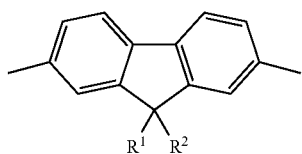
(A)-1

[in the formula (A)-1, $R^1$ and $R^2$ have the same meaning as described above. The group represented by the formula (A)-1 may be nucleus-substituted.].

As the arylene group, groups represented by the following formula (B) are also preferable, from the standpoint of electron transportability:

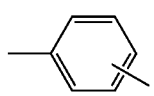
(B)

[the group represented by the formula (B) may have a substituent.].

When the group represented by the above-described formula (B) has a substituent, this substituent is the same as the substituent which can be carried on the group represented by the above-described formula (A).

As the group represented by the above-described formula (B), groups represented by the following formula (B)-1 are preferable since higher electron transportability is obtained:

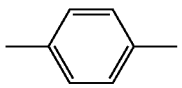

(B)-1

[the group represented by the formula (B)-1 may have a substituent.].

When the group represented by the above-described formula (B)-1 has a substituent, this substituent is the same as the substituent which can be carried on the group represented by the above-described formula (A).

The above-described divalent heterocyclic group is an atomic group remaining after removal of two hydrogen atoms from a heterocyclic compound. The heterocyclic compound includes organic compounds having a cyclic structure in which elements constituting the ring include not only a carbon atom but also a hetero atom such as an oxygen atom, a sulfur atom, a nitrogen atom, a phosphorus atom, a boron atom, an arsenic atom and the like contained in the ring. The above-described divalent heterocyclic group may have a substituent. The substituent which can be carried on the above-described divalent heterocyclic group is the same as the group explained and exemplified as the substituent which can be carried on the above-described arylene group, and from the standpoint of the solubility of the resulting compound, the light emitting property thereof, easiness of synthesis thereof and the property when used for fabrication of a device, preferable are an unsubstituted or substituted alkyl group, an unsubstituted or substituted alkoxy group, an unsubstituted or substituted aryl group, an unsubstituted or substituted aryloxy group, a halogen atom an a cyano group.

As the above-described divalent heterocyclic group, divalent aromatic heterocyclic groups are preferable. The carbon atom number of a portion excluding the substituent in the above-described divalent heterocyclic group is usually 3 to 60, and the total carbon atom number including the substituent is usually 3 to 100.

As the above-described divalent heterocyclic group, groups represented by the following formula (C) are preferable, from the standpoint of charge transportability:

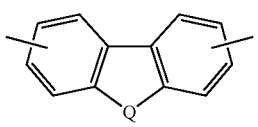

(C)

[in the formula (C), Q represents an oxygen atom, a sulfur atom, $-N(R^{01})-$, $-O-C(R^{02})(R^{03})-$ or $-Si(R^{04})(R^{05})-$. $R^{01}$ represents a hydrogen atom, an unsubstituted or substituted alkyl group or an unsubstituted or substituted aryl group. $R^{02}$, $R^{03}$, $R^{04}$ and $R^{05}$ each independently represent a hydrogen atom, an unsubstituted or substituted alkyl group, an unsubstituted or substituted alkoxy group, an unsubstituted or substituted aryl group or an unsubstituted or substituted aryloxy group. The group represented by the formula (C) may be nucleus-substituted.].

When the group represented by the above-described formula (C) is nucleus-substituted, the substituent which can be carried on the group is the same as the substituent which can be carried on the group represented by the above-described formula (A).

In the above-described formula (C), Q represents preferably an oxygen atom, a sulfur atom or $-N(R^{01})-$, more preferably an oxygen atom or $-N(R^{01})-$, from the standpoint of easiness of synthesis of the resultant compound.

As the group represented by the above-described formula (C), groups represented by the following formula (C)-1 or the following formula (C)-2 are preferable since higher charge transportability is obtained:

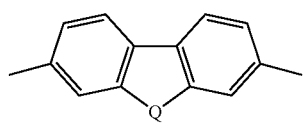

(C)-1

[in the formula (C)-1, Q has the same meaning as described above. The group represented by the formula (C)-1 may be nucleus-substituted.]

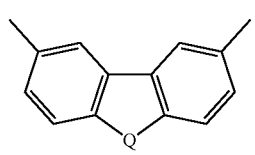

(C)-2

[In the formula (C)-2, Q has the same meaning as described above. The group represented by the formula (C)-2 may be nucleus-substituted.].

When the groups represented by the above-described formulae (C)-1 and (C)-2 are nucleus-substituted, the substituent which can be carried on these groups is the same as the substituent which can be carried on the group represented by the above-described formula (A).

In the above-described formulae (C)-1 and (C)-2, Q represents preferably an oxygen atom, a sulfur atom or $-N(R^{01})-$, more preferably an oxygen atom or $-N(R^{01})-$, particularly preferably an oxygen atom, from the standpoint of easiness of synthesis.

As the above-described divalent heterocyclic group, groups represented by the following formula (D) are preferable, from the standpoint of electron transportability:

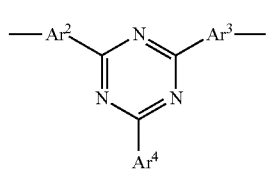

(D)

[in the formula (D), $Ar^2$ and $Ar^3$ each independently represent an unsubstituted or substituted phenylene group, an unsubstituted or substituted naphthylene group or an unsubstituted or substituted fluorenediyl group, and $Ar^4$ represents an unsubstituted or substituted aryl group, an unsubstituted or substituted monovalent heterocyclic group or an unsubstituted or substituted alkyl group.].

As the above-described divalent heterocyclic group, the following groups are preferable. The following groups may have the same substituent as explained and exemplified as the substituent which can be carried on the above-described arylene group.

Divalent heterocyclic groups containing as a hetero atom a nitrogen atom: pyridine-diyl groups (the following formulae 101 to 104), diazaphenylene groups (the following formulae 105 to 108), triazine-diyl group (the following formula 109), quinoline-diyl groups (the following formulae 110 to 114), quinoxaline-diyl groups (the following formulae 115 to 119), acridinediyl groups (the following formulae 120 to 123), bipyridyl-diyl groups (the following formulae 124 to 126) and phenanthrolinediyl groups (the following formulae 127 to 128).

Groups containing as a hetero atom an oxygen atom, a sulfur atom, a nitrogen atom, a silicon atom and the like and having a fluorene structure (the following formulae 129 to 136).

5-membered heterocyclic groups containing as a hetero atom an oxygen atom, a sulfur atom, a nitrogen atom, a silicon atom and the like (the following formulae 137 to 140).

5-membered condensed heterocyclic groups containing as a hetero atom an oxygen atom, a sulfur atom, a nitrogen atom, a silicon atom and the like (the following formulae 141 to 158).

5-membered heterocyclic groups containing as a hetero atom an oxygen atom, a sulfur atom, a nitrogen atom, a silicon atom and the like and having a linkage at α-position of its hetero atom thereby forming a dimer or an oligomer (the following formulae 159 to 160).

5-membered heterocyclic groups containing as a hetero atom an oxygen atom, a sulfur atom, a nitrogen atom, a silicon atom and the like and having a linkage at α-position of its hetero to a phenyl group (the following formulae 161 to 166).

5-membered condensed heterocyclic groups containing as a hetero atom an oxygen atom, a sulfur atom, a nitrogen atom and the like and carrying thereon a substituent such as a phenyl group, a furyl group or a thienyl group (the following formulae 167 to 172).

6-membered heterocyclic groups containing as a hetero atom an oxygen atom, a nitrogen atom and the like (the following formulae 173 to 176).

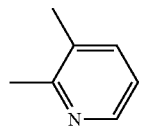

101

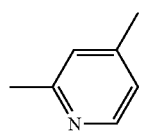

102

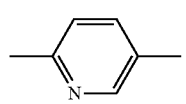

103

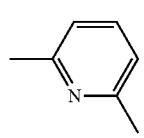

104

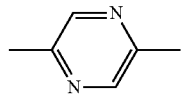

105

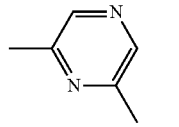

106

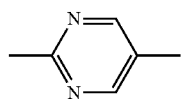

107

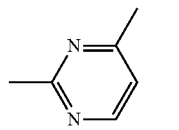

108

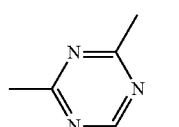

109

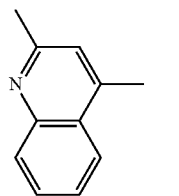

110

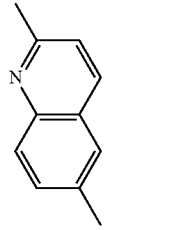

111

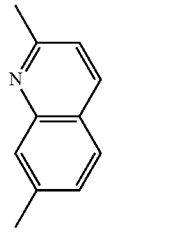

112

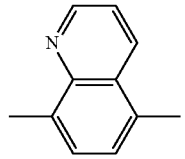

113

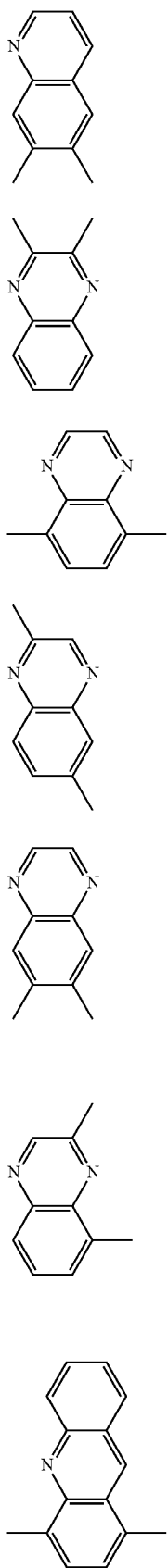
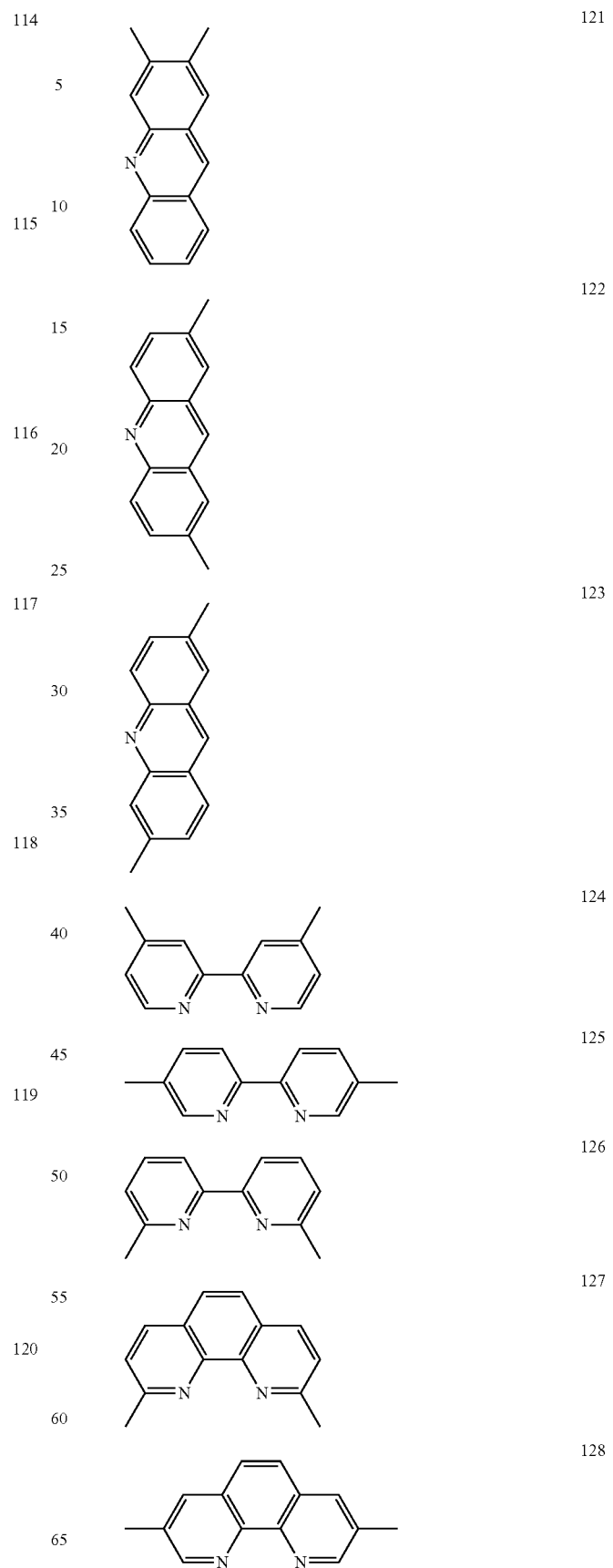

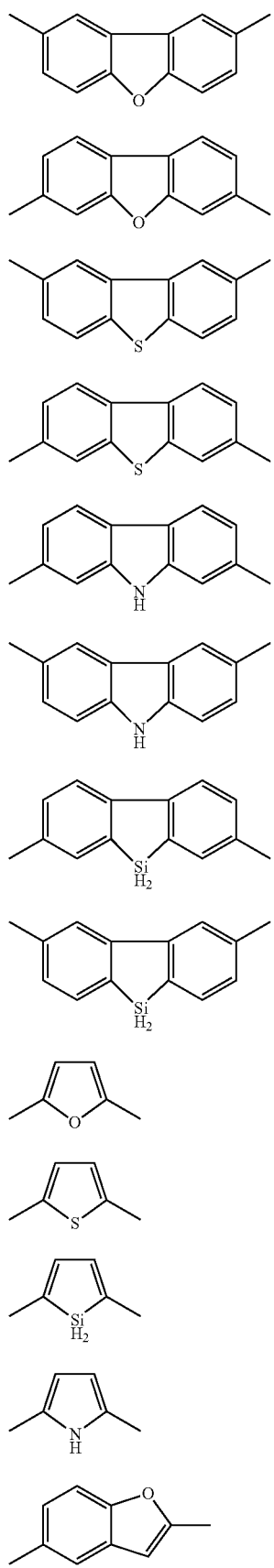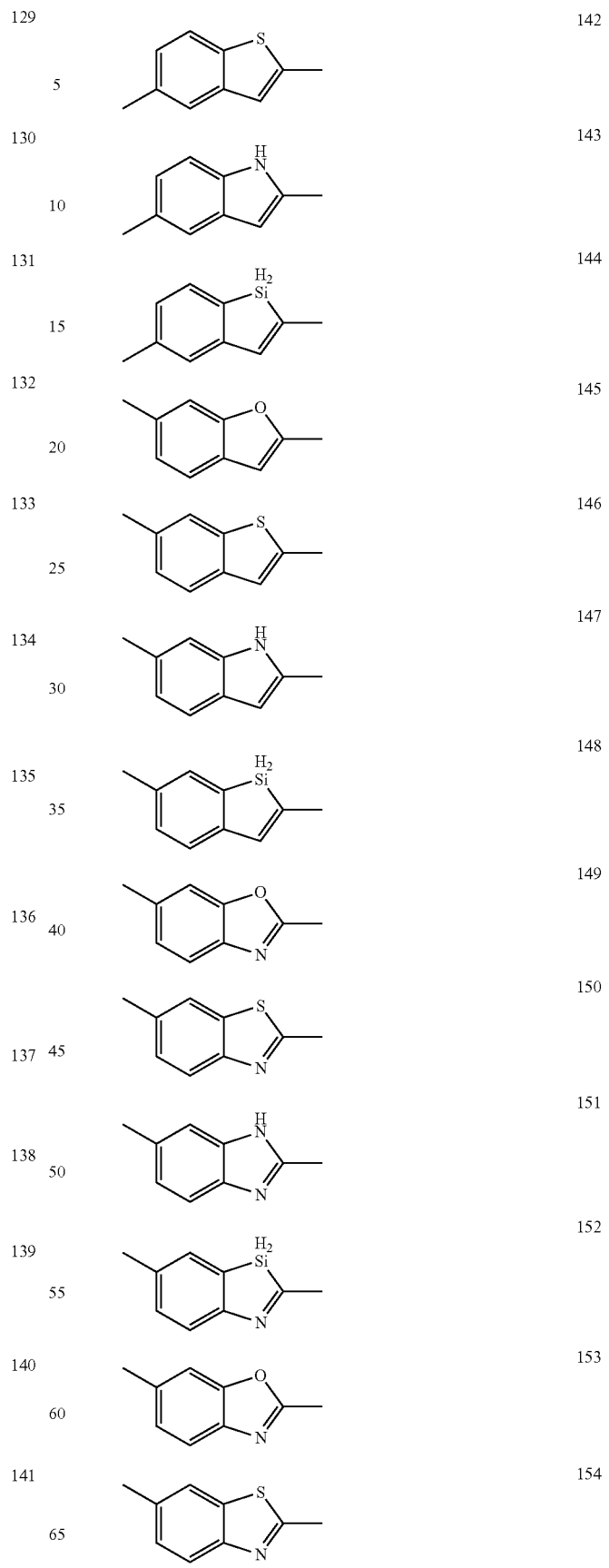

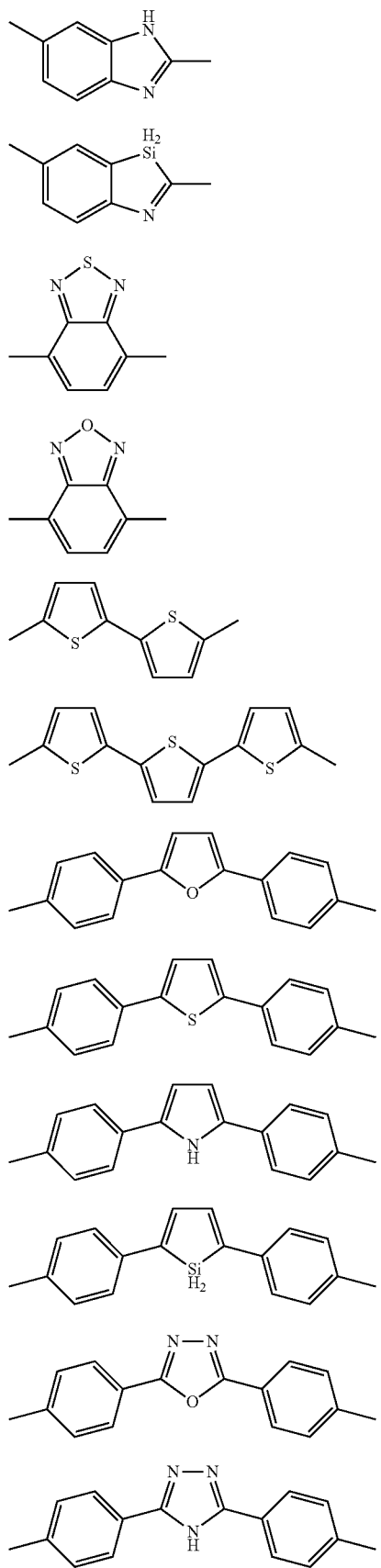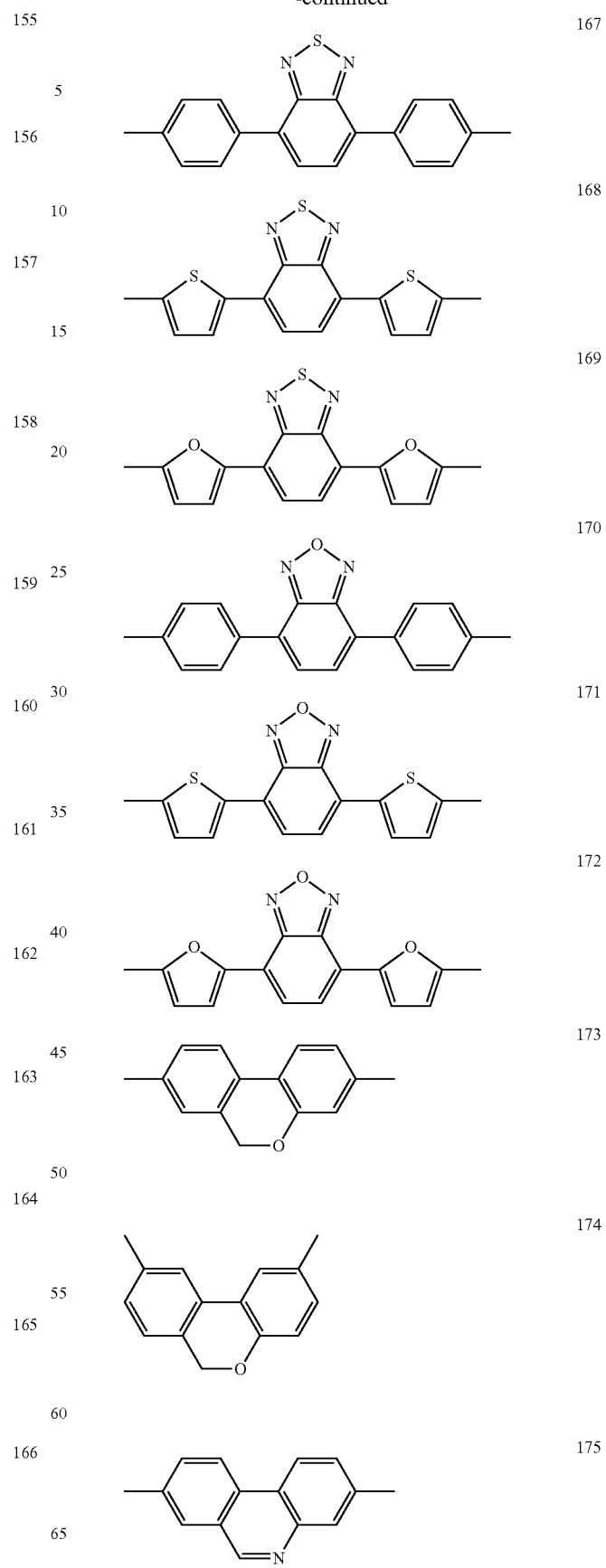

-continued

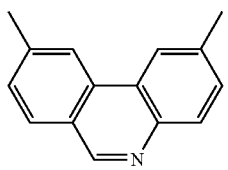
176

The above-described divalent aromatic amine residue is an atomic group remaining after removal of two hydrogen atoms from an aromatic amine, and the carbon atom number thereof is usually 5 to 100, preferably 15 to 60. The above-described divalent aromatic amine residue may have a substituent. The carbon atom number of the divalent aromatic amine residue does not include the carbon atom number of the substituent. The above-described substituent is preferably an unsubstituted or substituted alkyl group, an unsubstituted or substituted alkoxy group, an unsubstituted or substituted aryl group, an unsubstituted or substituted aryloxy group, a halogen atom or an unsubstituted or substituted a cyano group, from the standpoint of the solubility of the resultant compound, the fluorescent property thereof, easiness of synthesis thereof and easiness of crosslinkage of a film. These groups and atoms are the same as the groups and atoms explained and exemplified as the substituent which can be carried on the above-described arylene group.

As the above-described divalent aromatic amine residue, groups represented by the following formula (E):

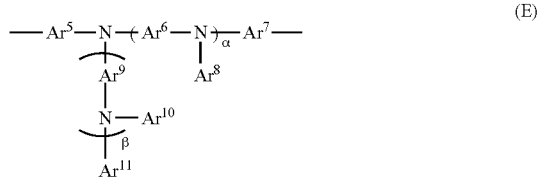
(E)

[in the formula (E), $Ar^5$, $Ar^6$, $Ar^7$ and $Ar^9$ each independently represent an unsubstituted or substituted arylene group or an unsubstituted or substituted divalent heterocyclic group, $Ar^8$, $Ar^{10}$ and $Ar^{11}$ each independently represent an unsubstituted or substituted aryl group or an unsubstituted or substituted monovalent heterocyclic group, and α and β are each independently 0 or 1.]
or the following formula (F):

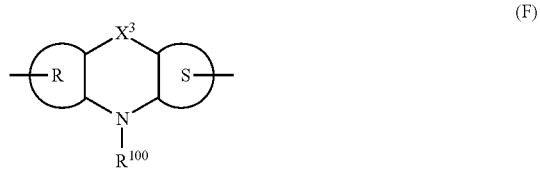
(F)

[in the formula (F), a ring R and a ring S each independently represent an unsubstituted or substituted aromatic hydrocarbon ring, and $X^3$ represents a single bond, an oxygen atom, a sulfur atom or —N($R^{99}$)—. $R^{99}$ represents an unsubstituted or substituted alkyl group or an unsubstituted or substituted aryl group. $R^{100}$ represents an unsubstituted or substituted alkyl group, an unsubstituted or substituted aryl group, an unsubstituted or substituted amino group, an unsubstituted or substituted silyl group, a halogen atom, an acyl group, an imine residue, a carbamoyl group, an acid imide group, an unsubstituted or substituted monovalent heterocyclic group, an unsubstituted or substituted carboxyl group, a cyano group or a nitro group.]
are preferable, from the standpoint of hole transportability.

In the above-described formula (E), the arylene group, the divalent heterocyclic group, the aryl group and the monovalent heterocyclic group have the same meaning as described above.

In the above-described formula (E), the unsubstituted or substituted alkyl group, the unsubstituted or substituted alkoxy group, the unsubstituted or substituted alkylthio group, the unsubstituted or substituted aryl group, the unsubstituted or substituted aryloxy group, the unsubstituted or substituted arylthio group, the unsubstituted or substituted amino group, the unsubstituted or substituted silyl group, the halogen atom, the acyl group, the unsubstituted or substituted acyloxy group, the imine residue, the carbamoyl group, the acid imide group, the monovalent unsubstituted or substituted heterocyclic group, the unsubstituted or substituted carboxyl group, the cyano group and the nitro group as the substituent which can be carried on $Ar^5$, $Ar^6$, $Ar^7$, $Ar^8$, $Ar^9$, $Ar^{10}$ and $Ar^{11}$ are the same as explained and exemplified as the substituent which can be carried on the above-described arylene group.

In the above-described formula (F), the aromatic hydrocarbon ring represented by the ring R and the ring S is preferably a ring obtained by substitution with a hydrogen atom of a connecting bond in the divalent group shown as an example of the above-described arylene group.

In the above-described formula (F), the unsubstituted or substituted alkyl group and the unsubstituted or substituted aryl group represented by $R^{99}$ and the unsubstituted or substituted alkyl group, the unsubstituted or substituted aryl group, the unsubstituted or substituted amino group, the unsubstituted or substituted silyl group, the halogen atom, the acyl group, the imine residue, the carbamoyl group, the acid imide group, the unsubstituted or substituted monovalent heterocyclic group, the unsubstituted or substituted carboxyl group, the cyano group and the nitro group represented by $R^{100}$ are the same as explained and exemplified as the substituent which can be carried on the above-described $Ar^5$, $Ar^6$, $Ar^7$, $Ar^8$, $Ar^9$, $Ar^{10}$ and $Ar^{11}$.

As the group represented by the above-described formula (E), groups represented by the following formula (E)-1, (E)-2, (E)-3, (E)-4, or (E)-5 are preferable, from the standpoint of hole transportability:

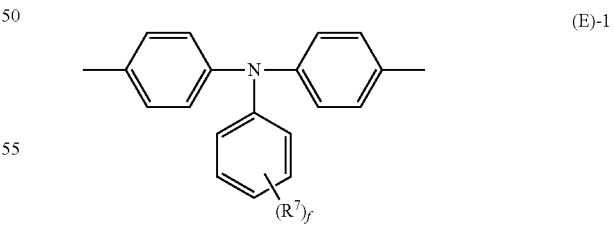
(E)-1

[in the formula (E)-1, $R^7$ represents a hydrogen atom, an unsubstituted or substituted alkyl group or an unsubstituted or substituted alkoxy group. f is an integer of 0 to 5, and from the standpoint of easiness of synthesis of the resultant compound, is preferably an integer of 0 to 3. When a plurality of $R^7$s are present, these may be the same or different. The group represented by the formula (E)-1 may be nucleus-substituted.]

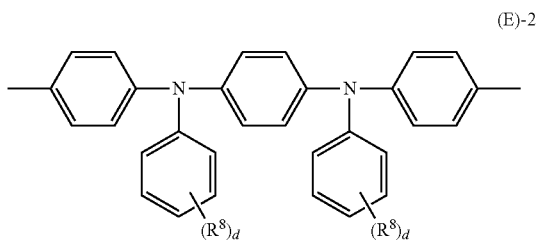
(E)-2

[in the formula (E)-2, $R^8$ represents a hydrogen atom, an unsubstituted or substituted alkyl group or an unsubstituted or substituted alkoxy group. d is an integer of 0 to 5, and from the standpoint of easiness of synthesis, is preferably an integer of 0 to 3. Two characters of d may be the same or different. When a plurality of $R^8$s are present, these may be the same or different. The group represented by the formula (E)-2 may be nucleus-substituted.]

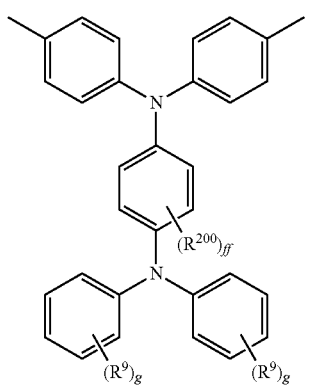
(E)-3

[in the formula (E)-3, $R^9$ and $R^{200}$ each independently represent a hydrogen atom, an unsubstituted or substituted alkyl group or an unsubstituted or substituted alkoxy group. g is an integer of 0 to 5, and from the standpoint of easiness of synthesis, is preferably an integer of 0 to 3. Two characters of g may be the same or different. ff is an integer of 0 to 4, and from the standpoint of easiness of synthesis, is preferably an integer of 0 to 2. When a plurality of $R^9$s and a plurality of $R^{200}$s are present, each of them may be the same or different. The group represented by the formula (E)-3 may be nucleus-substituted.]

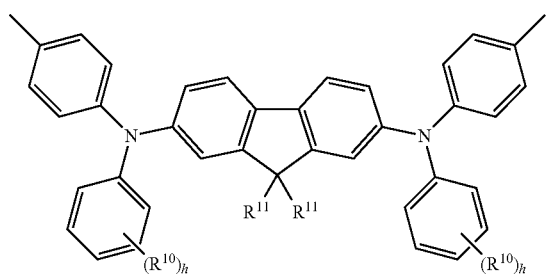
(E)-4

[in the formula (E)-4, $R^{10}$ represents a hydrogen atom, an unsubstituted or substituted alkyl group or an unsubstituted or substituted alkoxy group. h is an integer of 0 to 5, and from the standpoint of easiness of synthesis, is preferably an integer of 0 to 3. Two characters of h may be the same or different. When a plurality of $R^{10}$s are present, these may be the same or different. $R^{11}$ represents an unsubstituted or substituted alkyl group or an unsubstituted or substituted aryl group. Two moieties of $R^{11}$ may be the same or different. The group represented by the formula (E)-4 may be nucleus-substituted.]

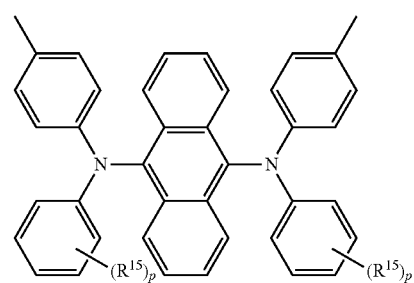
(E)-5

[in the formula (E)-5, $R^{15}$ represents a hydrogen atom, an unsubstituted or substituted alkyl group or an unsubstituted or substituted alkoxy group. p is an integer of 0 to 5, and from the standpoint of easiness of synthesis, is preferably an integer of 0 to 3. Two characters of p may be the same or different. When a plurality of $R^{15}$s are present, these may be the same or different. The group represented by the formula (E)-5 may be nucleus-substituted.].

The unsubstituted or substituted alkyl group and the unsubstituted or substituted alkoxy group represented by $R^7$ in the above-described formula (E)-1, $R^8$ in the above-described formula (E)-2, $R^9$ and $R^{200}$ in the above-described formula (E)-3, $R^{10}$ in the above-described formula (E)-4 and $R^{15}$ in the above-described formula (E)-5 have the same meaning as described above.

The unsubstituted or substituted alkyl group and the unsubstituted or substituted aryl group represented by $R^{11}$ in the above-described formula (E)-4 have the same meaning as described above.

When the group represented by the above-described formulae (E)-1 to (E)-5 is nucleus-substituted, the substituent which can be carried on includes an unsubstituted or substituted alkyl group, an unsubstituted or substituted alkoxy group, an unsubstituted or substituted aryl group and an unsubstituted or substituted aryloxy group. These groups have the same meaning as described above.

As the group represented by the above-described formula (F), groups represented by the following formula (F)-1 are preferable, from the standpoint of hole transportability:

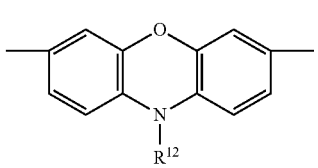
(F)-1

[in the formula (F)-1, $R^{12}$ represents an unsubstituted or substituted alkyl group or an unsubstituted or substituted aryl group. The group represented by the formula (F)-1 may be nucleus-substituted.].

In the above-described formula (F)-1, the unsubstituted or substituted alkyl group and the unsubstituted or substituted aryl group represented by $R^{12}$ have the same meaning as described above.

When the group represented by the above-described formula (F)-1 is nucleus-substituted, the substituent which can be carried on the group is the same as the substituent which can be carried on the group represented by the above-described formula (A).

The above-described divalent aromatic amine residue includes groups represented by the following formulae 201 to 222. The following groups may have the same substituent as explained and exemplified as the substituent which can be carried on the above-described arylene group.

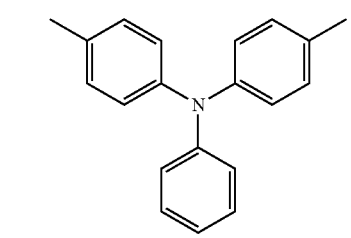

201

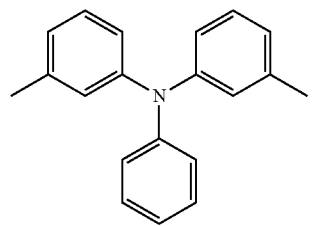

202

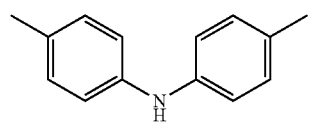

203

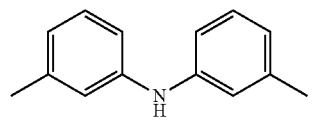

204

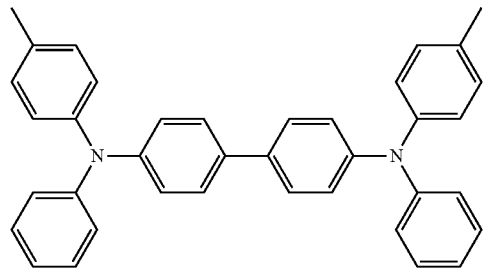

205

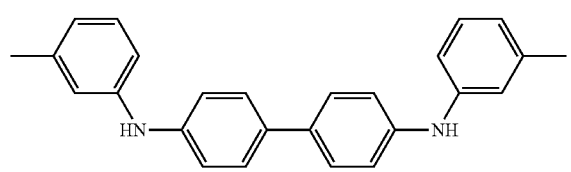

206

-continued

207

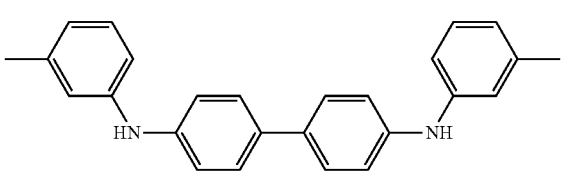

208

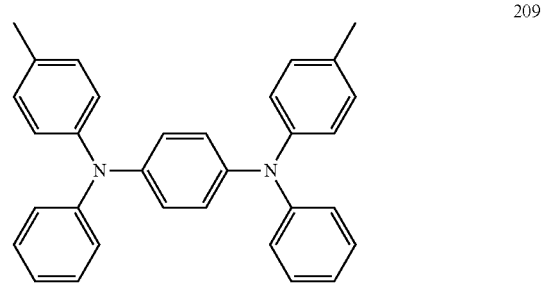

209

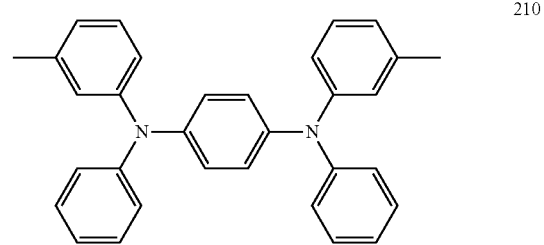

210

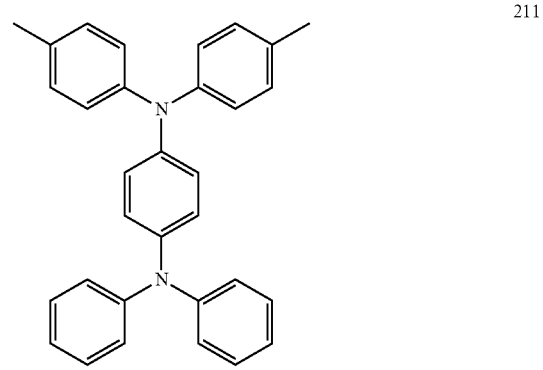

211

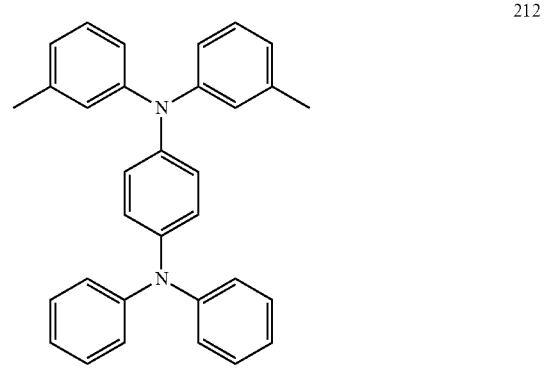

212

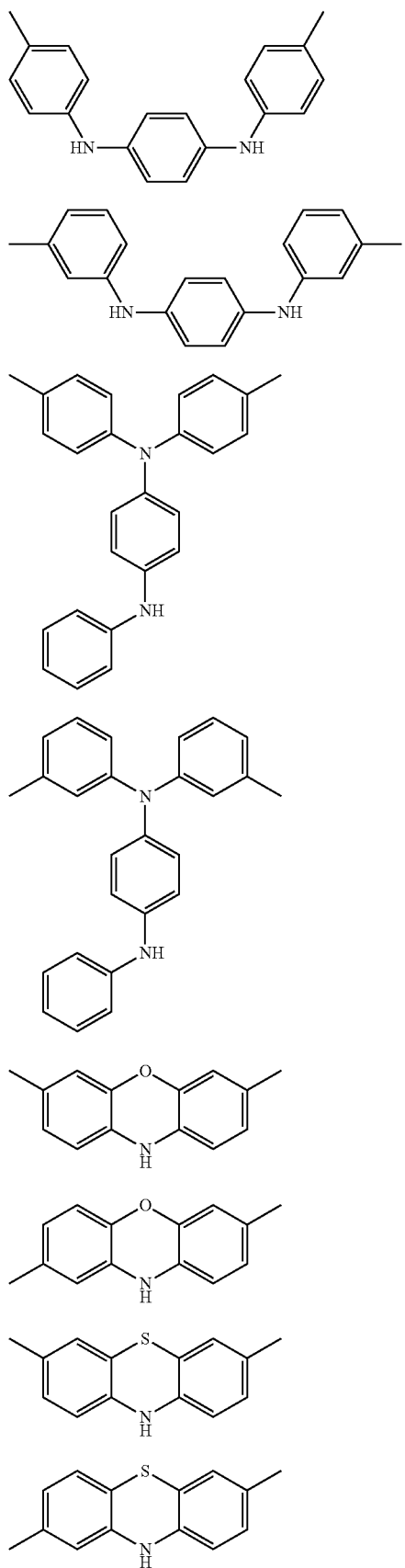
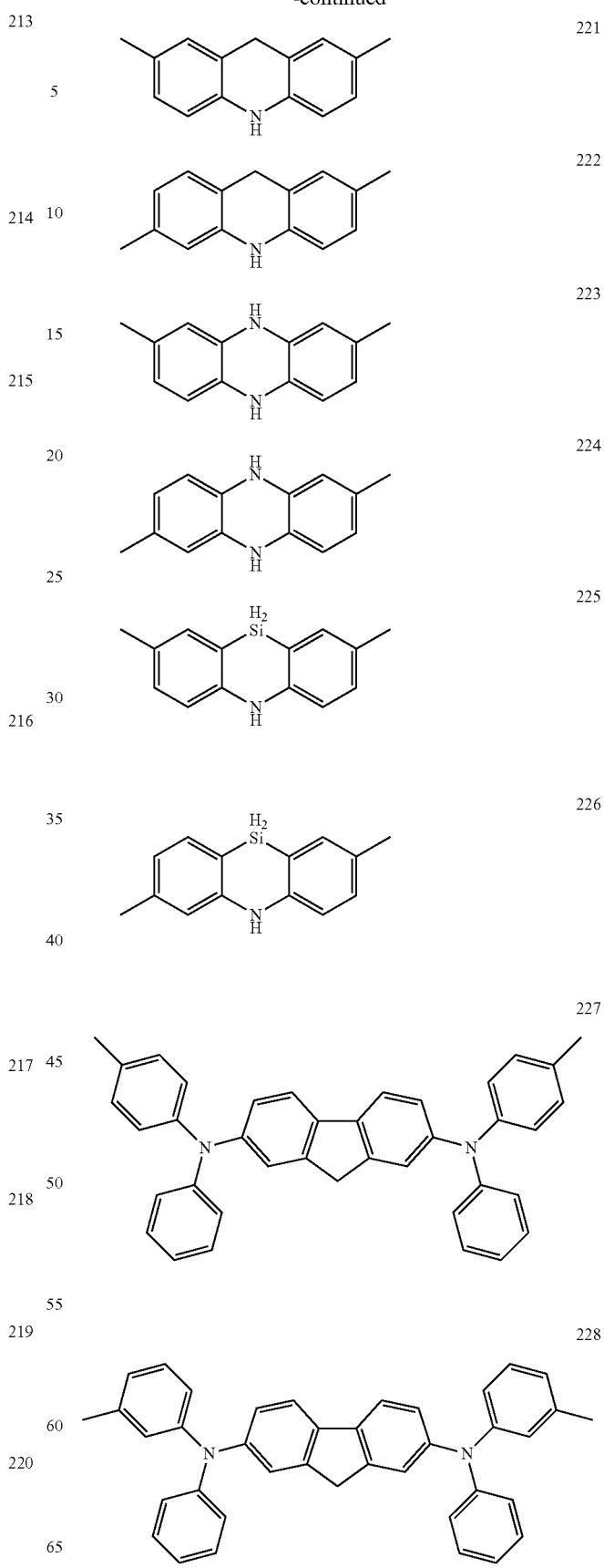

-continued

221
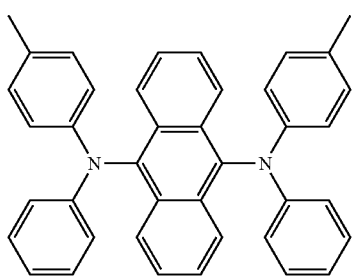

219
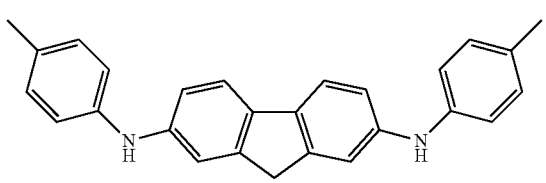

220
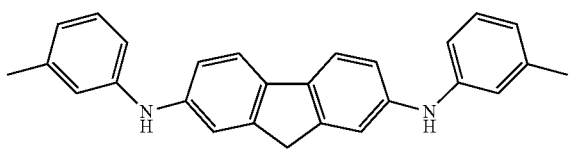

222
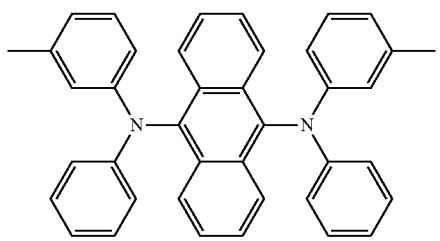

221
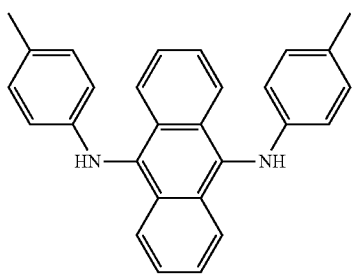

222
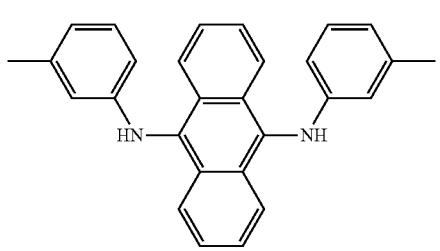

Crosslinkable Repeating Unit

In the composition of the present invention, it is preferable from the standpoint of charge transportability and a light emitting property that at least one of the above-described first crosslinkable polymer compound and the above-described second crosslinkable polymer compound has at least one selected from the group consisting of an unsubstituted or substituted arylene group, an unsubstituted or substituted divalent heterocyclic group and an unsubstituted or substituted divalent aromatic amine residue, as an aromatic conjugated repeating unit, and it is more preferable from the standpoint of the efficiency of a crosslinking reaction that at least one of the above-described first crosslinkable polymer compound and the above-described second crosslinkable polymer compound has at least one selected from the group consisting of an unsubstituted or substituted arylene group having 1 to 4 groups represented by the following formula [2] (Y), an unsubstituted or substituted divalent heterocyclic group having 1 to 4 groups represented by the following formula [2] (Y) and an unsubstituted or substituted divalent aromatic amine residue having 1 to 4 groups represented by the following formula [2] (Y), as an aromatic conjugated repeating unit. Hereinafter, this repeating unit is referred to as "repeating unit A".

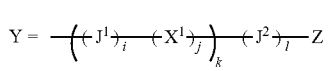

[2]

[in the formula [2], $J^1$ and $J^2$ each independently represent an alkylene group or an unsubstituted or substituted phenylene group and $X^1$ represents an oxygen atom, a nitrogen atom or a sulfur atom; i, j and l each independently represent 0 or 1 and k is an integer of 1 to 3; when there are a plurality of $J^1$ moieties, a plurality of $X^1$ moieties, or a plurality of characters of i and a plurality of characters of j, each of them may be the same or different; Z represents a crosslinkable group.]

The crosslinkable group in the above-described crosslinkable polymer compound is preferably a group represented by any of the following formulae (Z-1) to (Z-10), more preferably a group represented by any of the following formulae (Z-3) to (Z-6) and (Z-8) to (Z-10) and particularly preferably a group represented by any of the following formulae (Z-3) to (Z-5), from the standpoint of easy availability of raw material compounds. The double bond with a wavy line in the above-described formula (Z-4) means that the compound having the double bond may be any of an E isomer and a Z isomer, the same shall apply in the present specification.

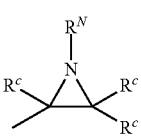
(Z-1)

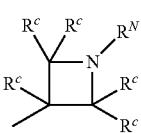
(Z-2)

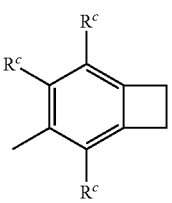
(Z-3)

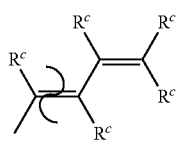 (Z-4)

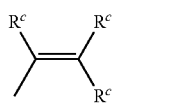 (Z-5)

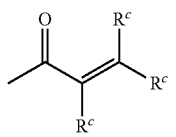 (Z-6)

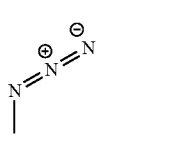 (Z-7)

(Z-8)

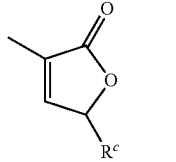 (Z-9)

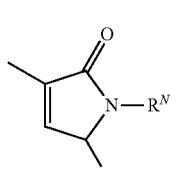 (Z-10)

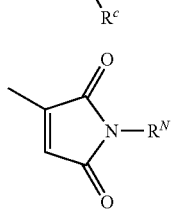

[in the formulae (Z-1) to (Z-10), $R^c$ represents a hydrogen atom, an unsubstituted or substituted alkyl group, an unsubstituted or substituted alkoxy group, an unsubstituted or substituted alkylthio group, an unsubstituted or substituted aryl group, an unsubstituted or substituted aryloxy group, an unsubstituted or substituted arylthio group, an unsubstituted or substituted amino group, an unsubstituted or substituted silyl group, a halogen atom, an acyl group, an acyloxy group, an imine residue, a carbamoyl group, an acid imide group, a monovalent heterocyclic group, an unsubstituted or substituted carboxyl group, a cyano group or a nitro group; the plurality of $R^c$ moieties may be the same or different; and $R^N$ represents an unsubstituted or substituted alkyl group, an unsubstituted or substituted aryl group, an unsubstituted or substituted arylalkyl group, an unsubstituted or substituted acyl group or an unsubstituted or substituted monovalent heterocyclic group.]

In the above-described formula [2], the phenylene group represented by $J^1$ and $J^2$ may have a substituent. The above-described phenylene group includes an o-phenylene, a m-phenylene, a p-phenylene and the like. The substituent which can be carried on the above-described phenylene group includes an alkyl group, an alkoxy group, a halogen atom and a cyano group. These groups have the same meaning as described above.

In the above-described formula [2], the alkylene group represented by $J^2$ and $J^2$ may be linear or branched, and may have a substituent. The above-described alkylene group has a carbon atom number of usually 1 to 20, preferably 1 to 10, more preferably 1 to 6. The above-described alkylene group includes a methylene group, a 1,2-ethylene group, a 1,3-propylene group, a 1,3-butylene group, a 1,4-butylene group, a 1,3-pentylene group, a 1,4-pentylene group, a 1,5-pentylene group, a 1,4-hexylene group, a 1,6-hexylene group, a 1,7-heptylene group, a 1,6-octylene group, a 1,8-octylene group and the like.

In the above-described formula [2], $X^1$ represents preferably an oxygen atom, from the standpoint of easiness of synthesis of a crosslinkable polymer compound.

The above-described crosslinkable polymer compound may have only one group represented by the above-described formula [2] (Y) or may have two or more groups represented by the above-described formula [2] (Y).

In the above-described crosslinkable repeating unit, the number of the group represented by the above-described formula [2] (Y) is preferably one or two, from the standpoint of easiness of synthesis of raw material monomers.

As the above-described repeating unit A, repeating units represented by the following formula [3] are preferable, from the standpoint of electron transportability.

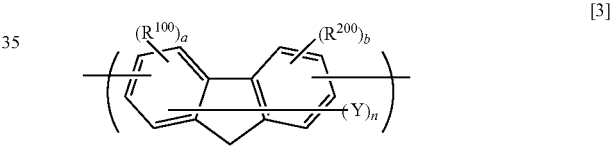 [3]

[in the formula [3], $R^{100}$ and $R^{200}$ each independently represent an unsubstituted or substituted alkyl group, an unsubstituted or substituted alkoxy group, an unsubstituted or substituted aryl group, an unsubstituted or substituted aryloxy group, an unsubstituted or substituted arylalkyl group or an unsubstituted or substituted arylalkoxy group; a and b are each independently an integer of 0 to 3 and n is 1 or 2; Y is a group represented by the formula [2]; when there are a plurality of $R^1$ moieties, a plurality of $R^2$ moieties or a plurality of Y moieties, each of them may be the same or different.

In the above-described formula [3], the unsubstituted or substituted alkyl group, the unsubstituted or substituted alkoxy group, the unsubstituted or substituted aryl group, the unsubstituted or substituted aryloxy group, the unsubstituted or substituted arylalkyl group and the unsubstituted or substituted arylalkoxy group represented by $R^{100}$ and $R^{200}$ have the same meaning as described above. The substituent which can be carried on the group represented by $R^{100}$ and $R^{200}$ is the same as the group explained and exemplified as the substituent which can be carried on the above-described arylene group.

As the above-described repeating unit A, repeating units represented by the following formula [3]-1 are more preferable, from the standpoint of easiness of synthesis of a crosslinkable polymer compound:

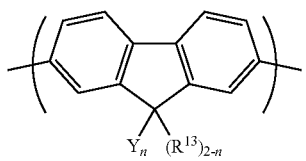

[3]-1

[in the formula [3]-1, $R^{13}$ represents an unsubstituted or substituted alkyl group, an unsubstituted or substituted aryl group or an unsubstituted or substituted monovalent heterocyclic group. n is 1 or 2. Y has the same meaning as described above, and when a plurality of Ys are present, these may be the same or different. The repeating unit represented by the formula [3]-1 may have a substituent.].

In the above-described formula [3]-1, the unsubstituted or substituted alkyl group, the unsubstituted or substituted aryl group and the unsubstituted or substituted monovalent heterocyclic group represented by $R^{13}$ have the same meaning as described above. The substituent which can be carried on the group represented by $R^{13}$ is the same as the group explained and exemplified as the substituent which can be carried on the above-described arylene group.

When the repeating unit represented by the above-described formula [3]-1 has a substituent, this substituent is the same as the substituent which can be carried on the group represented by the above-described formula (A).

As the above-described repeating unit A, repeating units represented by the following formula [4] are preferable, from the standpoint of easiness of synthesis of a crosslinkable polymer compound:

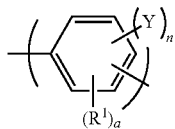

[4]

in the formula [4], $R^1$ and Y have the same meaning as described above; a and n have the same meaning as described above, a and n satisfying 1≤a+n≤4; when there are a plurality of $R^1$ moieties or a plurality of characters of n, each of them may be the same or different.

As the repeating unit represented by the above-described formula [4], repeating units represented by the following formula [4]-1 are preferable, from the standpoint of easiness of synthesis of a crosslinkable polymer compound:

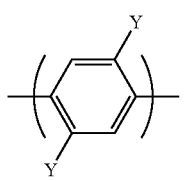

[4]-1

[in the formula (H)-1, Y has the same meaning as described above. Two moieties of Y may be the same or different. The repeating unit represented by the formula [4]-1 may have a substituent.].

When the repeating unit represented by the above-described formula [4]-1 has a substituent, this substituent is the same as the substituent which can be carried on the group represented by the above-described formula (A).

As the above-described repeating unit A, repeating units represented by the following formula [5] are preferable, from the standpoint of easiness of synthesis of a crosslinkable polymer compound:

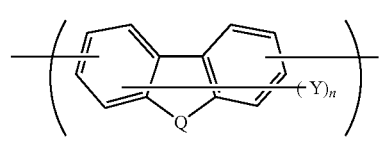

[5]

in the formula [5], Q, Y and n have the same meaning as described above; when a plurality of Y moieties, these may be the same or different.

As the repeating unit represented by the above-described formula [5], repeating units represented by the following formula [5]-1:

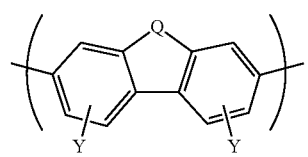

[5]-1

[in the formula [5]-1, Q and Y have the same meaning as described above. Two moieties of Y may be the same or different. The repeating unit represented by the formula [5]-1 may have a substituent.]

and repeating units represented by the following formula [5]-2:

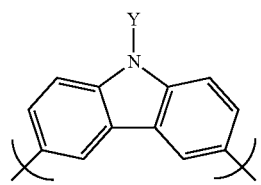

[5]-2

[in the formula [5]-2, Y has the same meaning as described above. The repeating unit represented by the formula [5]-2 may have a substituent.]

are preferable, from the standpoint of easiness of synthesis of a crosslinkable polymer compound.

When the repeating unit represented by the above-described formulae [5]-1 and [5]-2 has a substituent, this substituent is the same as the substituent which can be carried on the group represented by the above-described formula (A).

As the above-described repeating unit A, repeating units represented by the following formula [6] are preferable, from the standpoint of hole transportability:

[6]

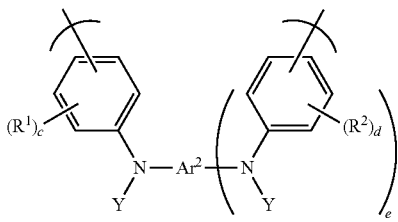

in the formula [6], $R^1$, $R^2$ and Y have the same meaning as described above; c and d each independently represent an integer of 0 to 4 and e is 0 or 1; $Ar^2$ represents an unsubstituted or substituted arylene group or an unsubstituted or substituted divalent heterocyclic group; when there are a plurality of $R^1$ moieties, a plurality of $R^2$ moieties or a plurality of Y moieties, each of them may be the same or different; when e=0, the connecting bond (bond) at the side of no-linkage to N of $Ar^2$ acts as a connecting bond of the repeating unit, the same shall apply in the present specification.

In the above-described formula [6], the unsubstituted or substituted arylene group and the unsubstituted or substituted divalent heterocyclic group represented by $Ar^2$ have the same meaning as described above.

As the repeating unit represented by the above-described formula [6], repeating units represented by the following formula [6]-1:

[6]-1

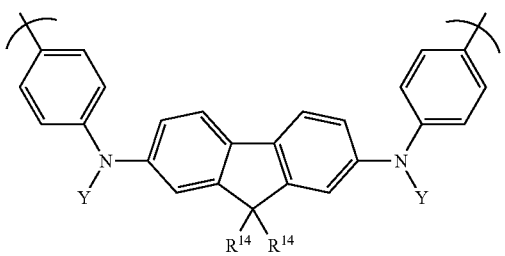

[in the formula [6]-1, $R^{14}$ represents an unsubstituted or substituted alkyl group, an unsubstituted or substituted aryl group or an unsubstituted or substituted monovalent heterocyclic group. Two moieties of $R^{14}$ may be the same or different. Y has the same meaning as described above, and two moieties of Y may be the same or different. The repeating unit represented by the formula [6]-1 may be nucleus-substituted.]

, repeating units represented by the following formula [6]-2:

[6]-2

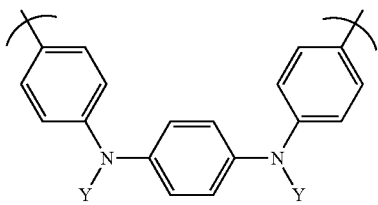

[in the formula [6]-2, Y has the same meaning as described above, and two moieties of Y may be the same or different. The repeating unit represented by the formula [6]-2 may be nucleus-substituted.]

and repeating units represented by the following formula [6]-3:

[6]-3

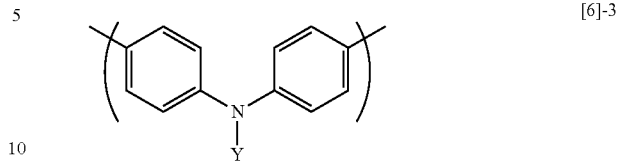

[in the formula [6]-3, Y has the same meaning as described above. The repeating unit represented by the formula [6]-3 may be nucleus-substituted.]

are preferable, from the standpoint of easiness of synthesis.

When the repeating unit represented by the above-described formulae [6]-1 to [6]-3 is nucleus-substituted, the substituent which can be carried on is the same as the substituent which can be carried on the group represented by the above-described formula (A).

As the above-described repeating unit A, repeating units represented by the following formula [7] are preferable, from the standpoint of easiness of synthesis of a crosslinkable polymer compound:

[7]

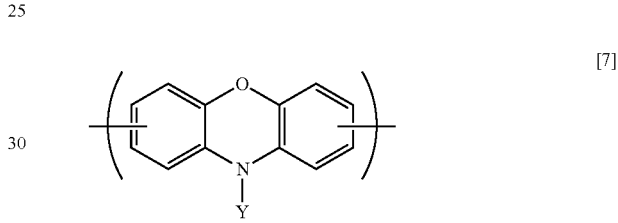

[in the formula [7], Y has the same meaning as described above. The repeating unit represented by the formula [7] may be nucleus-substituted.].

When the repeating unit represented by the above-described formula [7] is nucleus-substituted, the substituent which can be carried on is the same as the substituent which can be carried on the group represented by the above-described formula (A).

The repeating unit represented by the above-described formula [7] is particularly preferably a divalent group represented by the following formula [7]-1, from the standpoint of easiness of synthesis of a crosslinkable polymer compound:

(K)-1

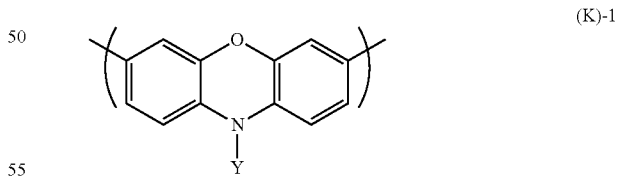

[in the formula [7]-1, Y has the same meaning as described above. The repeating unit represented by the formula [7]-1 may be nucleus-substituted.].

When the repeating unit represented by the above-described formula [7]-1 is nucleus-substituted, the substituent which can be carried on is the same as the substituent which can be carried on the group represented by the above-described formula (A).

As the above-described repeating unit A, repeating units represented by the following formulae ($Ar^{12}$-1) to ($Ar^{12}$-25) are particularly preferable.

(Ar12-1) 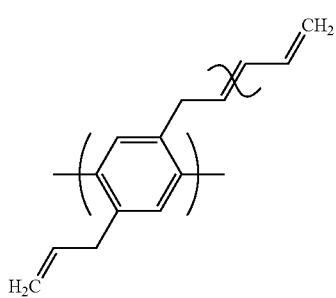
(Ar12-2) 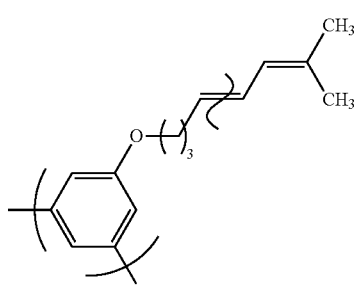
(Ar12-3) 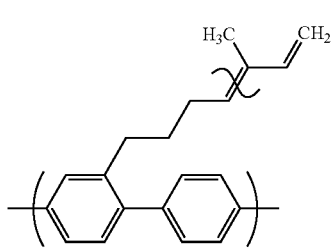
(Ar12-4) 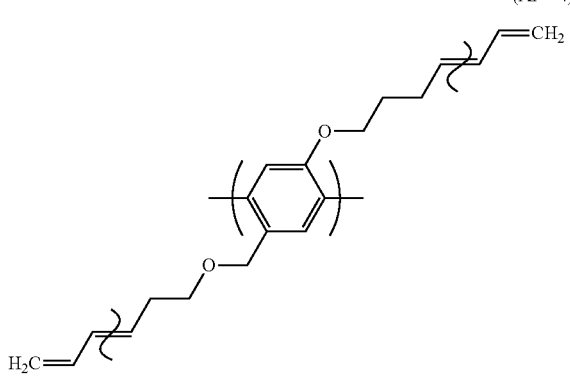
(Ar12-5) 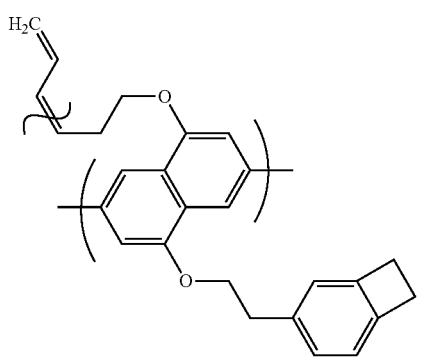
(Ar12-6) 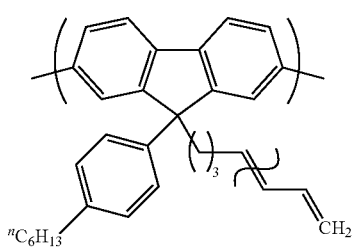
(Ar12-7) 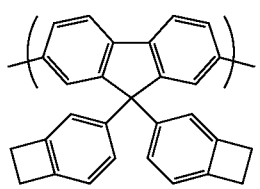
(Ar12-8) 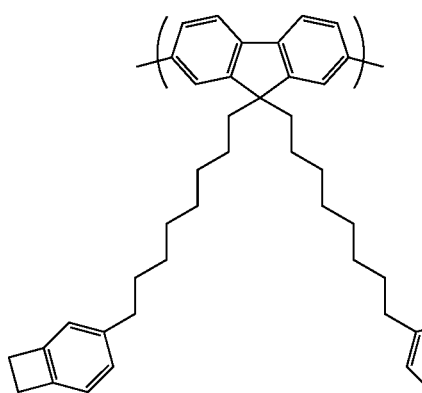

-continued
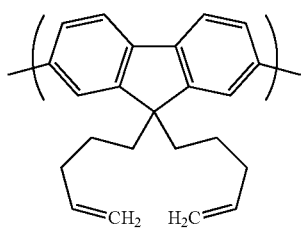
(Ar¹²-9)
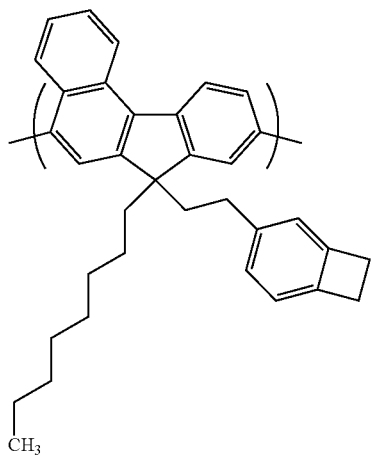
(Ar¹²-10)
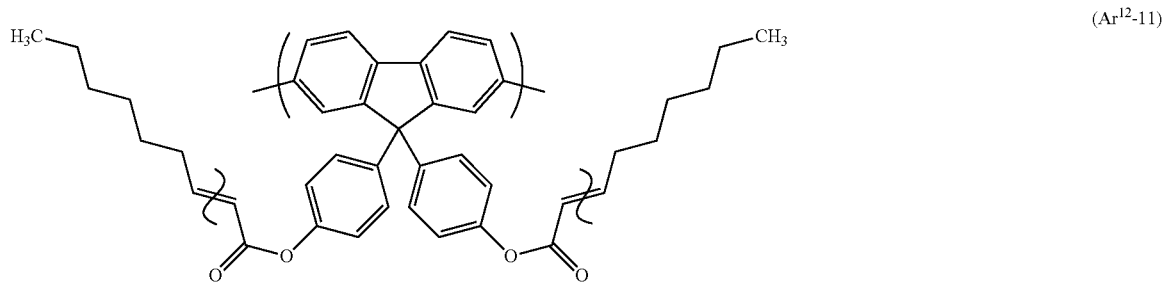
(Ar¹²-11)
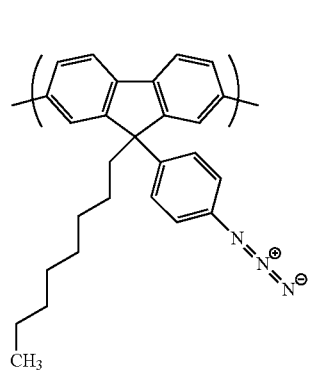
(Ar¹²-12)
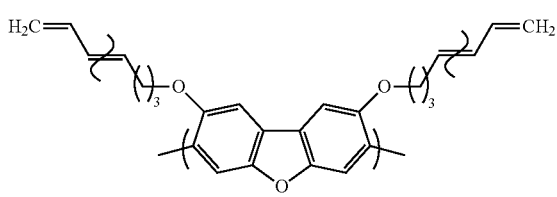
(Ar¹²-13)
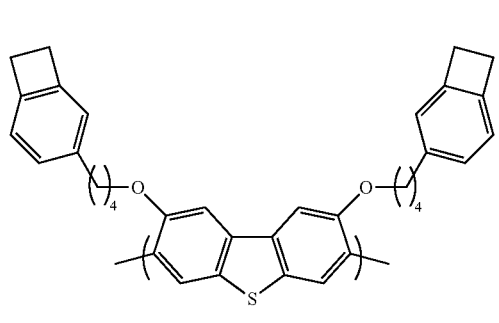
(Ar¹²-14)
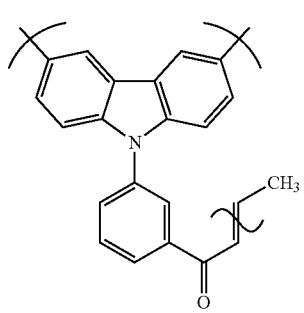
(Ar¹²-15)

-continued
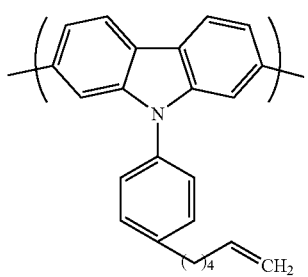
(Ar-12-16)
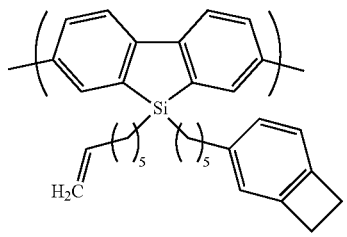
(Ar-12-17)
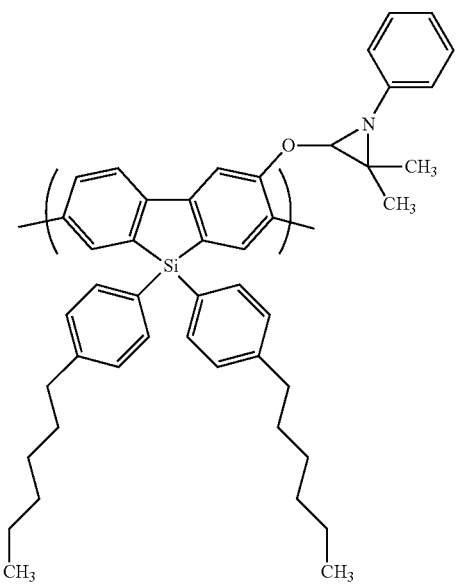
(Ar-12-18)
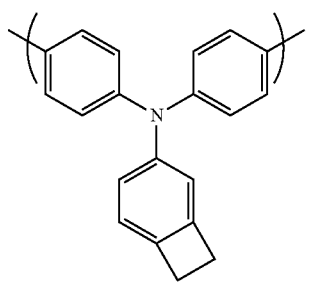
(Ar-12-19)
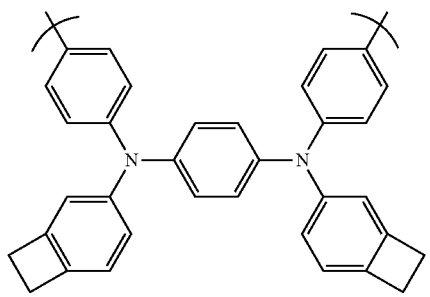
(Ar-12-20)
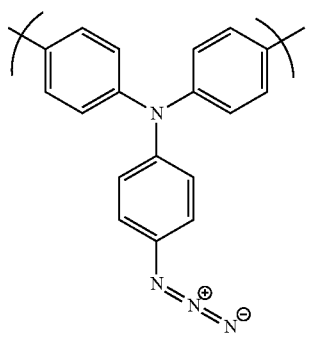
(Ar-12-21)
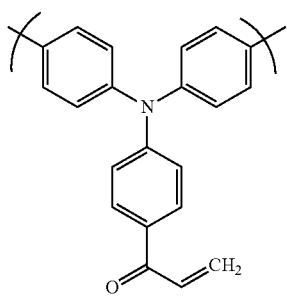
(Ar12-22)
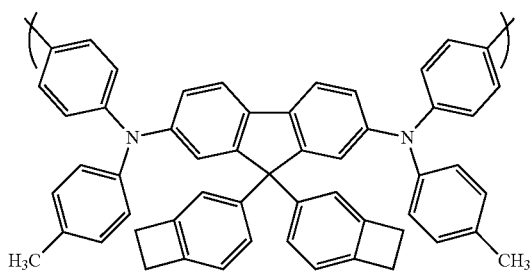
(Ar12-23)

(Ar¹²-24) 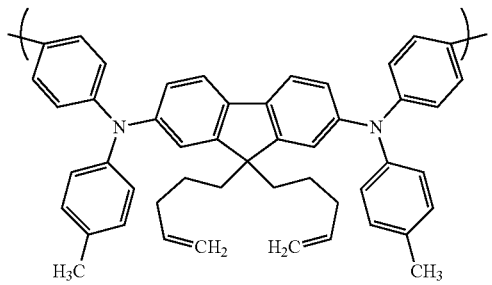

(Ar¹²-25) 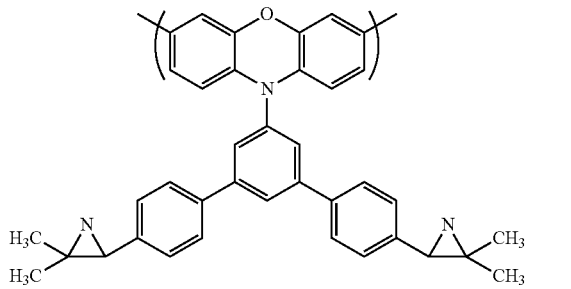

When the composition of the present invention is used for a hole transporting layer, it is preferable to contain a repeating unit represented by the above-described formulae (C), (E), (F), [5], [6] and [7] and it is particularly preferable to contain a repeating unit represented by the above-described formulae (C)-2, (E)-1 to (E)-4, [5]-2, [6]-1 to [6]-3 and [7]-1, from the standpoint of the hole transportability of the hole transporting layer.

When the composition of the present invention is used for an electron transporting layer, it is preferable to contain a repeating unit represented by the above-described formula (A), (B), (C), (D), [3], [4] or [5] and it is more preferable to contain a repeating unit represented by the above-described formula (A)-1, (B)-1, (C)-1, (D), [3]-1, [4]-1 or [5]-1, from the standpoint of the electron transportability of the electron transporting layer.

When the composition of the present invention is used for a light emitting layer, it is preferable to contain a repeating unit represented by the above-described formula (E), (F), [6] or [7], it is more preferable to contain a repeating unit represented by the above-described formula (E)-1 to (E)-5, (F)-1, [6]-1 to [6]-3 or [7]-1 and it is particularly preferable to contain a repeating unit represented by the above-described formula (E)-5, (F)-1 or [7]-1, from the standpoint of the light emitting property of the light emitting layer. Here, when the composition of the present invention is used for a light emitting layer, it is preferable that the above-described crosslinkable polymer compound is excellent in hole transportability and electron transportability.

Relation Between First Crosslinkable Polymer Compound and Second Crosslinkable Polymer Compound In the above-described crosslinkable polymer compound, the upper limit of the proportion of the repeating unit A is usually 100 mol %, preferably 50 mol %, more preferably 30 mol % and particularly preferably 15 mol % with respect to all repeating units, from the standpoint of safety, and the lower limit of the proportion of the repeating unit A is usually 1 mol %, preferably 2 mol % and more preferably 5 mol % with respect to all repeating units, from the standpoint of the efficiency of a crosslinking reaction of the composition of the present invention.

The above-described crosslinkable polymer compound has a polystyrene-equivalent number-average molecular weight of preferably $1\times10^3$ to $1\times10^8$, more preferably $1\times10^3$ to $1\times10^7$, further preferably $1\times10^4$ to $1\times10^7$, from the standpoint of the life property of a light emitting device in the case of use for fabrication of the light emitting device.

The above-described crosslinkable polymer compound has a polystyrene-equivalent weight-average molecular weight of preferably $1\times10^3$ to $1\times10^8$, more preferably $1\times10^4$ to $1\times10^7$, particularly preferably $1\times10^5$ to $1\times10^7$, from the standpoint of curability.

The above-described crosslinkable polymer compound may be any of a homopolymer, an alternative copolymer, a random copolymer, a block copolymer and a graft copolymer, or may also be a polymer compound having an intermediate structure thereof, for example, a random copolymer having a block property. From the standpoint of fluorescent or phosphorescent quantum yield, a random copolymer having a block property, a block copolymer and a graft copolymer are more preferable than the complete random copolymer, as the crosslinkable polymer compound. The crosslinkable polymer compound includes also polymer compounds having a branch in the main chain and thus having three or more end parts, and dendrimers.

It is preferable that the end group of the above-described crosslinkable polymer compound is protected by a stable group since if the end group is a polymerization active group, the light emitting property and the life of a light emitting device lower in some cases when used for fabrication of the light emitting device. When the above-described crosslinkable polymer compound has a conjugated structure, a group having a conjugated bond consecutive to the conjugated structure of the main chain is preferable as the above-described end group, and such a group includes groups having a linkage to an aryl group or a monovalent heterocyclic group via a carbon-carbon bond, and substituents described in JP-A No. 9-45478, chemical formula 10.

The above-described crosslinkable polymer compound includes the following polymer compounds. In the formulae, v, w, x, y and z represent the composition ratio (molar ratio).

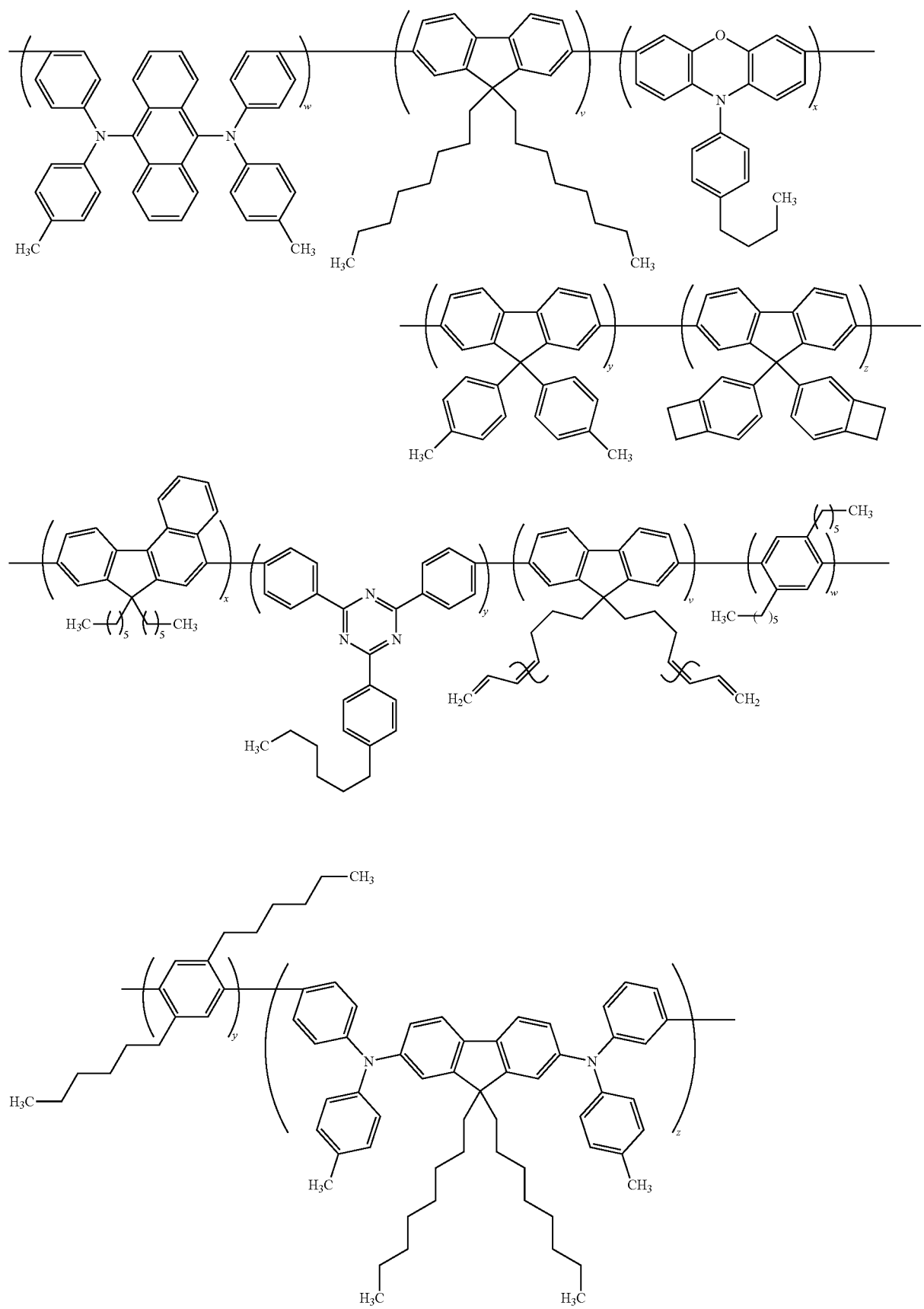

-continued
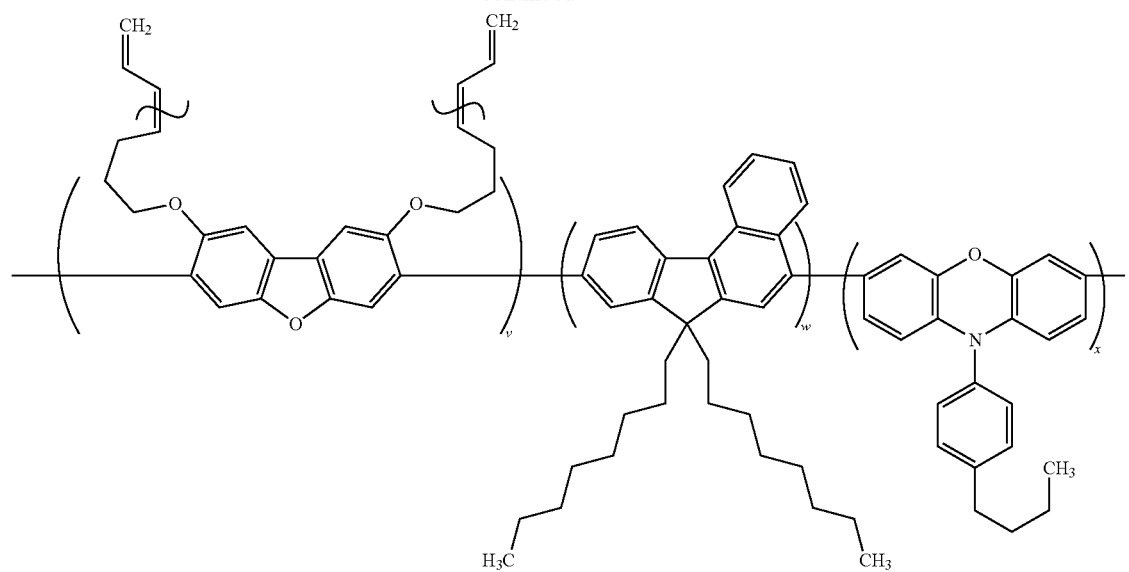
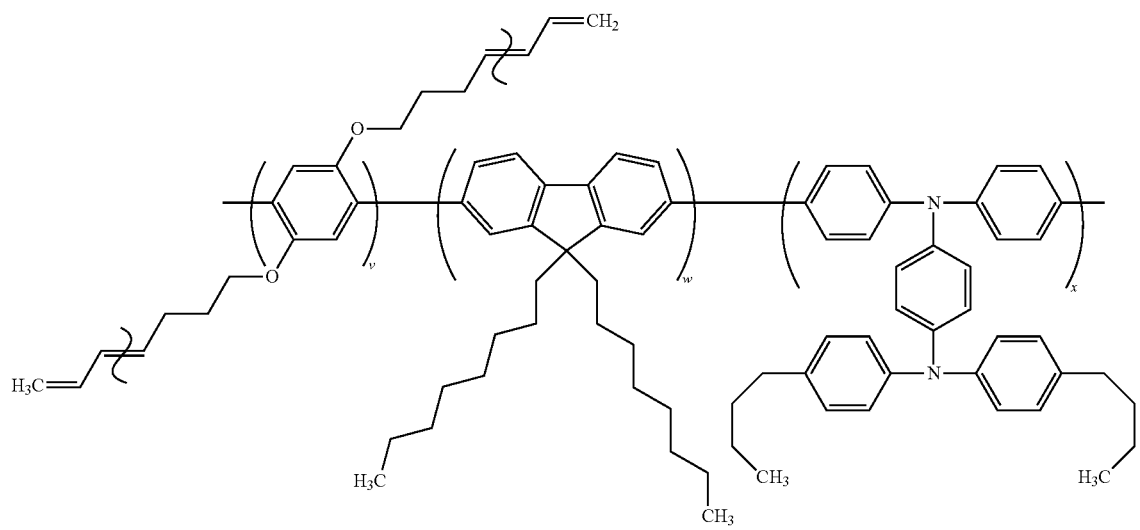
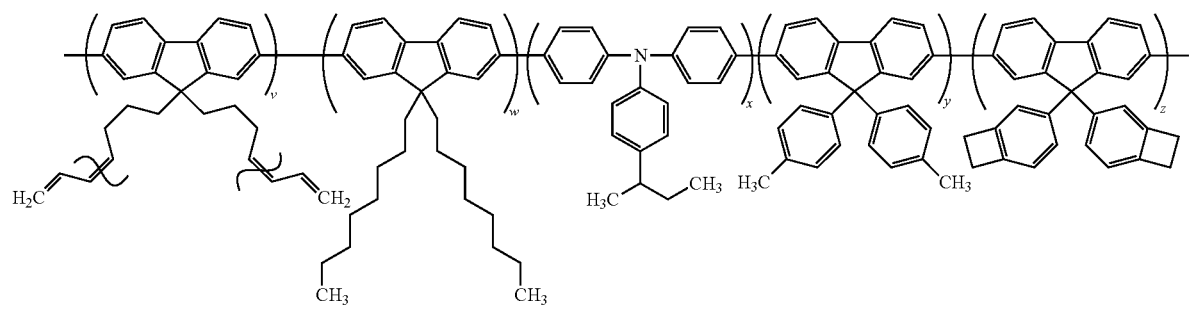

-continued
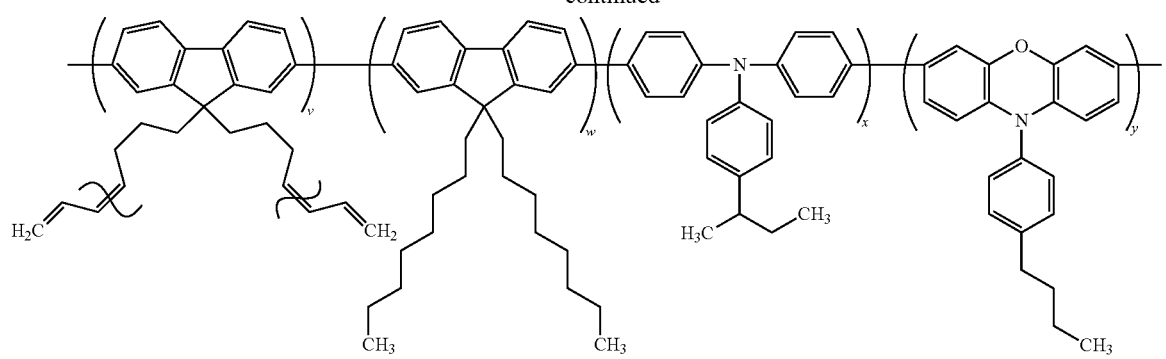
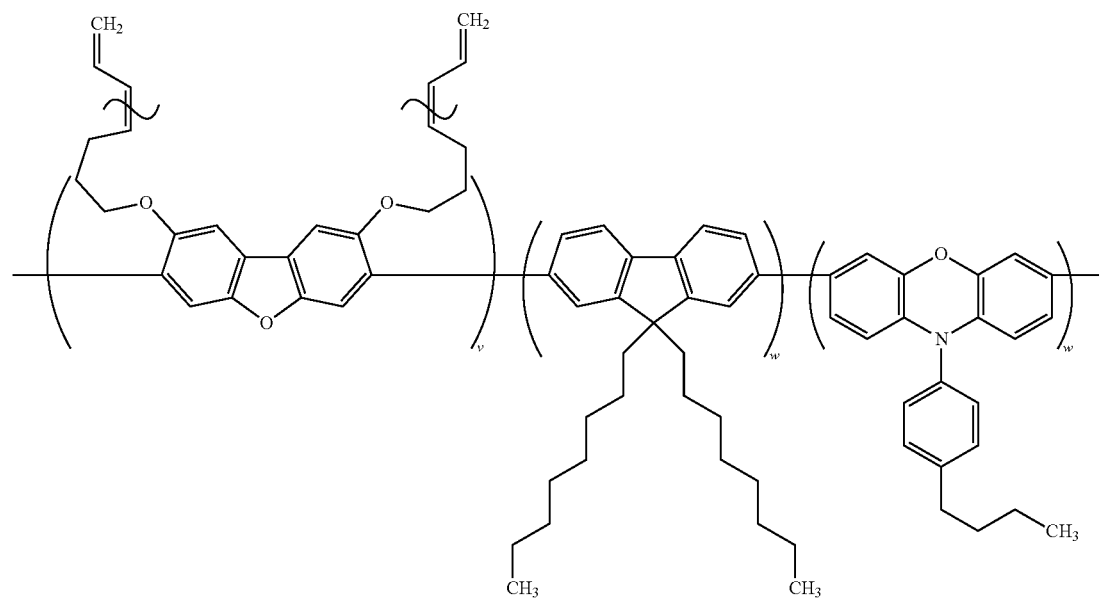
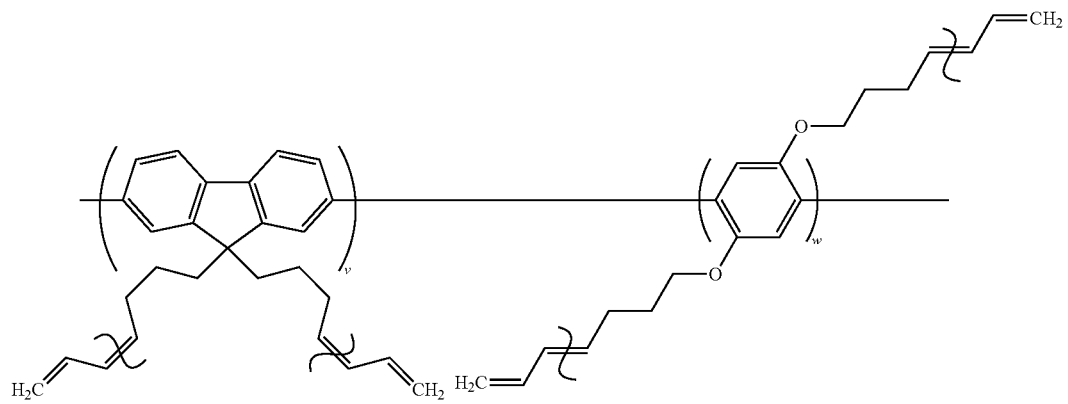

-continued
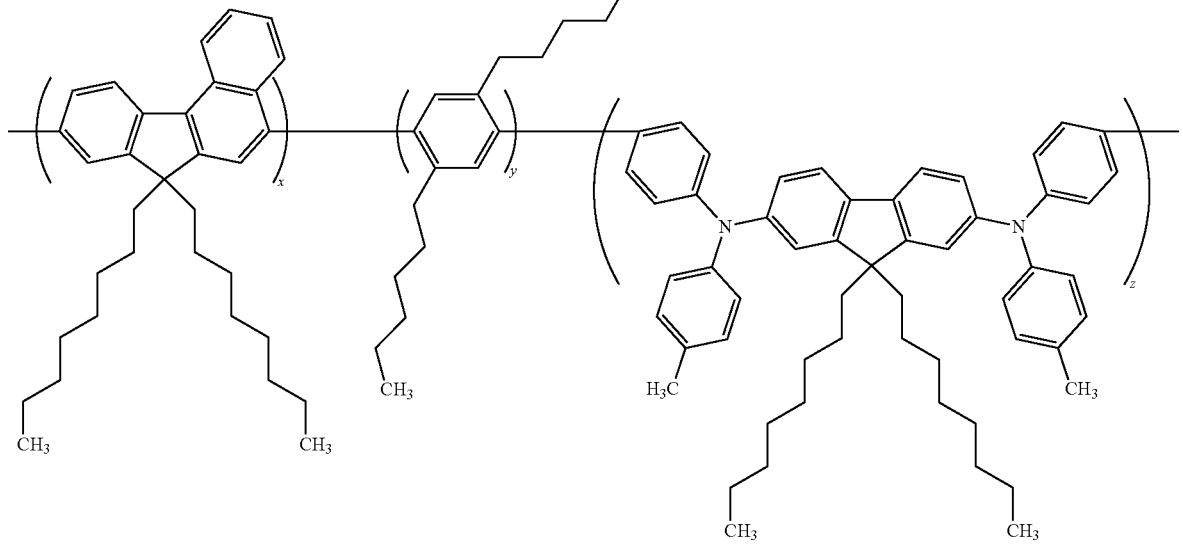
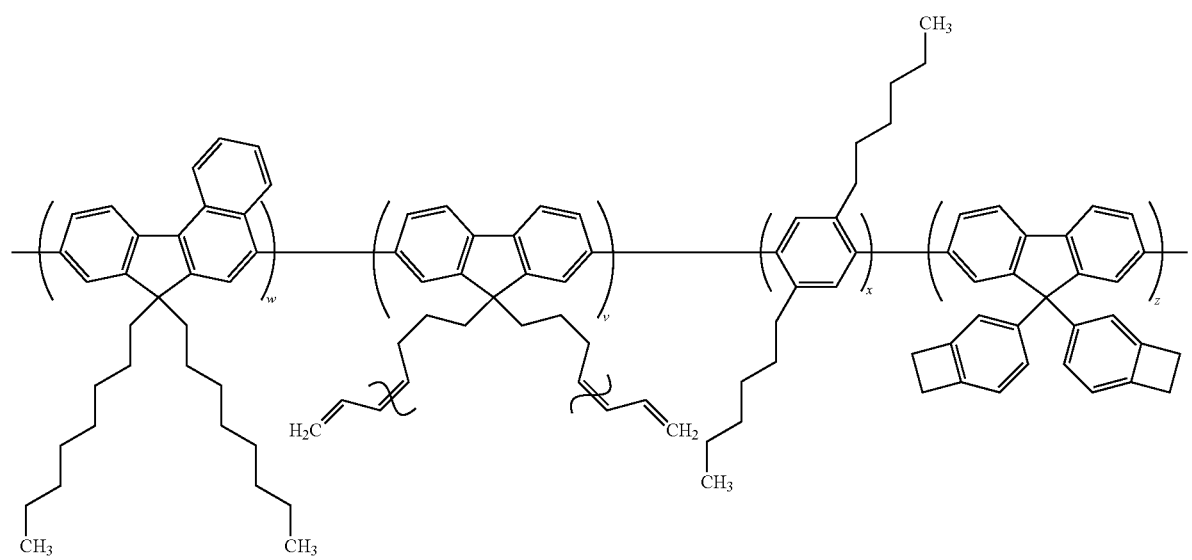
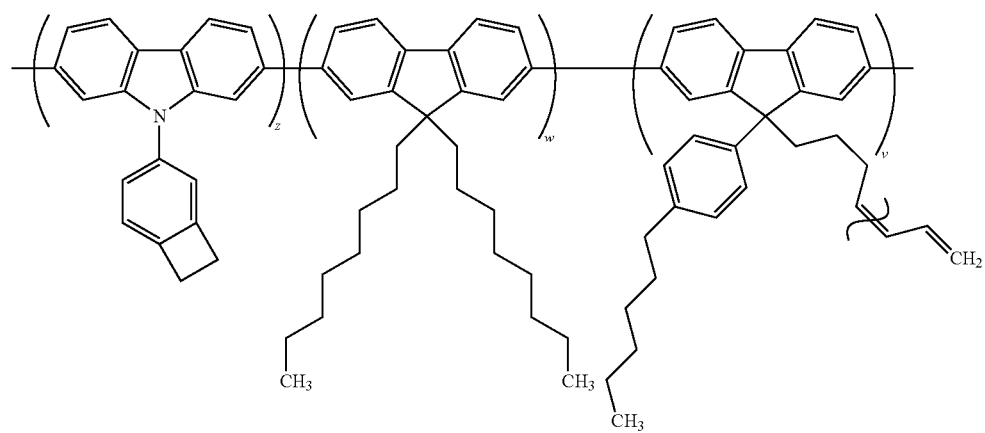

-continued
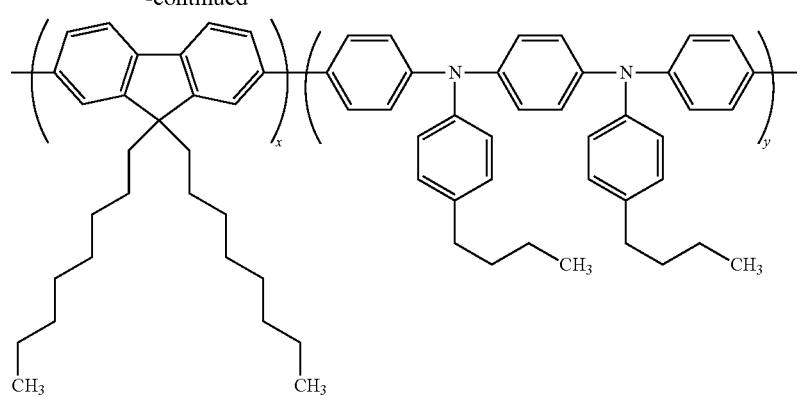
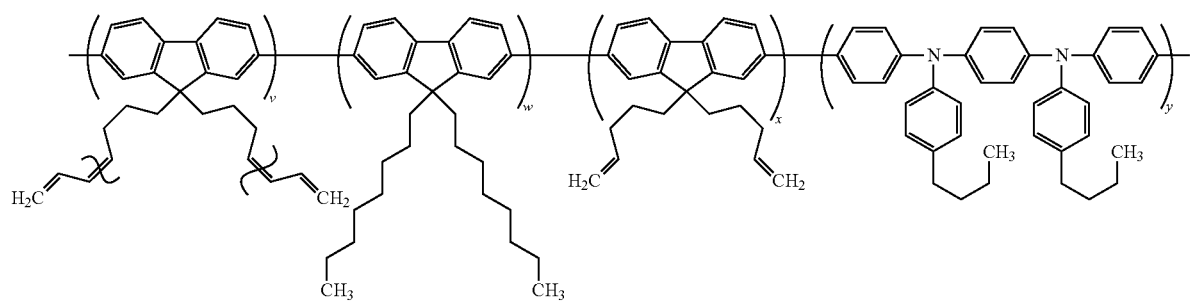
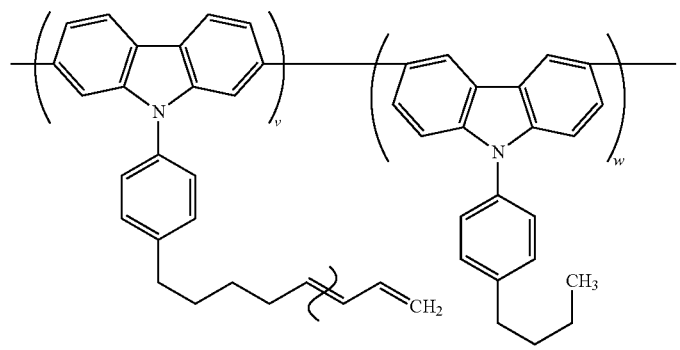
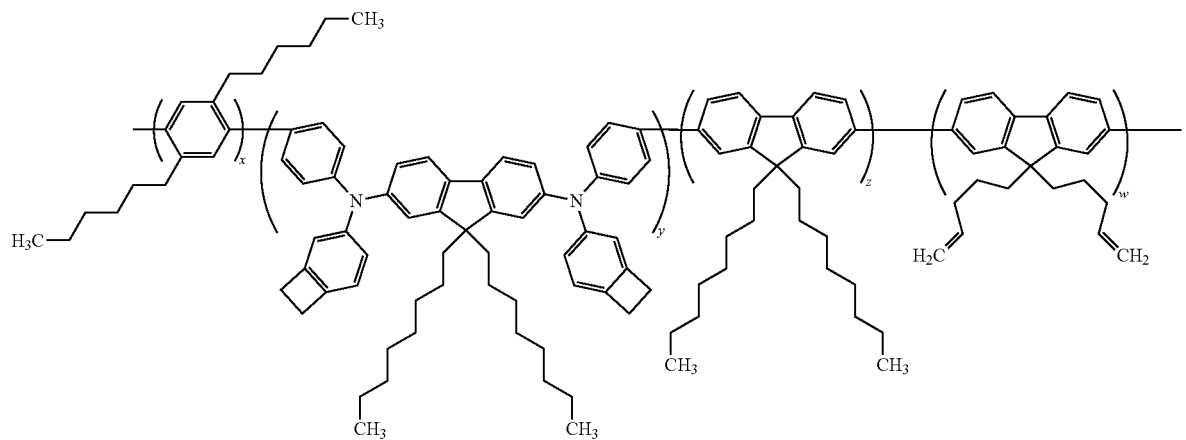

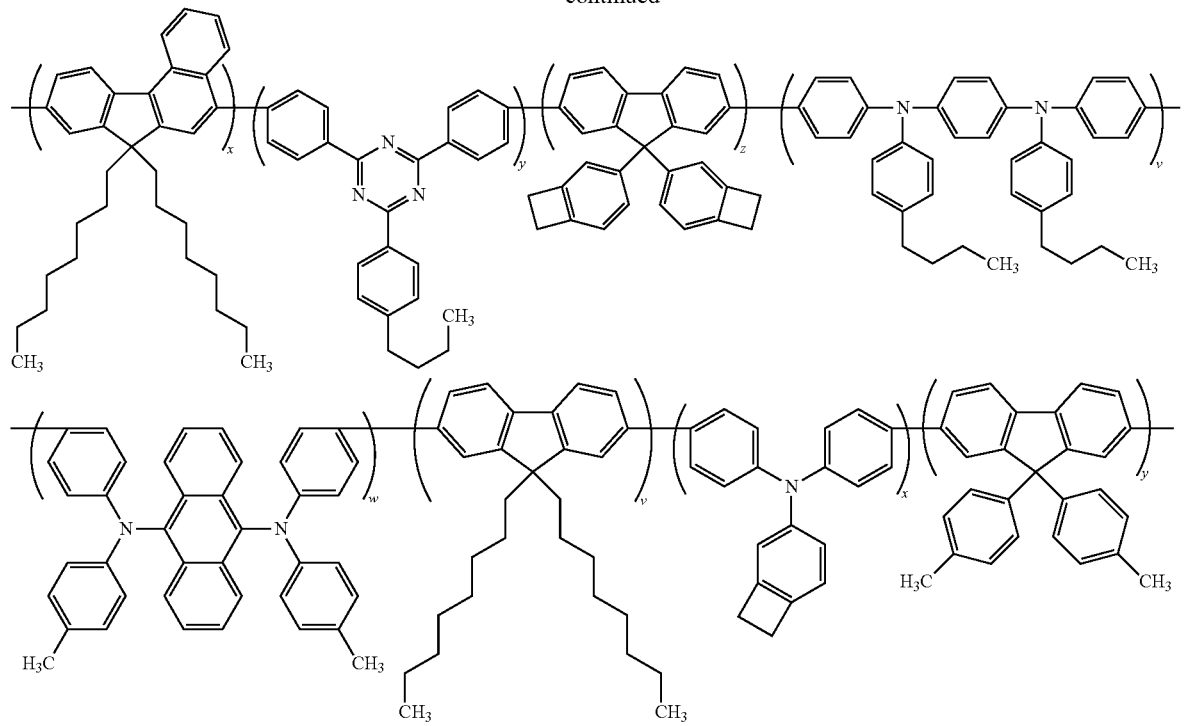

-continued

The polymer compounds exemplified above may be any of an alternative copolymer, a random copolymer, a block copolymer or a graft copolymer.

The composition of the present invention includes preferably a composition in which the above-described first crosslinkable polymer compound is a polymer compound having a crosslinkable group represented by any of the above-described formulae (Z-1) to (Z-4) and the above-described second crosslinkable polymer compound is a polymer compound having a crosslinkable group represented by any of the above-described formulae (Z-4) to (Z-10) and an aromatic conjugated repeating unit different from the aromatic conjugated repeating unit in the above-described first crosslinkable polymer compound (first suitable composition);

a composition in which the above-described second crosslinkable polymer compound is a polymer compound having an aromatic conjugated repeating unit and a crosslinkable group different from the crosslinkable group in the above-described first crosslinkable polymer compound (second suitable composition); and a composition in which the above-described second crosslinkable polymer compound is a polymer compound having an aromatic conjugated repeating unit different from the aromatic conjugated repeating unit in the above-described first crosslinkable polymer compound and a crosslinkable group different from the crosslinkable group in the above-described first crosslinkable polymer compound (third suitable composition).

As the second suitable composition and the third suitable composition, compositions in which the crosslinkable group in the above-described first crosslinkable polymer compound is a group represented by any of the above-described formulae (Z-1) to (Z-4) and the crosslinkable group in the above-described second crosslinkable polymer compound is a group represented by any of the above-described formulae (Z-4) to (Z-10) are more preferable.

In the first suitable composition, it is preferable that the crosslinkable group in the first crosslinkable polymer compound is a group represented by the above-described formula (Z-3) or (Z-4) and the crosslinkable group in the second crosslinkable polymer compound is a group represented by any of the above-described formulae (Z-4) to (Z-10), it is more preferable that the crosslinkable group in the first crosslinkable polymer compound is a group represented by the above-described formula (Z-3) or (Z-4) and the crosslinkable group in the second crosslinkable polymer compound is a group represented by any of the above-described formulae (Z-4) to (Z-6), and it is particularly preferable that the crosslinkable group in the first crosslinkable polymer compound is a group represented by the above-described formula (Z-3) or (Z-4) and the group in the second crosslinkable polymer compound is a group represented by the above-described formula (Z-4) or (Z-5), since a high crosslinkage ratio can be obtained in a short period of time even in a low temperature region.

In the second and third suitable compositions, it is preferable that the crosslinkable group in the first crosslinkable polymer compound is a group represented by the above-described formula (Z-3) or (Z-4) and the crosslinkable group in the second crosslinkable polymer compound is a group represented by any of the above-described formulae (Z-4) to (Z-6) and (Z-8) to (Z-10) and different from the crosslinkable group in the first crosslinkable polymer compound, it is more preferable that the crosslinkable group in the first crosslinkable polymer compound is a group represented by the above-described formula (Z-3) or (Z-4) and the crosslinkable group in the second crosslinkable polymer compound is a group represented by any of the above-described formulae (Z-4) to (Z-6), and it is particularly preferable that the crosslinkable group in the first crosslinkable polymer compound is a group represented by the above-described formula (Z-3) or (Z-4) and the group in the second crosslinkable polymer compound is a group represented by the above-described formula (Z-4) or (Z-5), since a high crosslinkage ratio can be obtained in a short period of time even in a low temperature region.

In the composition of the present invention, it is preferable that at least one of the above-described first crosslinkable polymer compound and the above-described second crosslinkable polymer compound has hole transportability, and from the standpoint of the hole transportability of a hole transporting layer, it is further preferable that both the above-described first crosslinkable polymer compound and the above-described second crosslinkable polymer compound have hole transportability.

In the composition of the present invention, it is preferable that at least one of the above-described first crosslinkable polymer compound and the above-described second crosslinkable polymer compound has electron transportability, and from the standpoint of the electron transportability of an electron transporting layer, it is further preferable that both the above-described first crosslinkable polymer compound and the above-described second crosslinkable polymer compound have electron transportability.

In the composition of the present invention, it is preferable that at least one of the above-described first crosslinkable polymer compound and the above-described second crosslinkable polymer compound has a light emitting property and charge transportability, and from the standpoint of the light emitting property of a light emitting layer, it is further preferable that both the above-described first crosslinkable polymer compound and the above-described second crosslinkable polymer compound have a light emitting property and charge transportability and it is particularly preferable that both the above-described first crosslinkable polymer compound and the above-described second crosslinkable polymer compound have a light emitting property and hole transportability.

In the composition of the present invention, the weight ratio of the above-described first crosslinkable polymer compound to the above-described second crosslinkable polymer compound is preferably 99:1 to 1:99 (namely, 99/1 to 1/99), more preferably 70:30 to 30:70, particularly preferably 60:40 to 40:60, from the standpoint of the reactivity of a crosslinking reaction.

When the composition of the present invention is a composition containing three or more crosslinkable polymer compounds, the weight ratio of any two crosslinkable polymer compounds is preferably 99:1 to 1:99, more preferably 70:30 to 30:70 and particularly preferably 60:40 to 40:60, from the standpoint of the reactivity of a crosslinking reaction.

In the composition of the present invention, the total amount of the above-described crosslinkable groups contained in one gram of the composition is preferably $2.0 \times 10^{-5}$ to $1.0 \times 10^{-2}$ mol, more preferably $2.0 \times 10^{-4}$ to $1.0 \times 10^{-3}$ mol and particularly preferably $2.0 \times 10^{-4}$ to $6.0 \times 10^{-4}$ mol, from the standpoint of charge transportability.

In the composition of the present invention, the total content of the above-described first crosslinkable polymer compound and the above-described second crosslinkable polymer compound is preferably 80 wt % or more and more preferably 85 to 99.9 wt %, with respect to the weight of the composition excluding the solvent, from the standpoint of manifesting excellent charge transportability and/or light emitting property.

Other Components

The composition of the present invention is capable of further containing a solvent (hereinafter, a composition containing a solvent is referred to as "liquid composition" in some cases).

The composition of the present invention is useful for fabrication of light emitting devices and organic transistors. The liquid composition of the present invention is in the liquid state in fabricating a device, and typically in the liquid state under normal pressure (that is, 1 atm) at 25° C.

The composition of the present invention may contain a low molecular weight light emitting material, a hole transporting material, an electron transporting material, an additive for regulating viscosity and/or surface tension, an antioxidant and the like. These optional components may each be used singly or in combination.

When the composition of the present invention contains an optional component, the proportion of the crosslinkable polymer compound is usually 80 to 99.9 wt %, preferably 85 to 99.9 wt % with respect to the weight of the composition excluding the solvent, from the standpoint of manifesting excellent charge transportability and/or light emitting property.

The above-described low molecular weight light emitting material includes naphthalene derivatives, anthracene, anthracene derivatives, perylene, perylene derivatives, polymethine dyes, xanthene dyes, coumarin dyes, cyanine dyes, metal complexes having a 8-hydroxyquinoline metal complex as a ligand, metal complexes having a 8-hydroxyquinoline derivative as a ligand, other fluorescent metal complexes; phosphorescent metal complexes such as iridium complexes, platinum complexes and the like; phosphorescent metal complexes having a phenylpyridine derivative, a phenylisoquinoline derivative, a 2,2'-bipyridine derivative or the like as a ligand; fluorescent materials of low molecular weight compounds such as aromatic amines, tetraphenylcyclopentadiene, tetraphenylcyclopentadiene derivatives, tetraphenylcyclobutadiene, tetraphenylcyclobutadiene derivatives, stilbene compounds, silicon-containing aromatic compounds, oxazole compounds, furoxan compounds, thiazole compounds, tetraarylmethane compounds, thiadiazole compounds, pyrazole compounds, metacyclophane compounds, acetylene compounds and the like, and includes also materials described in JP-A No. 57-51781, JP-A No. 59-194393 and the like.

The above-described hole transporting material includes polyvinylcarbazole and derivatives thereof, polysilane and derivatives thereof, polysiloxane derivatives having an aromatic amine in the side chain or the main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof and the like.

The above-described electron transporting material includes oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof and the like.

As the above-described additive for regulating viscosity and/or surface tension, a high molecular weight compound (thickening agent) or a poor solvent for enhancing viscosity, a low molecular weight compound for lowering viscosity, a surfactant for lowering surface tension, and the like may be used, if necessary in combination.

The above-described high molecular weight compound may advantageously be one which does not disturb light emission and charge transportation, and usually a compound soluble in a solvent which the composition can contain. As the high molecular weight compound, use can be made of high molecular weight polystyrene, high molecular weight polymethyl methacrylate and the like. The above-described high molecular weight compound has a polystyrene-equivalent weight-average molecular weight of preferably 500000 or more, more preferably 1000000 or more. It is also possible to use a poor solvent as a thickening agent.

The above-described antioxidant may advantageously be one which does not disturb light emission and charge transportation, and when the composition contains a solvent, the antioxidant is usually a compound soluble in the solvent. The antioxidant includes phenol antioxidants, phosphorus-based antioxidants and the like. By use of the antioxidant, the storage stability of the above-described composition and the solvent can be improved.

When the composition of the present invention contains a hole transporting material, the proportion of the hole transporting material in the liquid composition is usually 1 to 80 wt %, preferably 5 to 60 wt %.

When the composition of the present invention contains an electron transporting material, the proportion of the electron transporting material in the liquid composition is usually 1 to 80 wt %, preferably 5 to 60 wt %.

In fabricating a light emitting device using the liquid composition of the present invention, a solvent has only to be removed by drying after coating of the composition of the present invention, and this is advantageous for production since the same method can be applied also in the case of mixing of a charge transporting material and a light emitting material. Drying may be performed under condition of heating at about 50 to 150° C., or drying may be performed under a reduced pressure of about $10^{-3}$ Pa.

For film formation using the composition of the present invention, coating methods such as a spin coat method, a casting method, a micro gravure coat method, a gravure coat method, a bar coat method, a roll coat method, a wire bar coat method, a dip coat method, a slit coat method, a cap coat method, a capillary coat method, a spray coat method, a screen printing method, a flexo printing method, an offset printing method, an inkjet print method, a nozzle coat method and the like can be used.

The proportion of a solvent in the liquid composition of the present invention is usually 1 to 99.9 wt %, preferably 60 to 99.9 wt %, more preferably 90 to 99.5 wt % with respect to the total weight of the liquid composition.

The viscosity of the liquid composition varies depending on the printing method, and is preferably 0.5 to 500 mPa·s at 25° C., and when the liquid composition passes through a discharge apparatus such as in an inkjet print method and the like, the viscosity is preferably 0.5 to 20 mPa·s at 25° C. for preventing curved flying and clogging in discharging.

As the solvent contained in the liquid composition, those capable of dissolving or dispersing components other than the solvent in the liquid composition are preferable. The solvent includes chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethyl cellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, and amide solvents such as N-methyl-2-pyrrolidone, N,N-dimethylformamide and the like. These solvents may be used singly or in combination. Of the above-described solvents, at least one organic solvent having a structure containing at least one benzene ring and having a melting point of 0° C. or lower and a boiling point of 100° C. or higher is preferably contained, from the standpoint of viscosity, film formability and the like. From the standpoint of the solubility of components other than the solvent in the liquid composition in an organic solvent, uniformity in film formation, a viscosity property and the like, the solvent includes preferably aromatic hydrocarbon solvents, aliphatic hydrocarbon solvents, ester solvents and ketone solvents, and preferable are toluene, xylene, ethylbenzene, diethylbenzene, trimethylbenzene, mesitylene, n-propylbenzene, isopropylbenzene, n-butylbenzene, isobutylbenzene, sec-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone and dicyclohexylketone, and it is more preferable that at least one of xylene, anisole, mesitylene, cyclohexylbenzene and bicyclohexyl methyl benzoate is contained.

The number of the kind of the solvent contained in the liquid composition is preferably two or more, more preferably two to three, particularly preferably two, from the standpoint of film formability and from the standpoint of device properties and the like.

When two solvents are contained in the liquid composition, one of them may be in the solid state at 25° C. From the standpoint of film formability, it is preferable that one solvent has a boiling point of 180° C. or higher and the other solvent has a boiling point of lower than 180° C., it is more preferable that one solvent has a boiling point of 200° C. or higher and the other solvent has a boiling point of lower than 180° C. From the standpoint of viscosity, it is preferable that components of the liquid composition excluding the solvent are dissolved at a concentration of 0.2 wt % or more in solvents at 60° C., and it is preferable that components of the liquid composition excluding the solvent are dissolved at a concentration of 0.2 wt % or more in one of two solvents at 25° C.

When three solvents are contained in the liquid composition, one to two solvents among them may be in the solid state at 25° C. From the standpoint of film formability, it is preferable that at least one of three solvents has a boiling point of 180° C. or higher and at least one of them has a boiling point of lower than 180° C., it is more preferable that at least one of three solvents has a boiling point of 200 to 300° C. and at least one of them has a boiling point of lower than 180° C. From the standpoint of viscosity, it is preferable that components of the liquid composition excluding the solvent are dissolved at a concentration of 0.2 wt % or more in two of three solvents at 60° C., and it is preferable that components of the liquid composition excluding the solvent are dissolved at a concentration of 0.2 wt % or more in one of three solvents at 25° C.

When two or more solvents are contained in the liquid composition, the amount of a solvent having the highest boiling point is preferably 40 to 90 wt %, more preferably 50 to 90 wt % and further preferably 65 to 85 wt % with respect to the total weight of all solvents contained in the liquid composition, from the standpoint of viscosity and film formability.

<Film>

The film of the present invention is composed of the composition of the present invention. The film includes luminous films, electric conductive films, organic semiconductor films and the like.

The first embodiment of the film of the present invention is a film in which a first crosslinkable polymer compound and a second crosslinkable polymer compound contained in the composition of the present invention are retained. The second embodiment of the film of the present invention is a film in which a first crosslinkable polymer compound and a second crosslinkable polymer compound contained in the composition of the present invention are crosslinked.

In the second embodiment of the film of the present invention, the above-described crosslinkage can be performed by an external stimulus such as heat, light and the like, and a film may be formed while crosslinking a first crosslinkable polymer compound and a second crosslinkable polymer compound, or a film may be formed before crosslinkage thereof.

When the composition and the film of the present invention are cross-linked by heat, the heating temperature is usually from room temperature to 300° C. The upper limit of the heating temperature is preferably 250° C., further preferably 190° C. and particularly preferably 170° C., from the standpoint of easiness of fabrication of a film, and the lower limit of the heating temperature is preferably 50° C., further preferably 70° C. and particularly preferably 100° C., from the standpoint of easiness of handling of the composition at room temperature. The crosslinkage proportion can be regulated by the heating temperature and the heating time.

When the composition and the film of the present invention are cross-linked by light, the irradiation light includes preferably an ultraviolet ray, a near ultraviolet ray and a visible ray, more preferably an ultraviolet ray and a near ultraviolet ray. The crosslinkage proportion and the crosslinking speed can be regulated by the exposure wavelength and the irradiation time.

The luminous film shows a quantum yield of light emission of preferably 50% or more, more preferably 60% or more and further preferably 70% or more, from the standpoint of the device luminance, the light emission voltage and the like.

The electric conductive film has a surface resistance of preferably 1 KΩ/□ or less. By doping the film with a Lewis acid, an ionic compound or the like, the electric conductivity can be enhanced. The surface resistance is more preferably 100Ω/□ or less, further preferably 10Ω/□ or less.

For the organic semiconductor film, either larger one of electron mobility or hole mobility is preferably $10^{-5}$ cm$^2$/V/s or more, more preferably $10^{-3}$ cm$^2$/V/s or more, further preferably $10^{-1}$ cm$^2$/V/s or more. An organic transistor can be fabricated using the organic semiconductor film. Specifically, an insulation film made of $SiO_2$ and the like and a gate electrode are formed on a Si substrate, then, an organic semiconductor film is formed on the Si substrate, and a source electrode and a drain electrode are formed with Au or the like, thereby, an organic transistor can be obtained.

<Organic Transistor>

The organic transistor of the present invention is an organic transistor composed of the composition of the present invention. An electric field effect transistor which is one embodiment of the organic transistor will be illustrated below.

The composition of the present invention can be used suitably as the material of an electric field effect transistor, especially, as an active layer. Regarding the structure of an electric field effect transistor, it may be usually permissible that a source electrode and a drain electrode are disposed in contact with an active layer composed of the composition of the present invention, further, a gate electrode is disposed so as to sandwich an insulation layer in contact with the active layer.

The electric field effect transistor is usually formed on a supporting substrate. As the supporting substrate, use can be made of glass substrates and flexible film substrates and also plastic substrates.

The electric field effect transistor can be produced by known methods, for example, a method described in JP-A No. 5-110069.

In forming an active layer, it is advantageous and preferable to use the liquid composition of the present invention, from the standpoint of production. For film formation from the liquid composition of the present invention, coating methods can be used such as a spin coat method, a casting method, a micro gravure coat method, a gravure coat method, a bar coat method, a roll coat method, a wire bar coat method, a dip coat method, a slit coat method, a cap coat method, a capillary coat method, a spray coat method, a screen printing method, a flexo printing method, an offset printing method, an inkjet print method, a nozzle coat method and the like.

An encapsulated electric field effect transistor obtained by fabricating an electric field effect transistor and then encapsulating this is preferable. By this, an electric field effect transistor is blocked from atmospheric air and lowering of the property of an electric field effect transistor can be suppressed.

The encapsulation method includes a method of covering with an ultraviolet (UV) curable resin, a thermosetting resin or an inorganic SiONx film and the like, a method of pasting a glass plate or a film with an UV curable resin, a thermosetting resin and the like, and other methods. For effectively performing blocking from atmospheric air, it is preferable that a process from fabrication of an electric field effect transistor until encapsulation thereof is carried out without exposing to atmospheric air (for example, in a dried nitrogen atmosphere, or in vacuum).

<Organic Photoelectric Conversion Device>

The organic photoelectric conversion device of the present invention (for example, solar battery) is an organic photoelectric conversion device composed of the composition of the present invention.

The composition of the present invention is suitable as the material of an organic photoelectric conversion device, especially, as the material used in an organic semiconductor layer of a Schottky barrier type device utilizing an interface between an organic semiconductor and a metal, or as the material used in an organic semiconductor layer of a pn hetero-junction type device utilizing an interface between an organic semiconductor and an inorganic semiconductor or between organic semiconductors.

Further, the composition of the present invention can be suitably used as the electron donative material and the electron acceptive material in a bulk hetero-junction type device having an increased donor-acceptor contact area, or as the electron donative conjugated material (dispersion support) of an organic photoelectric conversion device using a polymer-low molecular weight composite system, for example, a bulk hetero-junction type organic photoelectric conversion device containing a fullerene derivative dispersed as an electron acceptor.

The structure of an organic photoelectric conversion device includes, for example, a structure in which a p-type semiconductor layer is formed on an ohmic electrode, for example, on ITO, further, an n-type semiconductor layer is laminated, and an ohmic electrode is disposed thereon, in the case of a pn hetero-junction type device.

The organic photoelectric conversion device is usually formed on a supporting substrate. As the supporting substrate, use can be made of a glass substrate, a flexible film substrate, a plastic substrate and the like.

The organic photoelectric conversion device can be produced by known methods, for example, a method described in Synth. Met., 102, 982 (1999) and a method described in Science, 270, 1789 (1995).

<Light Emitting Device>

Next, the light emitting device of the present invention will be illustrated.

The light emitting device of the present invention is a light emitting device having electrodes consisting of an anode and a cathode and a layer which is disposed between the electrodes and composed of the composition of the present invention in which, preferably, the layer is a light emitting layer or a charge transporting layer. The light emitting device of the present invention includes (1) a light emitting device in which an electron transporting layer is disposed between a cathode and a light emitting layer, (2) a light emitting device in which a hole transporting layer is disposed between an anode and a light emitting layer, (3) a light emitting device in which an electron transporting layer is disposed between a cathode and a light emitting layer and a hole transporting layer is disposed between an anode and a light emitting layer; and other light emitting devices.

Examples thereof include the following structures a) to d).
a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode
(here, "/" means adjacent lamination of layers. The same shall apply hereinafter.)

The above-described light emitting layer is a layer having a function of emitting light, the above-described hole transporting layer is a layer having a function of transporting holes, and the above-described electron transporting layer is a layer having a function of transporting electrons. The electron transporting layer and the hole transporting layer are collectively called a charge transporting layer. Two or more layers of the light emitting layer, two or more layers of the hole transporting layer and two or more layers of the electron transporting layer may be independently used, respectively. The hole transporting layer adjacent to the light emitting layer is called an interlayer layer in some cases.

The method of forming the light emitting layer includes methods of film formation from a solution. For film formation from a solution, coating methods such as a spin coat method, a casting method, a micro gravure coat method, a gravure coat method, a bar coat method, a roll coat method, a wire bar coat method, a dip coat method, a slit coat method, a cap coat method, a capillary coat method, a spray coat method, a screen printing method, a flexo printing method, an offset printing method, an inkjet print method, a nozzle coat method and the like can be used. This film formation from a solution is useful also for film formation of a hole transporting layer and an electron transporting layer described later.

In fabricating a light emitting device, a solvent has only to be removed by drying after coating using the liquid composition of the present invention, and this is advantageous for production since the same method can be applied also in the case of mixing of a charge transporting material and a light emitting material.

The thickness of the light emitting layer may be advantageously selected so as to give appropriate values of driving voltage and light emission efficiency, and is for example 1 nm to 1 µm, preferably 2 nm to 500 nm, further preferably 5 nm to 200 nm.

In the light emitting device of the present invention, also a light emitting material other than the composition of the present invention may be used in the light emitting layer. In the light emitting device of the present invention, the light emitting layer containing a light emitting material other than the composition of the present invention may be laminated with a light emitting layer composed of the composition of the present invention.

The light emitting material other than the composition of the present invention includes low molecular weight compounds such as naphthalene derivatives, anthracene and derivatives thereof, perylene and derivatives thereof, dyes such as polymethine dyes, xanthene dyes, coumarin dyes, cyanine dyes and the like, metal complexes of 8-hydroxyquinoline and derivatives thereof, aromatic amines, tetraphenylcyclopentadiene and derivatives thereof, tetraphenylbutadiene and derivatives thereof and the like, and also materials described in JP-A Nos. 57-51781 and 59-194393, and the like.

When the light emitting device of the present invention has a hole transporting layer, the hole transporting material to be used is the same as the above-described hole transporting material, and preferable are polymer hole transporting materials such as polyvinylcarbazole and derivatives thereof, polysilane and derivatives thereof, polysiloxane derivatives having an aromatic amine compound group in the side chain or the main chain, polyaniline and derivatives thereof, polythiophene and derivatives thereof, poly(p-phenylenevinylene) and derivatives thereof, poly(2,5-thienylenevinylene) and derivatives thereof and the like, more preferable are polyvinylcarbazole and derivatives thereof, polysilane and derivatives thereof and polysiloxane derivatives having an aromatic amine in the side chain or the main chain. In the case of a low molecular weight hole transporting material, use of the material dispersed in a polymer binder is preferable.

The method of forming a hole transporting layer includes a method of film formation from a mixed solution with a polymer binder in the case of a low molecular weight hole transporting material, and a method of film formation from a solution in the case of a polymer hole transporting material.

As the polymer binder to be mixed, those not extremely disturbing charge transportation are preferable, and those showing no strong absorption for a visible ray are suitably used. The polymer binder includes polycarbonates, polyacrylates, polymethyl acrylate, polymethyl methacrylate, polystyrene, polyvinyl chloride, polysiloxane and the like.

The thickness of the hole transporting layer may be advantageously selected so as to give suitable values of driving voltage and light emission efficiency, and is for example 1 nm to 1 µm, preferably 2 nm to 500 nm, further preferably 5 nm to 200 nm.

When the light emitting device of the present invention has an electron transporting layer, the electron transporting material to be used is the same as the above-described electron transporting material, and preferable are oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof and polyfluorene and derivatives thereof, more preferable are 2-(4-biphenylyl)-5-(4-tert-butylphenyl)-1,3,4-oxadiazole, benzoquinone, anthraquinone, tris(8-quinolinol)aluminum and polyquinoline.

The method of forming an electron transporting layer includes a vacuum vapor deposition method from a powder and a method of film formation from a solution or melted state in the case of a low molecular weight electron transporting material, and a method of film formation from a solution or melted state in the case of a polymer electron transporting material. In film formation from a solution or melted state, a polymer binder may be used together.

As the polymer binder to be mixed, those not extremely disturbing charge transportation are preferable, and those showing no strong absorption for a visible ray are suitably used. The polymer binder includes poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonates, polyacrylates, polymethyl acrylate, polymethyl methacrylate, polystyrene, polyvinyl chloride, polysiloxane and the like.

The thickness of the electron transporting layer may be advantageously selected so as to give suitable values of driving voltage and light emission efficiency, and is for example 1 nm to 1 µm, preferably 2 nm to 500 nm, further preferably 5 nm to 200 nm.

Among charge transporting layers disposed adjacent to an electrode, those having a function of improving charge injection efficiency from an electrode and having an effect of lowering the driving voltage of a device are, in particular, called charge injection layers (hole injection layer, electron injection layer) in some cases.

Further, for improving close adherence with an electrode and improving charge injection from an electron, the above-described charge injection layer or insulation layer may be disposed adjacent to the electrode, alternatively, for improving close adherence of an interface and preventing mixing, a thin buffer layer may be inserted into an interface of a charge transporting layer and a light emitting layer.

The order and the number of layers to be laminated, and the thickness of each layer may advantageously be selected in view of light emission efficiency and device life.

In the present invention, the light emitting device having a charge injection layer includes a light emitting device having a charge injection layer disposed adjacent to a cathode and a light emitting device having a charge injection layer disposed adjacent to an anode.

Examples thereof include the following structures e) to p).
e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode
j) anode/charge injection layer/hole transporting layer/light emitting layer/charge injection layer/cathode
k) anode/charge injection layer/light emitting layer/charge transporting layer/cathode
l) anode/light emitting layer/electron transporting layer/charge injection layer/cathode
m) anode/charge injection layer/light emitting layer/electron transporting layer/charge injection layer/cathode
n) anode/charge injection layer/hole transporting layer/light emitting layer/charge transporting layer/cathode
o) anode/hole transporting layer/light emitting layer/electron transporting layer/charge injection layer/cathode
p) anode/charge injection layer/hole transporting layer/light emitting layer/electron transporting layer/charge injection layer/cathode The charge injection layer includes a layer containing an electric conductive polymer, a layer disposed between an anode and a hole transporting layer and containing a material having ionization potential of a value between an anode material and a hole transporting material contained in the hole transporting layer, a layer disposed between a cathode and an electron transporting layer and containing a material having electron affinity of a value between a cathode material and an electron transporting material contained in the electron transporting layer, and the like.

When the above-described charge injection layer is a layer containing an electric conductive polymer, the electric conductivity of the electric conductive polymer is preferably $10^{-5}$ to $10^3$ S/cm, and for decreasing leak current between light emission picture elements, it is more preferably $10^{-5}$ to $10^2$ S/cm, further preferably $10^{-5}$ to $10^1$ S/cm. Usually, for the electric conductivity of the electric conductive polymer to be $10^{-5}$ to $10^3$ S/cm, the electric conductive polymer is doped with a suitable amount of ions.

As the kind of ions to be doped, an anion is used in the case of a hole injection layer and a cation is used in the case of an electron injection layer. Examples of the anion include a polystyrenesulfonic ion, an alkylbenzenesulfonic ion, a camphorsulfonic ion and the like, and examples of the cation include a lithium ion, a sodium ion, a potassium ion, a tetrabutylammonium ion and the like.

The thickness of the charge injection layer is, for example, 1 to 100 nm, preferably 2 to 50 nm.

The material to be used in the charge injection layer includes polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, polymers containing an aromatic amine structure in the main chain or the side chain, and the like (electric conductive polymers), and metal phthalocyanines (copper phthalocyanine and the like), carbon and the like.

The insulation layer has a function of making charge injection easy. The average thickness of this insulation layer is usually 0.1 to 20 nm, preferably 0.5 to 10 nm, more preferably 1 to 5 nm. As the material of the insulation layer, metal fluorides, metal oxides, organic insulating materials and the like are mentioned. The light emitting device having an insulation layer includes a light emitting device having an insulation layer disposed adjacent to a cathode and a light emitting device having an insulation layer disposed adjacent to an anode.

Examples thereof include the following structures q) to ab).

q) anode/insulation layer/light emitting layer/cathode
r) anode/light emitting layer/insulation layer/cathode
s) anode/insulation layer/light emitting layer/insulation layer/cathode
t) anode/insulation layer/hole transporting layer/light emitting layer/cathode
u) anode/hole transporting layer/light emitting layer/insulation layer/cathode
v) anode/insulation layer/hole transporting layer/light emitting layer/insulation layer/cathode
w) anode/insulation layer/light emitting layer/electron transporting layer/cathode
x) anode/light emitting layer/electron transporting layer/insulation layer/cathode
y) anode/insulation layer/light emitting layer/electron transporting layer/insulation layer/cathode
z) anode/insulation layer/hole transporting layer/light emitting layer/electron transporting layer/cathode
aa) anode/hole transporting layer/light emitting layer/electron transporting layer/insulation layer/cathode
ab) anode/insulation layer/hole transporting layer/light emitting layer/electron transporting layer/insulation layer/cathode The substrate for forming a light emitting device of the present invention thereon may advantageously be one which does not change in forming an electrode and forming an organic layer, and examples thereof include substrates made of glass, plastic, polymer film, silicon and the like.

In the case of an opaque substrate, it is preferable that the opposite electrode is transparent or semi-transparent.

In the light emitting device of the present invention, it is usually preferable that at least one of electrodes consisting of an anode and a cathode is transparent or semi-transparent, and the anode is transparent or semi-transparent.

As the material of the anode, an electric conductive metal oxide film, a semi-transparent metal film and the like are used, and use is made of films fabricated using electric conductive inorganic compounds such as indium oxide, zinc oxide, tin oxide, and composite thereof: indium.tin.oxide (ITO), indium.zinc.oxide and the like, and NESA, gold, platinum, silver, copper and the like, and preferable are ITO, indium.zinc.oxide and tin oxide. The fabrication method includes a vacuum vapor deposition method, a sputtering method, an ion plating method, a plating method and the like. As the anode, organic transparent electric conductive films composed of polyaniline and its derivatives, polythiophene and its derivatives and the like may be used.

The thickness of the anode is for example 10 nm to 10 μm, preferably 20 nm to 1 μm, further preferably 50 nm to 500 nm, in view of light transmission and electric conductivity.

For making charge injection easy, a layer made of a phthalocyanine derivative, an electric conductive polymer, carbon and the like or a layer made of a metal oxide, a metal fluoride, an organic insulation material and the like may be provided on the anode.

As the material of a cathode, materials of small work function are preferable, and use is made of metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys composed of two or more of them, or alloys composed of at least one of them and at least one of gold, silver, platinum, copper, manganese, titanium, cobalt, nickel, tungsten and tin, and graphite or graphite intercalation compounds and the like. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy and the like. The cathode may take a lamination structure composed of two or more layers.

The thickness of the cathode is for example 10 nm to 10 μm, preferably 20 nm to 1 μm, more preferably 50 nm to 500 nm in view of electric conductivity and durability.

The cathode fabrication method includes a vacuum vapor deposition method, a sputtering method, a laminate method of thermally compression-bonding a metal film, and the like. A layer made of an electric conductive polymer, or a layer made of a metal oxide, a metal fluoride, an organic insulation material and the like, may be provided between a cathode and an organic layer, and after fabrication of a cathode, a protective layer for protecting the light emitting device may be installed. For use of the light emitting device stably for a long period of time, it is preferable to install a protective layer and/or a protective cover, for protecting a device from outside.

For the protective layer, resins, metal oxides, metal fluorides, metal borides and the like can be used. As the protective cover, a glass plate, and a plastic plate having a surface which has been subjected to a low water permeation treatment, and the like can be used, and a method in which the cover is pasted to a device substrate with a thermosetting resin or a photo-curing resin to attain sealing is suitably used. When a space is kept using a spacer, blemishing of a device can be prevented easily. If an inert gas such as nitrogen, argon and the like is filled in this space, oxidation of a cathode can be prevented, further, by placing a drying agent such as barium oxide and the like in this space, it becomes easy to suppress moisture adsorbed in a production process from imparting damage to the device. It is preferable to adopt at least one strategy of them.

The light emitting device of the present invention can be used for surface light sources, displays such as segment displays, dot matrix displays, liquid crystal displays (for example, backlight and the like), flat panel displays and the like; and other apparatuses.

For obtaining light emission in the form of plane using a light emitting device of the present invention, it may be advantages to place a planar anode and a planar cathode so as to overlap. For obtaining light emission in the form of pattern, there are a method in which a mask having a window in the form of pattern is placed on the surface of the above-described surface light emitting device, a method in which an organic layer at no light emission parts is formed with extremely large thickness to cause substantially no light emission, and a method in which either an anode or a cathode, or both electrodes are formed in the form pattern. By forming a pattern by any of these methods, and placing several electrodes so that ON/OFF is independently possible, a display device of segment type is obtained which can display digits, letters, simple marks and the like. Further, for providing a dot matrix device, it may be permissible that both an anode and a cathode are formed in the form of stripe, and placed so as to cross. By a method in which compounds showing different emission colors are painted separately or a method in which a color filter or a fluorescence conversion filter is used, partial color display and multi-color display are made possible. In the case of a dot matrix device, passive driving is possible, and active driving may also be carried out in combination with TFT and the like. These display devices can be used as a display of computers, televisions, portable terminals, cellular telephones, car navigations, video camera view finders, and the like.

Further, the above-described surface light emitting device is of self emitting and thin type, and can be suitably used as a surface light source for back light of a liquid crystal display, or as a surface light source for illumination. Examples of illumination light sources include light emission colors such as white light emission, red light emission, green light emission, blue light emission and the like. If a flexible substrate is used, it can also be used as a curved light source or a display.

EXAMPLES

Examples for illustrating the present invention in detail will be shown below.

For the number-average molecular weight and the weight-average molecular weight, the polystyrene-equivalent number-average molecular weight and weight-average molecular weight were measured by size exclusion chromatography (SEC) (manufactured by Shimadzu Corp., trade name: LC-10Avp). SEC using an organic solvent as the mobile phase is called gel permeation chromatography (GPC). A polymer to be measured was dissolved in tetrahydrofuran (THF) at a concentration of about 0.5 wt %, and 30 μL of the solution was injected into GPC. Tetrahydrofuran was used as the mobile phase of GPC, and flowed at a flow rate of 0.6 mL/min. As the column, two columns of TSKgel SuperHM-H (manufactured by Tosoh Corp.) and one column of TSKgel SuperH2000 (manufactured by Tosoh Corp.) were serially connected. As the detector, a differential refractive index detector (manufactured by Shimadzu Corp., trade name: RID-10A) was used. The measurement was carried out at 40° C.

<Synthesis Example 1> (Synthesis of Compound M-1)

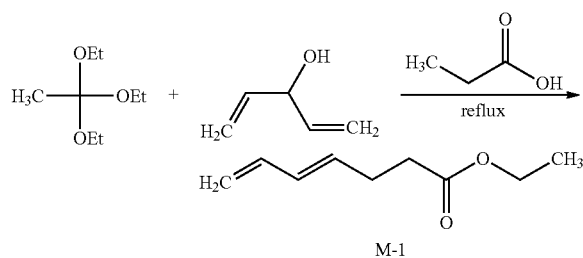

Under an argon atmosphere, divinylcarbinol (25.24 g), triethyl orthoacetate (340 g) and propionic acid (0.20 g) were mixed, and the mixture was refluxed at 130° C. for 4 hours using a Dean-Stark tube while removing ethanol. After completion of the reaction, the resultant reaction liquid was cooled, to this were added hexane (300 ml) and ion exchanged water (300 ml), and the mixture was stirred at 60° C. for 3 hours. After liquid separation, the organic layer was washed with ion exchanged water (300 ml, three times), and dried over sodium sulfate. The resultant organic layer was passed through an alumina flash column and concentrated. To the resultant oil were added, again, hexane (300 ml), ion exchanged water (300 ml) and propionic acid (0.20 g), and the mixture was stirred at 60° C. for 8 hours. After liquid separation, the organic layer was washed with ion exchanged water (300 ml, three times), and dried over sodium sulfate. The resultant organic layer was passed through an alumina flash column and concentrated to obtain 28 g a compound M-1.

$^1$H-NMR (270 MHz, CDCl$_3$): δ=1.25 (t, 3H), 2.07 (q, 2H), 2.41 (m, 4H), 5.05 (dd, 2H), 5.70 (m, 1H), 6.09 (dd, 1H), 6.29 (m, 1H) ppm.

<Synthesis Example 2> (Synthesis of Compound M-2)

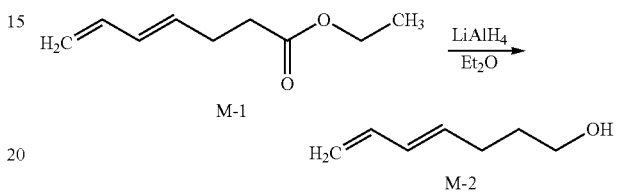

Under an argon atmosphere, the compound M-1 (14.65 g) and diethyl ether (770 ml) were mixed, and the mixture was cooled down to 0° C. Into the resultant mixed liquid, a 1M lithium aluminum hydride diethyl ether solution (50 ml) was dropped over a period of 1 hour, and the mixture was stirred for 1 hour while maintaining 0° C. Into the reaction solution, a 5 wt % sodium hydroxide aqueous solution (100 ml) was dropped slowly, to stop the reaction, then, the organic layer was washed with water (100 ml, three times), and the organic layer after washing was dried over sodium sulfate. The resultant organic layer was passed through an alumina flash column and concentrated to obtain 8.0 g of a compound M-2.

$^1$H-NMR (270 MHz, CDCl$_3$): δ=1.67 (tt, 2H), 2.13-2.28 (m, 3H), 3.63 (q, 2H), 5.04 (dd, 2H), 5.72 (dd, 1H), 6.07 (dd, 1H), 6.30 (m, 1H) ppm.

<Synthesis Example 3> (Synthesis of Compound M-3)

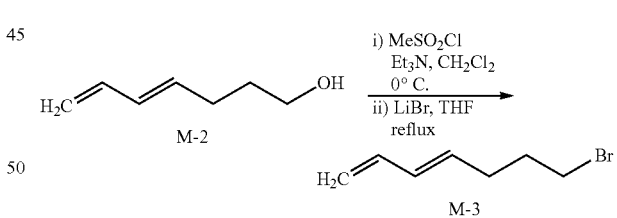

Under an argon atmosphere, the compound M-2 (18.98 g) and dichloromethane (730 ml) were mixed, and the mixture was cooled down to 0° C. Into the resultant mixed liquid, triethylamine (58 ml) was dropped, then, methanesulfonyl chloride (24 ml) was dropped, and the mixture was stirred for 2 hours while maintaining 0° C. To the resultant reaction solution was added water to stop the reaction, then, the mixture was extracted with diethyl ether, and dried over sodium sulfate, to obtain 32 g of a yellow oil.

Under an argon atmosphere, this yellow oil (32 g), lithium bromide (36 g) and THF (400 ml) were mixed, and the mixture was refluxed for 7 hours. The resultant reaction solution was cooled, ion exchanged water (200 ml) and toluene (500 ml) were added, the mixture was subjected to liquid separation, the organic layer was washed with ion exchanged water (100 ml, 5 times), and dried over sodium sulfate. The resultant organic layer was concentrated, hexane (100 ml) was added to this, then, the mixture was passed through an alumina flash column, and concentrated. The resultant oil was subjected to fractional distillation (3 mmHg, 27° C.), to obtain 15.1 g of a compound M-3.

$^1$H-NMR (270 MHz, CDCl$_3$): δ=1.96 (tt, 2H), 2.22-2.29 (m, 2H), 3.41 (t, 2H), 5.05 (dd, 2H), 5.65 (m, 1H), 6.10 (dd, 1H), 6.30 (m, 1H) ppm.

<Synthesis Example 4> (Synthesis of Compound M-7)

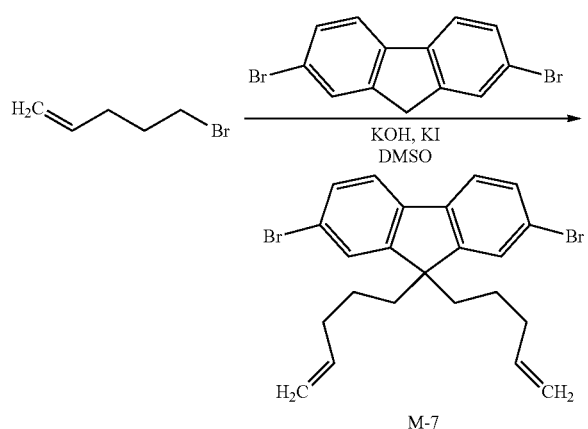

In a 500 ml four-necked flask under an argon atmosphere, 2,7-dibromofluorene (22.7 g), 5-bromo-1-pentene (21.9 g), potassium hydroxide (16.7 g), potassium iodide (1.2 g) and dimethyl sulfoxide (170 ml) were mixed, and the mixture was heated at 80° C. for 4 hours. After completion of the reaction, the reaction liquid was cooled down to room temperature, and this was mixed with water (300 ml) and toluene (300 ml) and the mixture was subjected to liquid separation. Then, the organic layer was washed with a sodium chloride saturated aqueous solution (300 ml) five times. The resultant organic layer was dried over sodium sulfate, then, purified by column chromatography using hexane as a developing solvent and using silica gel as a filler, to obtain a compound M-7 (25.2 g).

ESI-MS: 460 [M]$^+$ $^1$H-NMR (270 MHz, CDCl$_3$); δ=0.69 (t, 4H), 1.83 (m, 4H), 1.93 (m, 4H), 4.85 (d, 4H), 5.56 (m, 2H), 7.44-7.53 (m, 6H).

<Synthesis Example 5> (Synthesis of Compound M-8)

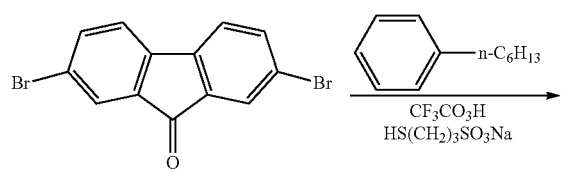

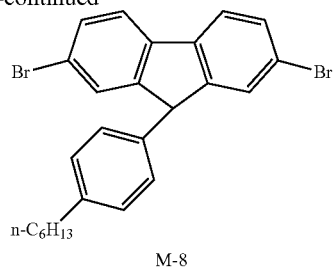

Under a nitrogen gas atmosphere, 2,7-dibromofluorenone (75 g, 0.22 mol), hexylbenzene (334 ml) and trifluoroacetic acid (42 ml) were stirred at room temperature and into this was added sodium 3-mercaptopropanesulfonate (8.1 g), and the mixture was stirred at 45° C. for 9 hours. The resultant reaction liquid was cooled down to room temperature, then, poured into 1 L of hexane. From this, surplus hexylbenzene was distilled off by distillation under reduced pressure (105.5° C., 20 hPa), the residue was diluted with hexane, then, poured into methanol, and the deposited 2,7-dibromofluorenone was removed by filtration. The resultant filtrate was concentrated, then, diluted with toluene, and isopropyl alcohol was added to cause deposition of a solid. The resultant solid was recrystallized from toluene/isopropyl alcohol, to obtain 53 g of a compound M-8 as a white solid.

$^1$H-NMR (270 MHz, CDCl$_3$): δ=0.88 (t, 3H), 1.20-1.45 (m, 6H), 1.54-1.62 (m, 2H), 2.57 (t, 2H), 4.96 (s, 1H), 6.94 (d, 2H), 7.10 (d, 2H), 7.42 (s, 2H), 7.48 (dd, 2H), 7.60 (d, 2H) ppm.

<Synthesis Example 6> (Synthesis of Compound M-9)

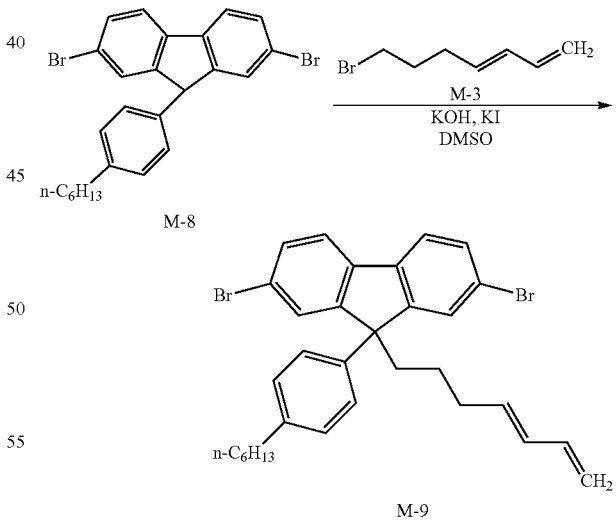

In a 100 ml four-necked flask under an argon atmosphere, the compound M-3 (0.96 g), the compound M-8 (2.42 g) and dimethyl sulfoxide (12 ml) were mixed. To the resultant mixed liquid were added potassium hydroxide (1.2 g) and potassium iodide (0.08 g) ground by a mortar, and the mixture was stirred at room temperature for 5 hours. After completion of the reaction, to the resultant reaction liquid were added ion exchanged water (20 ml) and toluene (30 ml), the mixture was subjected to liquid separation, then, the organic layer was washed with saturated saline (30 ml, ten times), and dried over sodium sulfate, then, concentrated. The resultant oil was purified by silica gel column chromatography (developing solvent: toluene/hexane=1/10), to obtain 2.0 g of a compound M-9 as a colorless oil.

$^{1}$H-NMR (270 MHz, CDCl$_{3}$): δ=0.75-0.87 (m, 5H), 1.20-1.39 (m, 6H), 1.52-1.56 (m, 2H), 2.00-2.31 (m, 2H), 2.37-2.44 (m, 2H), 2.50-2.56 (t, 2H), 4.92-5.10 (dd, 2H), 5.44-5.53 (td, 1H), 5.89-5.97 (dd, 1H), 6.17-6.30 (td, 1H), 7.00-7.16 (m, 4H), 7.18-7.28 (dd, 2H), 7.47 (d, 2H), 7.55 (d, 2H) ppm.

<Synthesis Example 7> (Synthesis of Compound M-10)

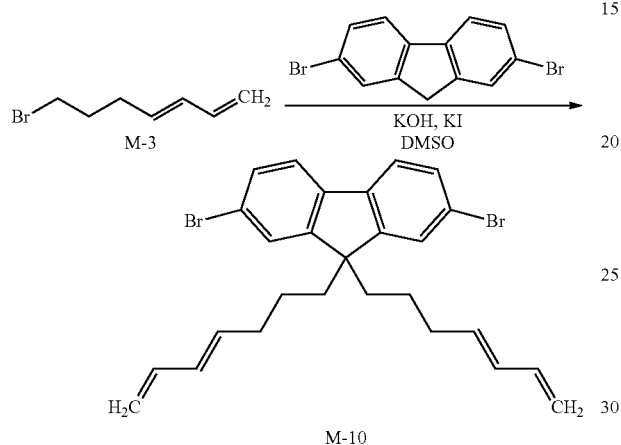

In a 300 ml four-necked flask under an argon atmosphere, the compound M-3 (5.29 g), 2,7-dibromofluorene (4.67 g) and dimethyl sulfoxide (35 ml) were mixed. To the resultant mixed liquid were added potassium hydroxide (3.43 g) and potassium iodide (0.17 g) ground by a mortar, and the mixture was heated at 85° C. for 45 minutes. To the resultant mixed liquid were added ion exchanged water (50 ml) and ethyl acetate (100 ml), the mixture was subjected to liquid separation, then, the organic layer was washed with saturated saline (100 ml, ten times), and dried over sodium sulfate, then, concentrated. The resultant oil was purified by silica gel column chromatography (developing solvent: hexane), to obtain 4.9 g of a compound M-10 represented by the above-described formula as a colorless solid.

$^{1}$H-NMR (270 MHz, CDCl$_{3}$): δ=0.68 (m, 4H), 1.81-1.96 (m, 8H), 4.99 (dd, 4H), 5.44 (m, 2H), 5.89 (dd, 2H), 6.22 (td, 2H), 7.47 (m, 6H) ppm.

MS (APCI-MS: Positive) m/z: 512 ([M]$^{+}$).

<Synthesis Example 8> (Synthesis of Compound MM-X)

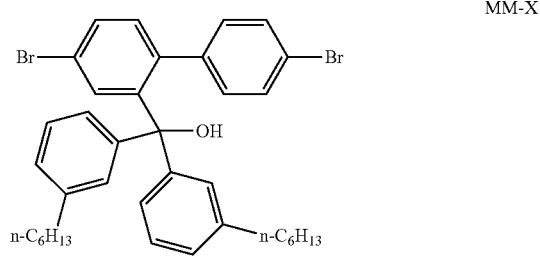

A gas in a 5 L three-necked flask was purged with nitrogen, 226 g of 1-bromo-3-n-hexylbenzene was measured and dissolved in 2.5 L of dehydrated THF. The resultant solution was cooled down to −75° C. or lower, 358 ml of a 2.5 M n-butyllithium/hexane solution was dropped, and the mixture was stirred for 5 hours while keeping at −75° C. or lower. Into the resultant solution, a solution prepared by dissolving 150 g of 2-methoxycarbonyl-4,4'-dibromobiphenyl in 400 ml of dehydrated THF was dropped while keeping at −70° C. or lower. The resultant solution was heated up to room temperature slowly, then, stirred overnight. The reaction liquid was stirred at 0° C., and 150 ml of water dropped into this stirring liquid. The solvent was distilled off, then, to the residue was added 200 ml of water and the mixture was extracted with 1 L of hexane once and with 100 ml of hexane twice. The organic layers were combined, and washed with 200 ml of saturated saline, and the aqueous layer was extracted again with 100 ml of hexane, then, the resultant organic layer was dried over magnesium sulfate. The solvent was distilled off, to obtain 264 g of a coarse product of a compound MM-X. The product was used in the subsequent process without performing purification.

2-methoxycarbonyl-4,4'-dibromobiphenyl was synthesized by a method described in Journal of the American Chemical Society (1956), 78, 3196-3198.

<Synthesis Example 9> (Synthesis of Compound MM-Y)

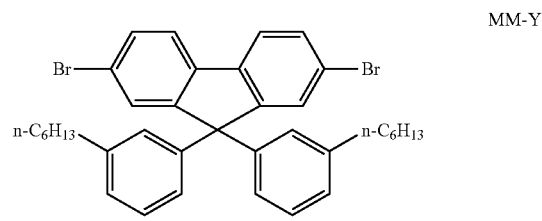

In a 3 L three-necked flask, 264 g of the compound MM-X synthesized in Synthesis Example 8 was measured and charged, and dissolved in 900 ml dichloromethane, and a gas in the flask was purged with nitrogen. The resultant solution was cooled down to 0° C. or lower, and 245 ml of boron trifluoride diethyl ether complex was dropped while keeping at 5° C. or lower. The mixture was heated up to room temperature slowly, then, stirrer overnight. The reaction liquid was poured into 2 L of ice water while stirring, and the mixture was stirred for 30 minutes. The resultant solution was subjected to liquid separation, and the aqueous layer was extracted with 100 ml dichloromethane. The organic layers were combined, 1 L of a 10 wt % potassium phosphate aqueous solution was added and the mixture was subjected to liquid separation, and the organic layer was washed with 1 L of water twice. The organic layer was dried over magnesium sulfate, then, the solvent was distill off to obtain an oil which was then dissolved in 200 ml of toluene, and the solution was filtrated through a glass filter paved with silica gel. The solvent was distilled off, then, 500 ml of methanol was added and the mixture was stirred vigorously. The resultant crystal was filtrated, and washed with methanol. Recrystallization from a hexane/butyl acetate mixed solvent was performed, to obtain 121 g of a compound MM-Y.

¹H-NMR (300 MHz, CDCl₃); δ0.86 (6H, t), 1.26 (12H, m), 1.52 (4H, m), 2.51 (4H, t), 6.87 (2H, d), 7.00 (2H, s), 7.04 (2H, d), 7.12 (2H, t), 7.46 (2H, dd), 7.48 (2H, d), 7.55 (2H, d) ppm.

<Synthesis Example 10> (Synthesis of Compound MM-3)

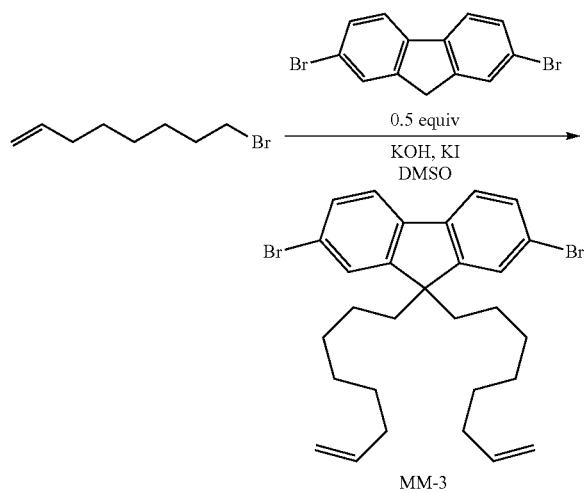

MM-3

In a 300 ml three-necked flask under an argon atmosphere, 2,7-dibromofluorene (8.1 g), 8-bromo-1-octene (10.0 g), potassium hydroxide (6.0 g), potassium iodide (0.42 g) and dimethyl sulfoxide (60 ml) were mixed, and the mixture was heated at 80° C. for 4 hours. After completion of the reaction, the reaction mixture was cooled down to room temperature and this was mixed with water (100 ml) and toluene (100 ml) and the mixture was subjected to liquid separation, then, the resultant organic layer was washed with a sodium chloride saturated aqueous solution (100 ml) five times. The resultant organic layer was dried over sodium sulfate, then, purified by column chromatography using hexane as a developing solvent and using silica gel as a filler, to obtain 12.8 g of a compound MM-3.

ESI-MS: 544 [M]⁺

¹H-NMR (270 MHz, CDCl₃); δ=0.58 (m, 4H), 1.06 (m, 8H), 1.18 (m, 4H), 1.92 (m, 8H), 4.90 (d, 4H), 5.73 (m, 2H), 7.43-7.52 (m, 6H) ppm.

<Synthesis Example 11> (Synthesis of Compound MM-5)

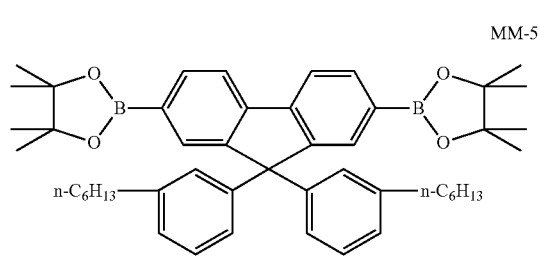

MM-5

In a 2 L three-necked flask, 50 g of the compound MM-Y was charged, and a gas in the flask was purged with nitrogen. Dehydrated THF (500 ml) was added, and the mixture was cooled down to −70° C. or lower. The resultant solution was kept at −70° C. or lower and 68 ml of a 2.5 M n-butyllithium/hexane solution was dropped into the solution. After dropping, the mixture was stirred for 4 hours while keeping the temperature. Forty four milliliters (44 ml) of 2-isopropoxy-4,4,5,5-tetramethyl-1,3,2-dioxaborolane was added, then, the mixture was heated up to room temperature slowly and stirred overnight. The mixture was cooled down to −30° C., 78 ml of a 2 M hydrochloric acid/diethyl ether solution was dropped, then, the mixture was heated up to room temperature. The solvent was distilled off, then, 400 ml of toluene was added to cause dissolution, and the solution was filtrated through a glass filter paved with silica gel, and the solvent of the resultant solution was distilled off, to obtain 50 g of a coarse product. Recrystallization from a toluene/acetonitrile solvent was performed under a nitrogen atmosphere, to obtain 34 g of a compound MM-5.

¹H-NMR (300 MHz, CDCl₃); δ0.86 (6H, t), 1.26-1.29 (12H, m), 1.52-1.53 (4H, m), 2.50 (4H, t), 6.92 (2H, d), 7.00 (2H, d), 7.08 (2H, t), 7.13 (2H, s), 7.77 (2H, d), 7.81-7.82 (4H, m) ppm.

<Synthesis Example 12> (Synthesis of Compound M-11)

A compound M-11 represented by the following formula:

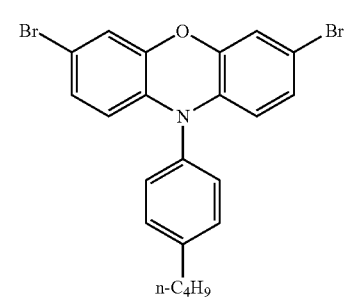

M-11 was synthesized by a method described in US 2004-0127666.

<Synthesis Example 13> (Synthesis of Compound M-12)

A compound M-12 represented by the following formula:

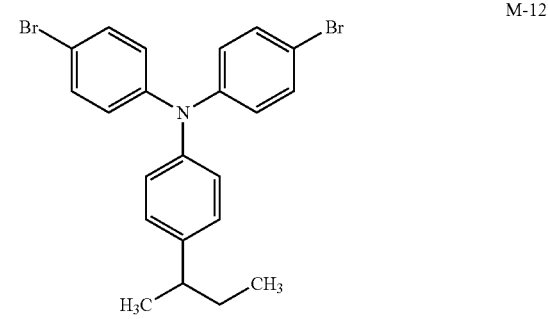 [SMILES: CCC(C)c1ccc(N(c2ccc(Br)cc2)c2ccc(Br)cc2)cc1]

M-12 was synthesized by a method described in WO 2002-045184.

Synthesis Example 14 (Synthesis of Compound M-13)

A compound M-13 represented by the following formula:

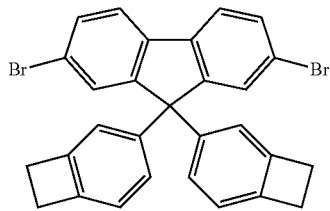

M-13 was synthesized by a method described in JP-A No. 2008-106241.

Synthesis Example 15 (Synthesis of Compound M-14)

A compound M-14 represented by the following formula:

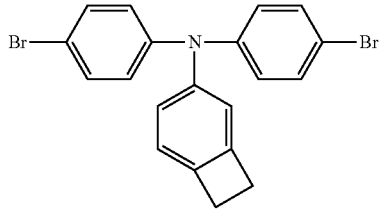

M-14 was synthesized by a method described in US 2004/035221.

Synthesis Example 16 (Synthesis of Compound M-15)

A compound M-15 represented by the following formula:

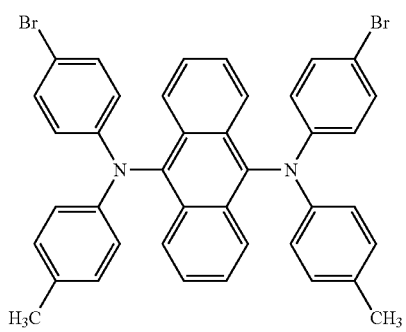

M-15 was synthesized by a method described in WO 2007-058368.

Synthesis Example 17 (Synthesis of Compound M-16)

A compound M-16 represented by the following formula:

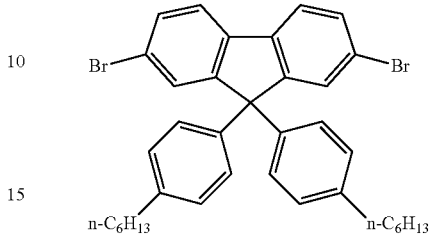

M-16 was synthesized by a method described in WO 2009-131255.

Synthesis Example 18 (Synthesis of Compound M-17)

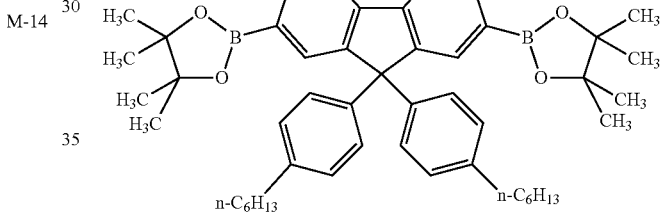

M-17

In a 2 L three-necked flask, 61 g of the compound M-16 was charged, and a gas in the flask was purged with nitrogen. Dehydrated THF (1 L) was added, and the mixture was cooled down to −70° C. or lower. The resultant solution was kept at −70° C. or lower and 95 mL of a 2.5M n-butyl-lithium/hexane solution was dropped. After dropping, the mixture was stirred for 4 hours while keeping the temperature. 2-isopropoxy-4,4,5,5-tetramethyl-1,3,2-dioxaborolane (52.3 g) was added, then, the mixture was heated up to room temperature slowly and stirred overnight. The mixture was cooled down to −30° C., and 143 mL of a 2M hydrochloric acid/diethyl ether solution was dropped, then, the mixture was heated up to room temperature. The solvent was distilled off, then, 320 ml of toluene was added to cause dissolution, and the solution was filtrated through a glass filter paved with silica gel, and the solvent of the resultant solution was distilled off, to obtain a coarse product. Recrystallization from a toluene/acetonitrile solvent was performed under a nitrogen atmosphere, to obtain 45 g of a compound M-17.

$^1$H-NMR (400 MHz, CDCl$_3$); δ0.86 (6H, t), 1.25 (24H, s), 1.25-1.36 (12H, m), 1.53-1.61 (4H, m), 2.51 (4H, t), 7.00 (4H, d), 7.11 (4H, d), 7.11 (4H, d), 7.76 (2H, d), 7.80 (2H, d), 7.81 (2H, s) ppm.

<Synthesis Example 19> (Synthesis of Compound M-18)

A compound M-18 represented by the following formula:

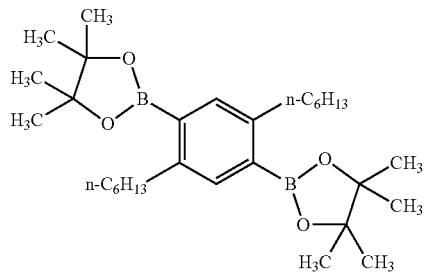

was synthesized by a method described in WO 2009-131255.

<Synthesis Example 20> (Synthesis of Compound M-19)

A compound M-19 represented by the following formula:

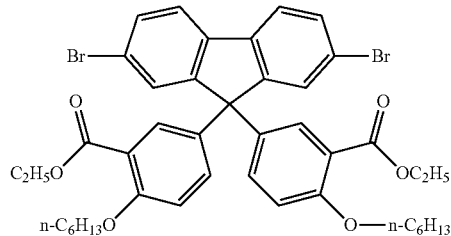

was synthesized by a method described in WO 2006-060437.

<Synthesis Example 21> (Synthesis of Compound M-20)

A compound M-20 represented by the following formula:

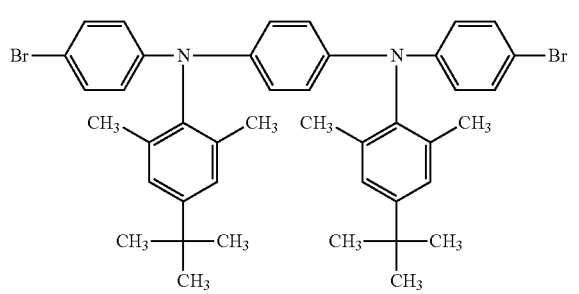

was synthesized by a method described in WO 2005-056633.

<Synthesis Example 22> (Synthesis of Compound M-21)

A compound M-21 represented by the following formula:

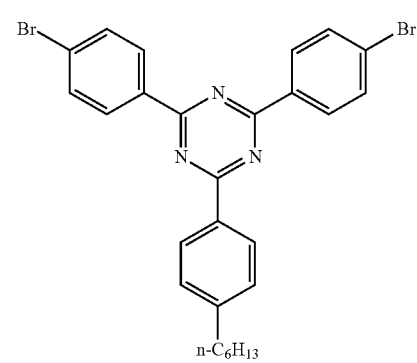

was synthesized by a method described in WO 2009-131255.

<Synthesis Example 23> (Synthesis of Compound M-22)

A compound M-22 represented by the following formula:

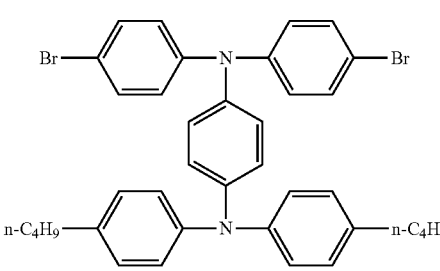

was synthesized by a method described in WO 2009-110642.

<Synthesis Example 24> (Synthesis of Compound M-23)

A compound M-23 represented by the following formula:

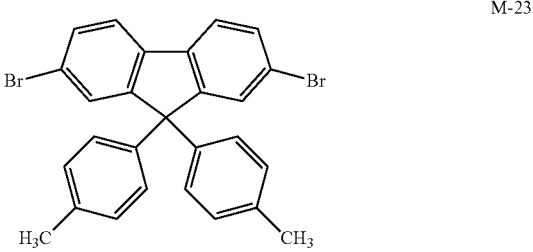 [SMILES: Cc1ccc(C2(c3ccc(C)cc3)c3cc(Br)ccc3-c3ccc(Br)cc32)cc1]

was synthesized by a method described in WO 2008-038747.

<Synthesis Example 25> (Synthesis of Compound M-24)

A compound M-24 represented by the following formula:

M-24

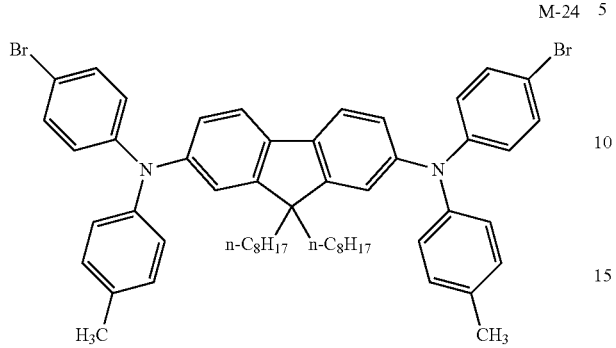

was synthesized by a method described in WO 2005-049546.

<Synthesis Example 26> (Synthesis of Polymer Compound P-1)

Under an inert atmosphere, the compound M-17 (1.06 g), 2,7-bis(1,3,2-dioxaborolan-2-yl)-9,9-dioctylfluorene (0.30 g), the compound MM-Y (0.94 g), the compound M-13 (0.16 g), the compound M-20 (0.18 g), bis(triphenylphosphine)palladium(II)dichloride (1.4 mg) and toluene (44 ml) were mixed, and the mixture was heated at 105° C. Into the resultant reaction liquid, a 20 wt % tetraethylammonium hydroxide aqueous solution (7 ml) was dropped, and the mixture was refluxed for 8 hours. After the reaction, to this was added phenylboric acid (240 mg), and the mixture was further refluxed for 20 hours. Then, to this was added a 1.8 M sodium diethyldithiacarbamate aqueous solution (20 ml), and the mixture was stirred at 80° C. for 4 hours. After cooling down to room temperature, the mixture was washed with water (25 ml) three times, with a 3 wt % acetic acid aqueous solution (25 ml) three times and with water (25 ml) three times, and purified by passing through an alumina column and a silica gel column. The resultant toluene solution was dropped into methanol (300 ml), the mixture was stirred for 1 hour, then, the resultant solid was filtrated and dried, to obtain 1.2 g of a polymer compound P-1 represented by the following formula:

(wherein suffixes appended to the outside of parentheses represent the molar ratio of repeating units). The polymer compound P-1 had a polystyrene-equivalent number-average molecular weight of $3.1 \times 10^5$ and a polystyrene-equivalent weight-average molecular weight of $7.5 \times 10^5$.

<Synthesis Example 27> (Synthesis of Polymer Compound P-2)

Under an inert atmosphere, the compound MM-5 (0.74 g), 2,7-dibromo-9,9-dioctylfluorene (0.11 g), the compound M-22 (0.41 g), the compound M-7 (0.092 g), bis(triphenylphosphine)palladium(II)dichloride (0.7 mg) and toluene (22 ml) were mixed, and the mixture was heated at 105° C. Into the resultant reaction liquid, a 20 wt % tetraethylammonium hydroxide aqueous solution (3.3 ml) was dropped, and the mixture was refluxed for 6 hours. After the reaction, to this was added phenylboric acid (120 mg), and the mixture was further refluxed for 20 hours. Then, to this was added a 1.8 M sodium diethyldithiacarbamate aqueous solution (11 ml), and the mixture was stirred at 80° C. for 4 hours. After cooling down to room temperature, the mixture was washed with water (13 ml) three times, with a 3 wt % acetic acid aqueous solution (13 ml) three times and with water (13 ml) three times, and purified by passing through an alumina column and a silica gel column. The resultant toluene solution was dropped into methanol (150 ml), and the mixture was stirred for 1 hour, then, the resultant solid was filtrated and dried, to obtain 0.7 g of a polymer compound P-2 represented by the following formula:

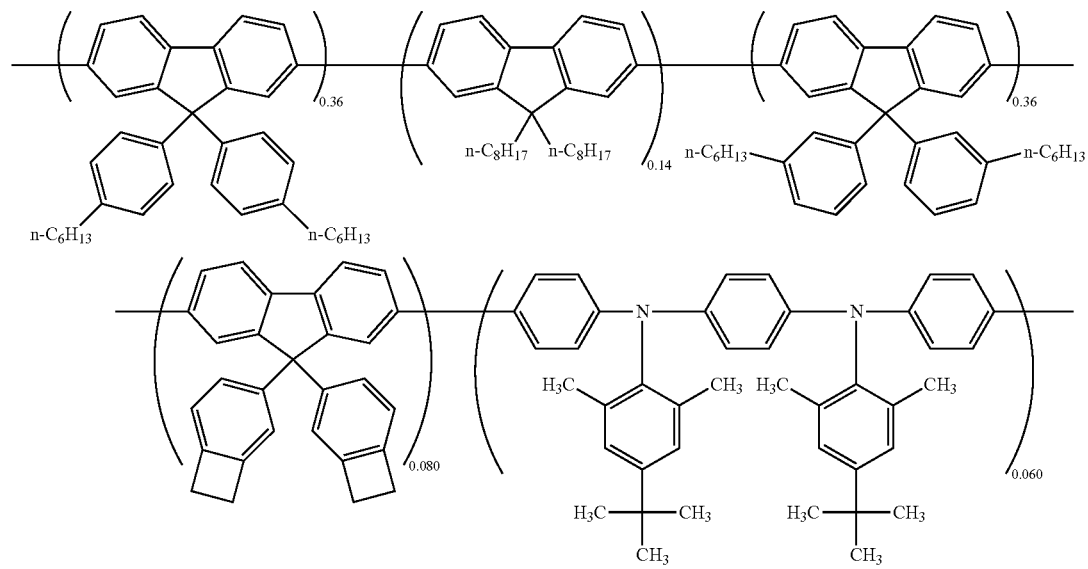

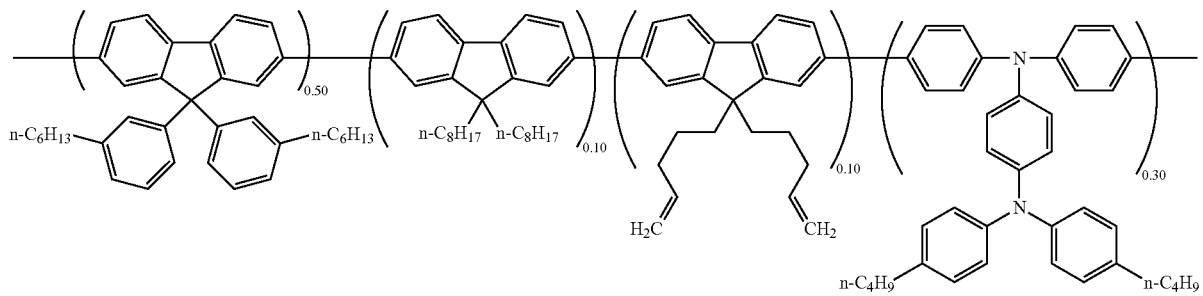

(wherein suffixes appended to the outside of parentheses represent the molar ratio of repeating units).

The polymer compound P-2 had a polystyrene-equivalent number-average molecular weight of $7.6 \times 10^4$ and a polystyrene-equivalent weight-average molecular weight of $2.2 \times 10^5$.

<Synthesis Example 28> (Synthesis of Polymer Compound P-3)

Under an inert atmosphere, the compound MM-5 (1.48 g), the compound M-20 (0.89 g), 2,7-dibromo-9,9-dioctylfluorene (0.22 g), the compound M-10 (0.20 g), palladium acetate (0.4 mg), tris(o-methoxyphenyl)phosphine (2.8 mg) and toluene (44 ml) were mixed, and the mixture was heated at 105° C. Into the resultant reaction liquid, a 20 wt % tetraethylammonium hydroxide aqueous solution (7 ml) was dropped, and the mixture was refluxed for 20 hours. After the reaction, to this was added phenylboric acid (240 mg), and the mixture was further refluxed for 8 hours. Then, to this was added a 1.8 M sodium diethyldithiacarbamate aqueous solution (20 ml), and the mixture was stirred at 80° C. for 4 hours. After cooling down to room temperature, the mixture was washed with water (25 ml) three times, with a 3 wt % acetic acid aqueous solution (25 ml) three times and with water (25 ml) three times, and purified by passing through an alumina column and a silica gel column. The resultant toluene solution was dropped into methanol (300 ml), the mixture was stirred for 1 hour, then, the resultant solid was filtrated and dried, to obtain 1.4 g of a polymer compound P-3 represented by the following formula:

(wherein suffixes appended to the outside of parentheses represent the molar ratio of repeating units).

The polymer compound P-3 had a polystyrene-equivalent number-average molecular weight of $1.5 \times 10^5$ and a polystyrene-equivalent weight-average molecular weight of $3.6 \times 10^5$.

<Synthesis Example 29> (Synthesis of Polymer Compound P-4)

Under an inert atmosphere, the compound MM-5 (1.48 g), 2,7-dibromo-9,9-dioctylfluorene (0.22 g), the compound M-24 (1.09 g), the compound M-7 (0.09 g), the compound M-13 (0.11 g), palladium acetate (0.4 mg), tris(o-methoxyphenyl)phosphine (2.8 mg) and toluene (44 ml) were mixed, and the mixture was heated at 105° C. Into the resultant reaction liquid, a 20 wt % tetraethylammonium hydroxide aqueous solution (6.6 ml) was dropped, and the mixture was refluxed for 4 hours. After the reaction, to this was added phenylboric acid (240 mg), and the mixture was further refluxed for 18 hours. Then, to this was added a 1.8 M sodium diethyldithiacarbamate aqueous solution (22 ml), and the mixture was stirred at 80° C. for 4 hours. After cooling down to room temperature, the mixture was washed with water (30 ml) three times, with a 3 wt % acetic acid aqueous solution (30 ml) three times and with water (30 ml) three times, and purified by passing through an alumina column and a silica gel column. The resultant toluene solution was dropped into methanol (300 ml), the mixture was stirred for 1 hour, then, the resultant solid was filtrated and dried, to obtain 1.2 g of a polymer compound P-4 represented by the following formula:

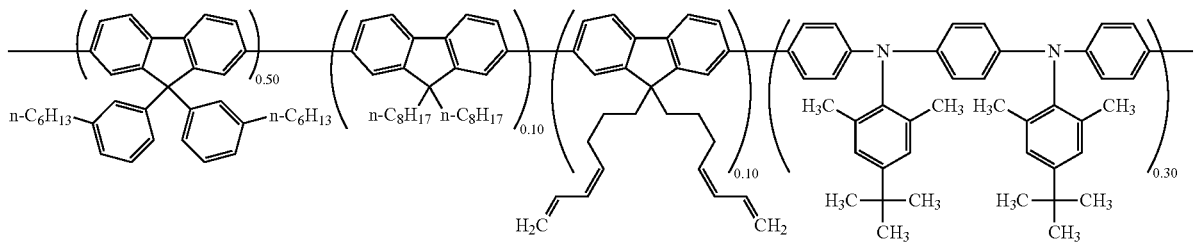

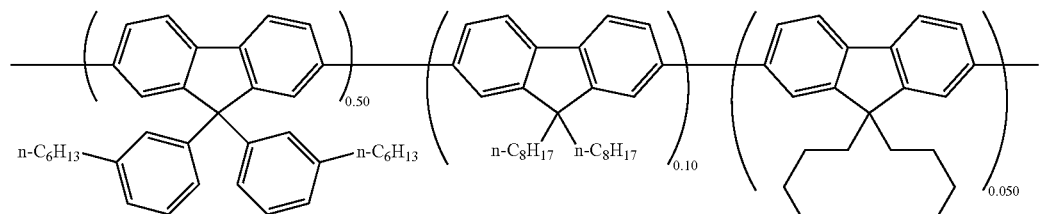

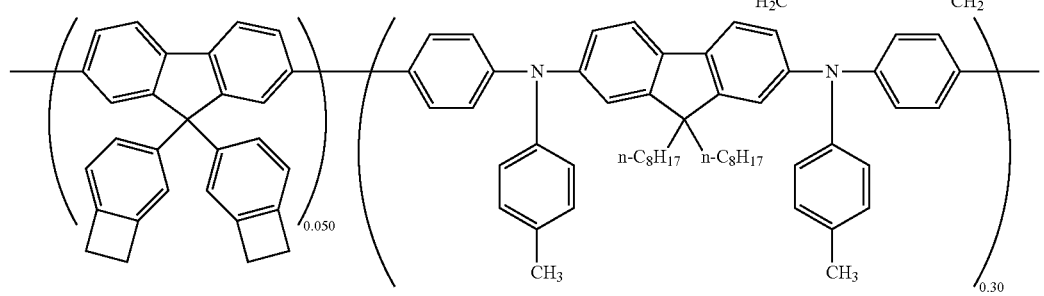

(wherein suffixes appended to the outside of parentheses represent the molar ratio of repeating units).

The polymer compound P-4 had a polystyrene-equivalent number-average molecular weight of $1.5 \times 10^5$ and a polystyrene-equivalent weight-average molecular weight of $5.4 \times 10^5$.

<Synthesis Example 30> (Synthesis of Polymer Compound P-5)

Under an inert atmosphere, the compound MM-5 (1.48 g), 2,7-dibromo-9,9-dioctylfluorene (0.22 g), the compound M-22 (0.82 g), the compound M-9 (0.23 g), palladium acetate (0.4 mg), tris(o-methoxyphenyl)phosphine (2.8 mg) and toluene (44 ml) were mixed, and the mixture was heated at 105° C. Into the resultant reaction liquid, a 20 wt % tetraethylammonium hydroxide aqueous solution (6.6 ml) was dropped, and the mixture was refluxed for 4 hours. After the reaction, to this was added phenylboric acid (240 mg), and the mixture was further refluxed for 18 hours. Then, to this was added a 1.8 M sodium diethyldithiacarbamate aqueous solution (22 ml), and the mixture was stirred at 80° C. for 4 hours. After cooling down to room temperature, the mixture was washed with water (30 ml) three times, with a 3 wt % acetic acid aqueous solution (30 ml) three times and with water (30 ml) three times, and purified by passing through an alumina column and a silica gel column. The resultant toluene solution was dropped into methanol (300 ml), the mixture was stirred for 1 hour, then, the resultant solid was filtrated and dried, to obtain 1.5 g of a polymer compound P-5 represented by the following formula:

(wherein suffixes appended to the outside of parentheses represent the molar ratio of repeating units).

The polymer compound P-5 had a polystyrene-equivalent number-average molecular weight of $2.2 \times 10^5$ and a polystyrene-equivalent weight-average molecular weight of $8.5 \times 10^5$.

<Synthesis Example 31> (Synthesis of Polymer Compound P-6)

Under an inert atmosphere, 2,7-bis(1,3,2-dioxaborolan-2-yl)-9,9-dioctylfluorene (1.06 g), the compound M-12 (0.66 g), the compound M-14 (0.12 g), the compound M-7 (0.13 g), bis(triphenylphosphine)palladium(II)dichloride (1.4 mg), trioctylmethylammonium chloride (trade name: Aliquat336, manufactured by Aldrich) (0.25 g) and toluene (44 ml) were mixed, and the mixture was heated at 105° C. Into the resultant reaction liquid, a 2 M sodium carbonate aqueous solution (6 ml) was dropped, and the mixture was refluxed for 24 hours. After the reaction, to this was added phenylboric acid (240 mg), and the mixture was further refluxed for 20 hours. Then, to this was added a 1.8 M sodium diethyldithiacarbamate aqueous solution (20 ml), and the mixture was stirred at 80° C. for 4 hours. After cooling down to room temperature, the mixture was washed with water (25 ml) three times, with a 3 wt % acetic acid aqueous solution (25 ml) three times and with water (25 ml) three times, and purified by passing through an alumina column and a silica gel column. The resultant toluene solution was dropped into methanol (300 ml), the mixture was stirred for 1 hour, then, the resultant solid was filtrated and dried, to obtain 0.9 g of a polymer compound P-6 represented by the following formula:

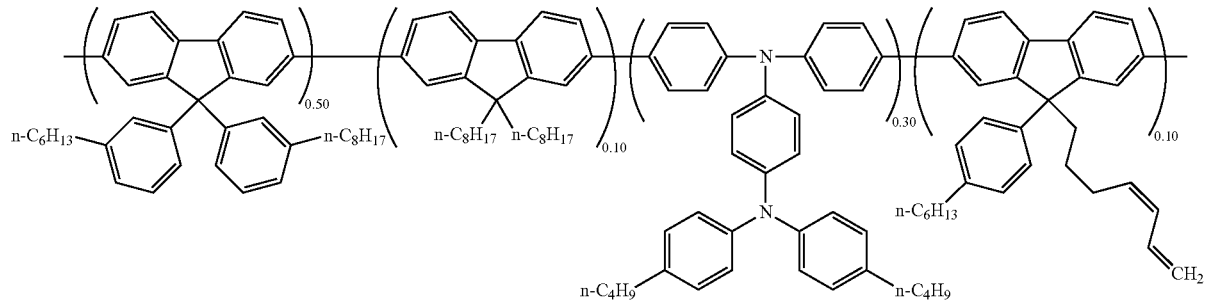

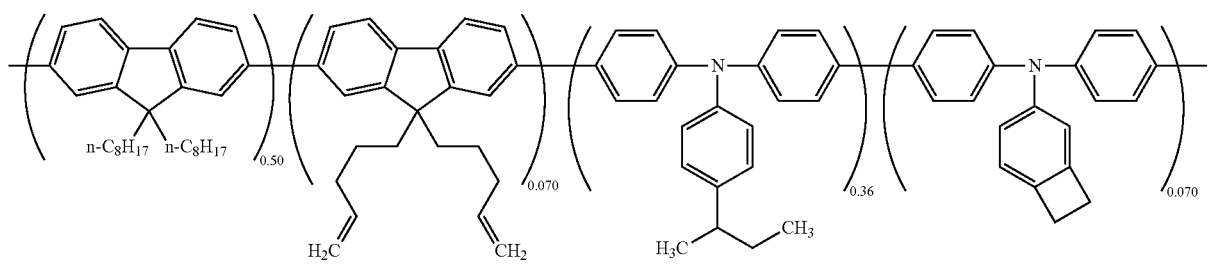

(wherein suffixes appended to the outside of parentheses represent the molar ratio of repeating units).

The polymer compound P-6 had a polystyrene-equivalent number-average molecular weight of $3.1 \times 10^4$ and a polystyrene-equivalent weight-average molecular weight of $6.3 \times 10^4$.

<Synthesis Example 32> (Synthesis of Polymer Compound P-7)

Under an inert atmosphere, the compound M-18 (1.00 g), the compound M-17 (0.90 g), the compound M-21 (0.22 g), the compound M-10 (0.10 g), palladium acetate (0.4 mg), tris(o-methoxyphenyl)phosphine (2.8 mg) and toluene (44 ml) were mixed, and the mixture was heated at 105° C. Into the resultant reaction liquid, a 20 wt % tetraethylammonium hydroxide aqueous solution (7 ml) was dropped, and the mixture was refluxed for 16 hours. After the reaction, to this was added phenylboric acid (240 mg), and the mixture was further refluxed for 8 hours. Then, to this was added a 1.8 M sodium diethyldithiacarbamate aqueous solution (20 ml), and the mixture was stirred at 80° C. for 4 hours. After cooling down to room temperature, the mixture was washed with water (25 ml) three times, with a 3 wt % acetic acid aqueous solution (25 ml) three times and with water (25 ml) three times, and purified by passing through an alumina column and a silica gel column. The resultant toluene solution was dropped into methanol (300 ml), the mixture was stirred for 1 hour, then, the resultant solid was filtrated and dried, to obtain 1.0 g of a polymer compound P-7 represented by the following formula:

The polymer compound P-7 had a polystyrene-equivalent number-average molecular weight of $1.8 \times 10^5$ and a polystyrene-equivalent weight-average molecular weight of $5.7 \times 10^5$.

<Synthesis Example 33> (Synthesis of Polymer Compound P-8)

Under an inert atmosphere, the compound M-17 (1.6840 g, 2.28 mmol), the compound M-19 (0.8426 g, 1.03 mmol), 2,7-dibromo-9,9-dioctylfluorene (0.2378 g, 0.43 mmol), the compound M-13 (0.2410 g, 0.46 mmol), the compound M-11 (0.1080 g, 0.23 mmol), the compound M-15 (0.0954 g, 0.14 mmol), palladium acetate (0.8 mg), tris(2-methoxyphenyl)phosphine (9.5 mg), trioctylmethylammonium chloride (trade name: Aliquat336 (manufactured by Aldrich), 0.33 g) and toluene (28 ml) were mixed, and the mixture was heated at 105° C. Into this reaction solution, a 2M sodium carbonate aqueous solution (5.0 ml) was dropped, and the mixture was refluxed for 2 hours. After the reaction, 2-[4-(1,1-dimethylethyl)phenyl]-4,4,5,5-tetramethyl-1,3,2-dioxaborolane (42 mg) and toluene (15 ml) were added, and the mixture was further refluxed for 2 hours. Then, a sodium diethyldithiacarbamate aqueous solution was added, and the mixture was stirred at 100° C. for 2 hours. After cooling, the mixture was washed with water (33 ml) twice, with a 3 wt % acetic acid aqueous solution (33 ml) twice and with water (33 ml) twice, the resultant solution was dropped into methanol (500 ml), and the mixture was filtrated to obtain a precipitate. This precipitate was dissolved in toluene (100 ml), and purified by passing through an alumina column and a silica gel column. The resultant toluene solution was dropped into methanol (1000 ml), the mixture was stirred, then, the resultant precipitate was filtrated and dried, to

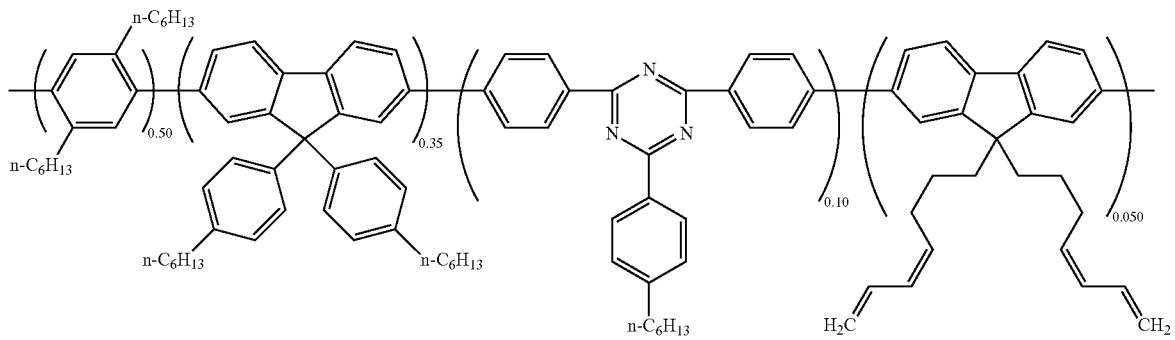

(wherein suffixes appended to the outside of parentheses represent the molar ratio of repeating units).

obtain a polymer compound P-8 represented by the following formula with a yielded amount of 1.87 g:

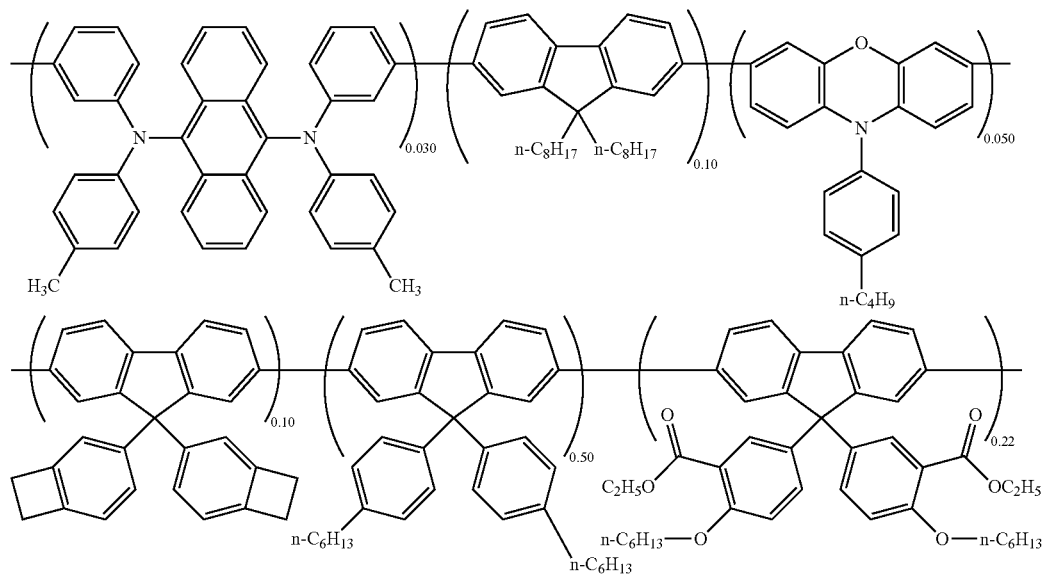

(wherein suffixes appended to the outside of parentheses represent the molar ratio of repeating units).

The polymer compound P-8 had a polystyrene-equivalent number-average molecular weight of $1.5 \times 10^5$ and a polystyrene-equivalent weight-average molecular weight of $4.1 \times 10^5$.

<Synthesis Example 34> (Synthesis of Polymer Compound P-9)

Under an inert atmosphere, the compound M-17 (1.5713 g, 2.13 mmol), 2,7-bis(1,3,2-dioxaborolan-2-yl)-9,9-dioctylfluorene (0.4455 g, 0.84 mmol), the compound MM-Y (1.3535 g, 2.10 mmol), the compound M-7 (0.2762 g, 0.60 mmol), the compound M-20 (0.1773 g, 0.24 mmol), the compound M-11 (0.0284 g, 0.06 mmol), dichlorobis(triphenylphosphine)palladium (2.16 mg) and toluene (77 ml) were mixed, and the mixture was heated at 105° C. Into this reaction solution, a 20 wt % tetraethylammonium hydroxide aqueous solution (12 ml) was dropped, and the mixture was refluxed for 5.5 hours. After the reaction, phenylboric acid (37 mg) and toluene (4 ml) were added, and the mixture was further refluxed for 15 hours. Then, a sodium diethyldithiacarbamate aqueous solution was added, and the mixture was stirred at 80° C. for 2 hours. After cooling, the mixture was washed with water (39 ml) twice, with a 3 wt % acetic acid aqueous solution (39 ml) twice and with water (39 ml) twice, the resultant solution was dropped into methanol (500 ml), and the mixture was filtrated to obtain a precipitate. This precipitate was dissolved in toluene (95 ml), and purified by passing through an alumina column and a silica gel column. The resultant solution was dropped into methanol (500 ml), the mixture was stirred, then, the resultant precipitate was filtrated and dried, to obtain a polymer compound P-9 represented by the following formula with a yielded amount of 2.52 g:

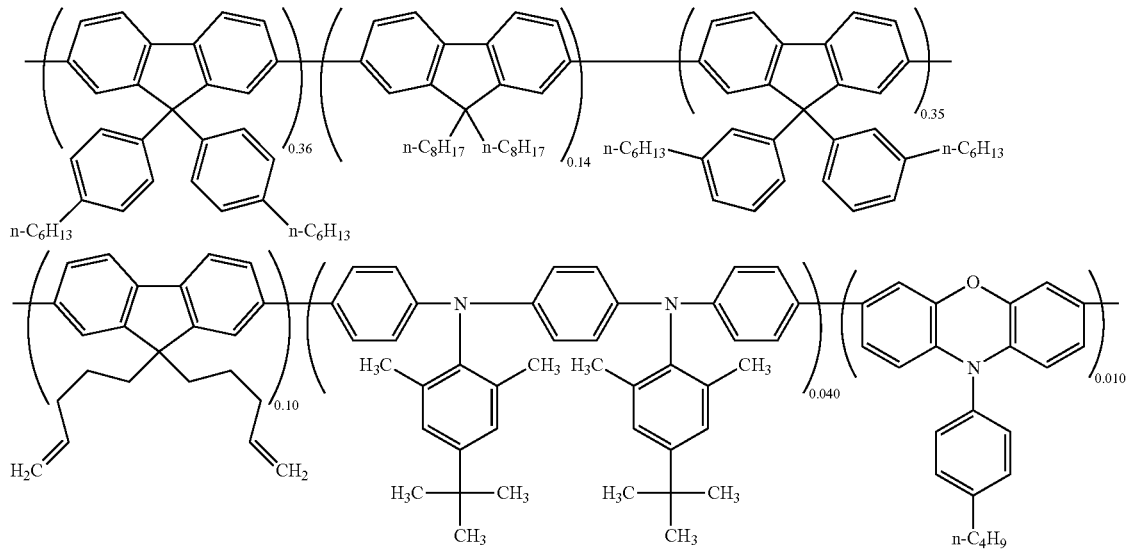

(wherein suffixes appended to the outside of parentheses represent the molar ratio of repeating units).

The polymer compound P-9 had a polystyrene-equivalent number-average molecular weight of $1.2 \times 10^5$ and a polystyrene-equivalent weight-average molecular weight of $5.3 \times 10^5$.

<Synthesis Example 35> (Synthesis of Polymer Compound P-10)

Under an inert atmosphere, the compound M-17 (3.1422 g, 4.25 mmol), 2,7-bis(1,3,2-dioxaborolan-2-yl)-9,9-dioctylfluorene (1.0795 g, 1.68 mmol), the compound MM-Y (3.0937 g, 4.80 mmol), the compound M-13 (0.3171 g, 0.60 mmol), the compound M-7 (0.2762 g, 0.60 mmol), dichlorobis(triphenylphosphine)palladium (4.27 mg) and toluene (145 ml) were mixed, and the mixture was heated at 105° C. Into the reaction liquid, a 20 wt % tetraethylammonium hydroxide aqueous solution (20 ml) was dropped, and the mixture was refluxed for 2 hours and 40 minutes. After the reaction, phenylboric acid (73 mg) and toluene (140 ml) were added, and the mixture was further refluxed for 18.5 hours. Then, a sodium diethyldithiacarbamate aqueous solution was added, and the mixture was stirred at 80° C. for 2 hours. After cooling, the mixture was washed with water (78 ml) twice, with a 3 wt % acetic acid aqueous solution (78 ml) twice and with water (78 ml) twice, the resultant solution was dropped into methanol (1500 ml), and the mixture was filtrated to obtain a precipitate. This precipitate was dissolved in toluene (760 ml), and two-thirds of the solution was purified by passing through an alumina column and a silica gel column. Toluene was distilled off until the volume of the resultant toluene solution halved, then, the solution was dropped into methanol (2000 ml), the mixture was stirred, then, the resultant precipitate was filtrated and dried, to obtain a polymer compound P-10 represented by the following formula with a yielded amount of 2.25 g:

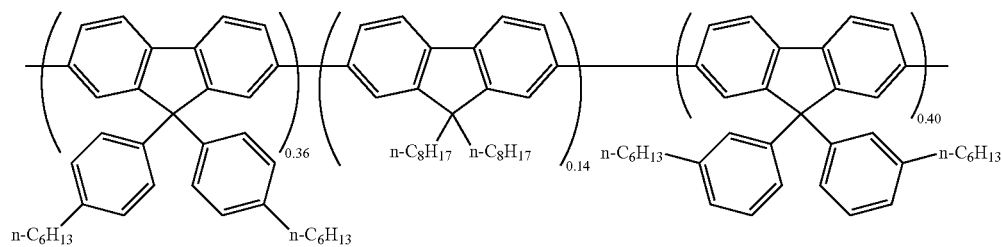

(wherein suffixes appended to the outside of parentheses represent the molar ratio of repeating units).

The polymer compound P-10 had a polystyrene-equivalent number-average molecular weight of $1.9 \times 10^5$ and a polystyrene-equivalent weight-average molecular weight of $9.2 \times 10^5$.

<Synthesis Example 36> (Synthesis of Polymer Compound CP-1)

Under an inert atmosphere, 2,7-bis(1,3,2-dioxaborolan-2-yl)-9,9-dioctylfluorene (1.06 g), the compound M-12 (0.87 g), the compound M-14 (0.04 g), bistriphenylphosphinepalladium dichloride (1.4 mg), trioctylmethylammonium chloride (trade name: Aliquat336, manufactured by Aldrich) (0.25 g) and toluene (40 ml) were mixed, and the mixture was heated at 105° C. Into the resultant reaction liquid, a 2 M sodium carbonate aqueous solution (6 ml) was dropped, and the mixture was refluxed for 7 hours. After the reaction, to this was added phenylboric acid (240 mg), and the mixture was further refluxed for 4 hours. Then, to this was added a 1.8 M sodium diethyldithiacarbamate aqueous solution (10 ml), and the mixture was stirred at 80° C. for 4 hours. After cooling down to room temperature, the mixture was washed with water (30 ml) three times, with a 3 wt % acetic acid aqueous solution (30 ml) three times and with water (30 ml) three times, and purified by passing through an alumina column and a silica gel column. The resultant toluene solution was dropped into methanol (300 ml), the mixture was stirred for 1 hour, then, the resultant solid was filtrated and dried, to obtain 0.8 g of a polymer compound CP-1 represented by the following formula:

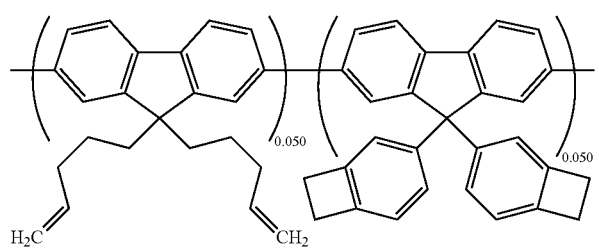

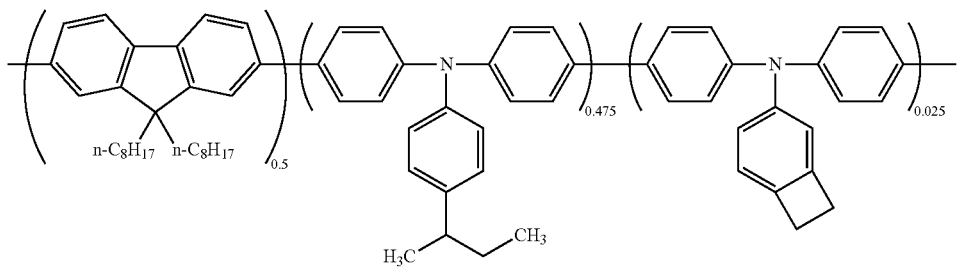

(wherein suffixes appended to the outside of parentheses represent the molar ratio of repeating units).

The polymer compound CP-1 had a polystyrene-equivalent number-average molecular weight of $3.4\times10^4$ and a polystyrene-equivalent weight-average molecular weight of $6.7\times10^4$.

<Synthesis Example 37> (Synthesis of Polymer Compound CP-2)

Under an inert atmosphere, 2,7-bis(1,3,2-dioxaborolan-2-yl)-9,9-dioctylfluorene (1.06 g), 2,7-dibromo-9,9-dioctylfluorene (0.22 g), the compound M-12 (0.55 g), the compound M-13 (0.21 g), bistriphenylphosphinepalladium dichloride (1.4 mg), trioctylmethylammonium chloride (trade name: Aliquat336, manufactured by Aldrich) (0.25 g) and toluene (40 ml) were mixed, and the mixture was heated at 105° C. Into the resultant reaction liquid, a 2 M sodium carbonate aqueous solution (6 ml) was dropped, and the mixture was refluxed for 7 hours. After the reaction, to this was added phenylboric acid (240 mg), and the mixture was further refluxed for 4 hours. Then, to this was added a 1.8 M sodium diethyldithiacarbamate aqueous solution (10 ml), and the mixture was stirred at 80° C. for 4 hours. After cooling down to room temperature, the mixture was washed with water (30 ml) three times, with a 3 wt % acetic acid aqueous solution (30 ml) three times and with water (30 ml) three times, and purified by passing through an alumina column and a silica gel column. The resultant toluene solution was dropped into methanol (300 ml), the mixture was stirred for 1 hour, then, the resultant solid was filtrated and dried, to obtain a polymer compound CP-2 represented by the following formula with a yielded amount of 0.9 g:

(wherein suffixes appended to the outside of parentheses represent the molar ratio of repeating units).

The polymer compound CP-2 had a polystyrene-equivalent number-average molecular weight of $8.4\times10^4$ and a polystyrene-equivalent weight-average molecular weight of $2.0\times10^5$.

<Synthesis Example 38> (Synthesis of Polymer Compound CP-3)

Under an inert atmosphere, 2,7-bis(1,3,2-dioxaborolan-2-yl)-9,9-dioctylfluorene (1.06 g), the compound MM-3 (0.22 g), N,N-di(4-bromophenyl)aniline (0.73 g), bistriphenylphosphinepalladium dichloride (1.4 mg), trioctylmethylammonium chloride (trade name: Aliquat336, manufactured by Aldrich) (0.25 g) and toluene (40 ml) were mixed, and the mixture was heated at 105° C. Into the reaction solution, a 2 M sodium carbonate aqueous solution (6 ml) was dropped, and the mixture was refluxed for 20 hours. After the reaction, to this was added phenylboric acid (240 mg), and the mixture was further refluxed for 4 hours. Then, to this was added a 1.8 M sodium diethyldithiacarbamate aqueous solution (10 ml), and the mixture was stirred at 80° C. for 4 hours. After cooling down to room temperature, the mixture was washed with water (30 ml) three times, with a 3 wt % acetic acid aqueous solution (30 ml) three times and with water (30 ml) three times, and purified by passing through an alumina column and a silica gel column. The resultant toluene solution was dropped into methanol (300 ml), the mixture was stirred for 1 hour, then, the resultant solid was filtrated and dried, to obtain 0.8 g of a polymer compound CP-3 represented by the following formula:

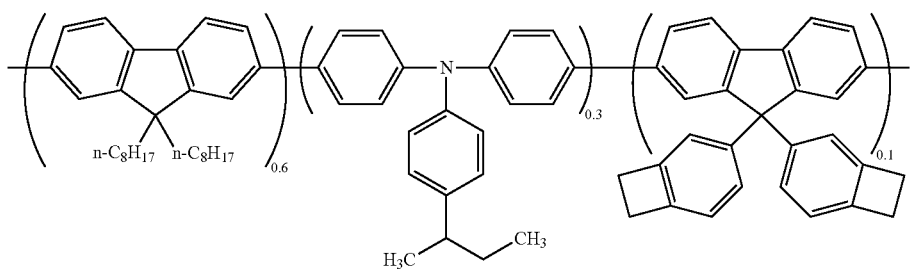

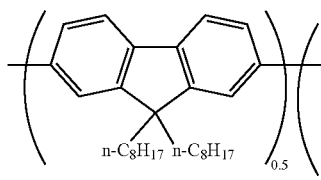
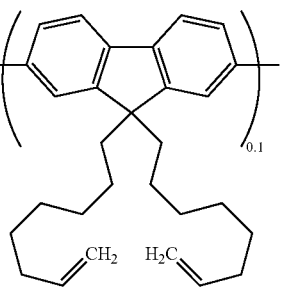

(wherein suffixes appended to the outside of parentheses represent the molar ratio of repeating units).

The polymer compound CP-3 had a polystyrene-equivalent number-average molecular weight of $5.3 \times 10^4$ and a polystyrene-equivalent weight-average molecular weight of $1.9 \times 10^5$.

<Example 1> (Preparation of Liquid Composition L-1)

The polymer compound P-1 was dissolved in xylene so as to give a concentration of 1 wt % (solution A). The polymer compound P-2 was dissolved in xylene so as to give a concentration of 1 wt % (solution B). Next, the solution A and the solution B were mixed at a mixing ratio (volume ratio) of 50:50, to prepare a liquid composition L-1.

<Example 2> (Preparation of Liquid Composition L-2)

The polymer compound P-3 was dissolved in xylene so as to give a concentration of 1 wt % (solution C). The polymer compound P-4 was dissolved in xylene so as to give a concentration of 1 wt % (solution D). Next, the solution C and the solution D were mixed at a mixing ratio (volume ratio) of 10:90, to prepare a liquid composition L-2.

<Example 3> (Preparation of Liquid Composition L-3)

The polymer compound P-5 was dissolved in xylene so as to give a concentration of 1 wt % (solution E). The polymer compound P-6 was dissolved in xylene so as to give a concentration of 1 wt % (solution F). Next, the solution E and the solution F were mixed at a mixing ratio (volume ratio) of 90:10, to prepare a liquid composition L-3.

<Example 4> (Preparation of Liquid Composition L-4)

The polymer compound P-7 was dissolved in xylene so as to give a concentration of 1 wt % (solution G). The polymer compound P-8 was dissolved in xylene so as to give a concentration of 1 wt % (solution H). Next, the solution G and the solution H were mixed at a mixing ratio (volume ratio) of 60:40, to prepare a liquid composition L-4.

<Example 5> (Preparation of Liquid Composition L-5)

The polymer compound P-9 was dissolved in xylene so as to give a concentration of 1 wt % (solution I). The polymer compound P-10 was dissolved in xylene so as to give a concentration of 1 wt % (solution J). Next, the solution I and the solution J were mixed at a mixing ratio (volume ratio) of 20:80, to prepare a liquid composition L-5.

<Example 6> (Preparation of Liquid Composition L-6)

The solution I and the solution H were mixed at a mixing ratio (volume ratio) of 30:70, to prepare a liquid composition L-6.

<Comparative Example 1> (Preparation of Liquid Composition CL-1)

The polymer compound CP-1 was dissolved in xylene at a concentration of 1 wt %, to prepare a liquid composition CL-1.

<Comparative Example 2> (Preparation of Liquid Composition CL-2)

The polymer compound CP-2 was dissolved in xylene at a concentration of 1 wt %, to prepare a liquid composition CL-2.

<Comparative Example 3> (Preparation of Liquid Composition CL-3)

The polymer compound CP-3 was dissolved in xylene at a concentration of 1 wt %, to prepare a liquid composition CL-3.

<Measurement of Film Remaining Ratio and Evaluation Thereof>

Evaluation of Film Remaining Ratio

Any of liquid compositions (L-1 to L-6 and CL-1 to CL-3) was dropped on a glass substrate, and coated by using a spin coater (trade name: MS-A100 type, manufactured by Misawa) to form a film under conditions of 1000 rpm and 15 seconds. The thickness of the resultant film ($H_1$) was measured by using a profiler (trade name: P-16+, manufactured by KLA-Tencor).

Next, in a glove box of which internal gas had been purged with nitrogen, the film on the above-described glass substrate was baked for 20 minutes at a baking temperature shown in Table 1 using a high power hot plate (trade name: HP-ISA, manufactured by AS ONE Corporation). The resultant film on the glass substrate was cooled down to room temperature, then, immersed in a xylene solution, then, rinsed by using a spin coater (trade name: MS-A100 type, manufactured by Misawa) under conditions of 1000 rpm and 15 seconds. The thickness of the fabricated film ($H_2$) was measured by using a profiler (trade name: P-16+, manufactured by KLA-Tencor).

The film remaining ratio was represented by $(H_2)/(H_1)$, and the resultant results are shown in Table 1.

TABLE 1

| | Liquid composition | Number of moles of crosslinkable group in 1 g of composition | Film remaining ratio Baked at 170° C. | Film remaining ratio Baked at 190° C. |
|---|---|---|---|---|
| Example 1 | L-1 | $3.73 \times 10^{-4}$ mol | 63% | 96% |
| Example 2 | L-2 | $7.07 \times 10^{-4}$ mol | 78% | 96% |
| Example 3 | L-3 | $3.11 \times 10^{-4}$ mol | 78% | 94% |
| Example 4 | L-4 | $2.69 \times 10^{-4}$ mol | 69% | 88% |
| Example 5 | L-5 | $7.91 \times 10^{-4}$ mol | 82% | 96% |
| Example 6 | L-6 | $3.03 \times 10^{-4}$ mol | 76% | 98% |
| Comparative Example 1 | CL-1 | $1.74 \times 10^{-4}$ mol | 0% | 10% |
| Comparative Example 2 | CL-2 | $6.59 \times 10^{-4}$ mol | 0% | 53% |
| Comparative Example 3 | CL-3 | $4.20 \times 10^{-4}$ mol | 38% | 51% |

Evaluation

The films fabricated using the liquid compositions L-1 to L-6 showed higher film remaining ratios as compared with the films fabricated using the liquid compositions CL-1 to CL-3, thus confirming excellent curability in a low temperature region (170° C.). Further, it was confirmed that the films fabricated using the liquid compositions L-1 to L-6 had excellent curability also at 190° C.

<Measurement of PL Quantum Yield of Polymer Compound>

(1) The polymer compound P-1 was dissolved in xylene, to prepare a 1 wt % solution PL-1.

(2) The polymer compound P-2 was dissolved in xylene, to prepare a 1 wt % solution PL-2.

(3) The polymer compound P-3 was dissolved in xylene, to prepare a 1 wt % solution PL-3.

(4) The polymer compound P-4 was dissolved in xylene, to prepare a 1 wt % solution PL-4.

(5) The polymer compound P-6 was dissolved in xylene, to prepare a 1 wt % solution PL-6.

(6) The polymer compound P-7 was dissolved in xylene, to prepare a 1 wt % solution PL-7.

(7) The polymer compound P-8 was dissolved in xylene, to prepare a 1 wt % solution PL-8.

(8) The polymer compound P-9 was dissolved in xylene, to prepare a 1 wt % solution PL-9.

(9) The polymer compound P-10 was dissolved in xylene, to prepare a 1 wt % solution PL-10.

(10) Any of the solutions PL-1 to PL-10 was dropped on a glass substrate, and coated by using a spin coater (trade name: MS-A100 type, manufactured by Misawa) to form a film under conditions of 1000 rpm and 15 seconds, obtaining a film having a thickness of about 40 nm.

The PL quantum yields of the polymer compounds P-1 to P-10 were measured at an excitation wavelength of 325 nm using the films obtained from the liquid compositions PL-1 to PL-10. For measurement of the PL quantum yield, PL Quantum Yield Measurement System (C9920-02) manufactured by Hamamatsu Photonics, Japan was used. The resultant results are shown in Table 2.

TABLE 2

| solution | polymer compound | PL quantum yield |
|---|---|---|
| PL-1 | P-1 | 41% |
| PL-2 | P-2 | 33% |
| PL-3 | P-3 | 15% |
| PL-4 | P-4 | 31% |
| PL-6 | P-6 | 20% |
| PL-7 | P-7 | 27% |
| PL-8 | P-8 | 45% |
| PL-9 | P-9 | 62% |
| PL-10 | P-10 | 55% |

<Example 7> (Fabrication of Electroluminescent Device and Evaluation Thereof 1)

Fabrication of Electroluminescent Device

On a glass substrate carrying thereon an ITO film having a thickness of 150 nm formed by a sputtering method, a solution obtained by filtrating a suspension of poly(3,4) ethylenedioxythiophene/polystyrenesulfonic acid (manufactured by Bayer, trade name: Baytron P AI4083) through a 0.2 µm membrane filter was spin-coated to form a film having a thickness of 70 nm which was then dried on a hot plate at 200° C. for 10 minutes. Next, the liquid composition L-1 was spin-coated at a rotating speed of 1000 rpm to form a film, and the film was cured by heating on a hot plate at 170° C. for 20 minutes. The thickness of the film after curing was about 30 nm. Further, the solution PL-10 was spin-coated at a rotating speed of 3000 rpm to form a film. The thickness of the film after curing was about 55 nm. Further, this was dried under reduced pressure at 130° C. for 10 minutes, then, as a cathode, sodium fluoride was vapor-deposited with a thickness of about 5 nm, then, aluminum was vapor-deposited with a thickness of about 60 nm, fabricating an electroluminescent device. After the degree of vacuum reached $1 \times 10^{-4}$ Pa or less, metal vapor deposition was initiated.

Evaluation of Performance of Electroluminescent Device

Voltage was applied on the resultant electroluminescent device, to obtain EL light emission having a peak at 450 nm. The maximum light emission efficiency of this electroluminescent device was 5.1 cd/A.

<Example 8> (Fabrication of Electroluminescent Device and Evaluation Thereof 2)

Fabrication of Electroluminescent Device

On a glass substrate carrying thereon an ITO film having a thickness of 150 nm formed by a sputtering method, a solution obtained by filtrating a suspension of poly(3,4) ethylenedioxythiophene/polystyrenesulfonic acid (manufactured by Bayer, trade name: Baytron P AI4083) through a 0.2 µm membrane filter was spin-coated to form a film having a thickness of 70 nm which was then dried on a hot plate at 200° C. for 10 minutes. Next, the liquid composition L-3 was spin-coated at a rotating speed of 1000 rpm to form a film, and the film was cured by heating on a hot plate at 170° C. for 20 minutes. The thickness of the film after film formation was about 30 nm. Further, the solution PL-10 was spin-coated at a rotating speed of 3000 rpm to form a film. The thickness of the film after film formation was about 55 nm. Further, this was dried under reduced pressure at 130° C. for 10 minutes, then, as a cathode, sodium fluoride was vapor-deposited with a thickness of about 5 nm, then, aluminum was vapor-deposited with a thickness of about 60 nm, fabricating an electroluminescent device. After the degree of vacuum reached 1×10$^{-4}$ Pa or less, metal vapor deposition was initiated.

Evaluation of Performance of Electroluminescent Device

Voltage was applied on the resultant electroluminescent device, to obtain EL light emission having a peak at 450 nm. The maximum light emission efficiency of this electroluminescent device was 5.7 cd/A.

<Example 9> (Fabrication of Electroluminescent Device and Evaluation Thereof 3)

Fabrication of Electroluminescent Device

On a glass substrate carrying thereon an ITO film having a thickness of 150 nm formed by a sputtering method, a solution obtained by filtrating a suspension of poly(3,4) ethylenedioxythiophene/polystyrenesulfonic acid (manufactured by Bayer, trade name: Baytron P AI4083) through a 0.2 μm membrane filter was spin-coated to form a film having a thickness of 70 nm which was then dried on a hot plate at 200° C. for 10 minutes. Next, the liquid composition L-1 was spin-coated at a rotating speed of 1000 rpm to form a film, and the film was cured by heating on a hot plate at 190° C. for 20 minutes. The thickness of the film after curing was about 30 nm. Further, the solution PL-10 was spin-coated at a rotating speed of 3000 rpm to form a film. The thickness of the film after film formation was about 55 nm. Further, this was dried under reduced pressure at 130° C. for 10 minutes, then, as a cathode, sodium fluoride was vapor-deposited with a thickness of about 5 nm, then, aluminum was vapor-deposited with a thickness of about 60 nm, fabricating an electroluminescent device. After the degree of vacuum reached 1×10$^{-4}$ Pa or less, metal vapor deposition was initiated.

Evaluation of Performance of Electroluminescent Device

Voltage was applied on the resultant electroluminescent device, to obtain EL light emission having a peak at 450 nm. The maximum light emission efficiency of this electroluminescent device was 4.9 cd/A.

<Example 10> (Fabrication of Electroluminescent Device and Evaluation Thereof 4)

Fabrication of Electroluminescent Device

On a glass substrate carrying thereon an ITO film having a thickness of 150 nm formed by a sputtering method, a solution obtained by filtrating a suspension of poly(3,4) ethylenedioxythiophene/polystyrenesulfonic acid (manufactured by Bayer, trade name: Baytron P AI4083) through a 0.2 μm membrane filter was spin-coated to form a film having a thickness of 70 nm which was then dried on a hot plate at 200° C. for 10 minutes. Next, the liquid composition L-3 was spin-coated at a rotating speed of 1000 rpm to form a film, and the film was cured by heating on a hot plate at 190° C. for 20 minutes. The thickness of the film after film formation was about 30 nm. Further, the solution PL-10 was spin-coated at a rotating speed of 3000 rpm to form a film. The thickness of the film after film formation was about 55 nm. Further, this was dried under reduced pressure at 130° C. for 10 minutes, then, as a cathode, sodium fluoride was vapor-deposited with a thickness of about 5 nm, then, aluminum was vapor-deposited with a thickness of about 60 nm, fabricating an electroluminescent device. After the degree of vacuum reached 1×10$^{-4}$ Pa or less, metal vapor deposition was initiated.

Evaluation of Performance of Electroluminescent Device

Voltage was applied on the resultant electroluminescent device, to obtain EL light emission having a peak at 450 nm. The maximum light emission efficiency of this electroluminescent device was 5.6 cd/A.

INDUSTRIAL APPLICABILITY

The composition of the present invention shows excellent curability in a low temperature region (170° C.).

The invention claimed is:

1. A composition comprising
   (1) a first crosslinkable polymer compound having an aromatic conjugated repeating unit and a crosslinkable group and having at least one of a light emitting property and charge transportability, and
   (2) a second crosslinkable polymer compound having an aromatic conjugated repeating unit and a crosslinkable group and having at least one of a light emitting property and charge transportability,
   wherein at the first crosslinkable polymer compound has a crosslinkable group represented by the following formula (Z-3) and the second crosslinkable polymer compound has a crosslinkable group represented by the following formula (Z-4), or the first crosslinkable polymer compound has a crosslinkable group represented by the following formula (Z-3) and the second crosslinkable polymer compound has a crosslinkable group represented by the following formula (Z-5), or the first crosslinkable polymer compound has a crosslinkable group represented by the following formula (Z-4) and the second crosslinkable polymer compound has a crosslinkable group represented by the following formula (Z-5):

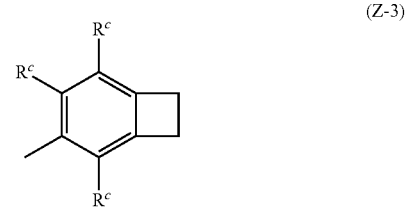

(Z-3)

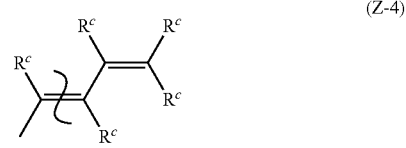

(Z-4)

(Z-5)

in the formulae (Z-3) to (Z-5), R$^c$ represents a hydrogen atom, an unsubstituted or substituted alkyl group, an unsubstituted or substituted alkoxy group, an unsubstituted or substituted alkylthio group, an unsubstituted or substituted aryl group, an unsubstituted or substituted aryloxy group, an unsubstituted or substituted arylthio group, an unsubstituted or substituted amino group, an unsubstituted or substituted silyl group, a halogen atom, an acyl group, an acyloxy group, an imine residue, a carbamoyl group, an acid imide group, a monovalent heterocyclic group, an unsubstituted or substituted carboxyl group, a cyano group or a nitro group; the plurality of R$^c$ moieties may be the same or different,

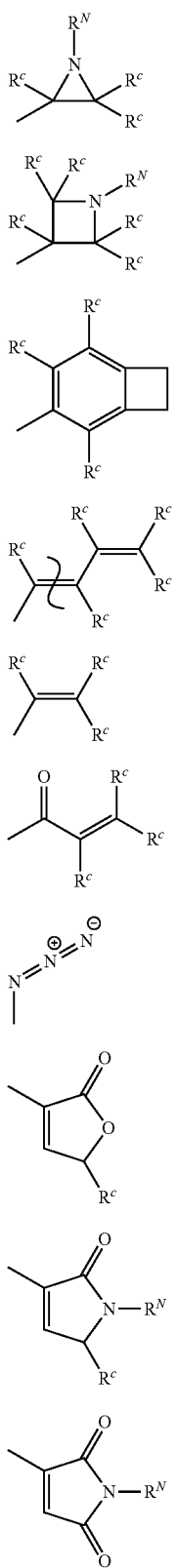

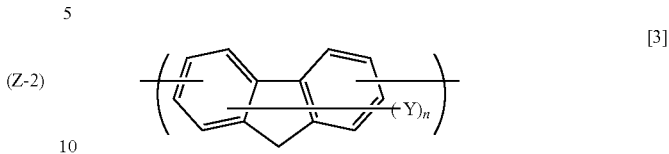

and the first crosslinkable polymer compound and the second crosslinkable polymer compound have a repeating unit represented by the following formula [3]:

in the formula [3], n is 1 or 2; Y is a group represented by the formula [2]; when there are a plurality of Y moieties, they may be the same or different:

$$Y = -(J^2)_j - Z \qquad [2]$$

in the formula [2], represents an alkylene group; represents 0 or 1; Z represents a crosslinkable group represented by any of the formula (Z-3) to (Z-5), and the weight ratio of the first crosslinkable polymer compound to the second crosslinkable polymer compound is 70:30 to 30:70.

2. The composition according to claim 1, wherein the second crosslinkable polymer compound is a polymer compound having an aromatic conjugated repeating unit different from the aromatic conjugated repeating unit in the first crosslinkable polymer compound.

3. The composition according to claim 1, wherein at least one of the first crosslinkable polymer compound and the second crosslinkable polymer compound has hole transportability.

4. The composition according to claim 1, wherein at least one of the first crosslinkable polymer compound and the second crosslinkable polymer compound has a light emitting property and charge transportability.

5. The composition according to claim 1, wherein the polystyrene-equivalent molecular weight of the first crosslinkable polymer compound and the polystyrene-equivalent molecular weight of the second crosslinkable polymer compound are both $1 \times 10^3$ to $1 \times 10^8$.

6. The composition according to claim 1, wherein the total amount of the crosslinkable groups contained in one gram of the composition is $2.0 \times 10^{-5}$ to $1.0 \times 10^{-2}$ mol.

7. The composition according to claim 1, wherein the total content of the first crosslinkable polymer compound and the second crosslinkable polymer compound is 80 wt % or more.

8. The composition according to claim 1, wherein the composition further comprises a solvent.

9. A film composed of the composition according to claim 1.

10. A light emitting device having electrodes consisting of an anode and a cathode and an organic layer that is disposed between the electrodes and is composed of the composition according to claim 1.

11. A surface light source having the light emitting device according to claim 10.

12. A display having the light emitting device according to claim 9.

13. An organic transistor composed of the composition according to claim 1.

14. An organic photoelectric conversion device composed of the composition according to claim 1.

* * * * *